United States Patent
Lindhorst et al.

(10) Patent No.: US 6,950,342 B2
(45) Date of Patent: Sep. 27, 2005

(54) DIFFERENTIAL FLOATING GATE NONVOLATILE MEMORIES

(75) Inventors: Chad A. Lindhorst, Seattle, WA (US); Christopher J. Diorio, Shoreline, WA (US); Troy N. Gilliland, New Castle, WA (US); Alberto Pesavento, Seattle, WA (US); Shail Srinivas, Seattle, WA (US); Yanjun Ma, Issaquah, WA (US); Terry Hass, St. Louis, MO (US); Kambiz Rahimi, Redmond, WA (US)

(73) Assignee: Impinj, Inc., Seattle, WA (US)

(*) Notice: Subject to any disclaimer, the term of this patent is extended or adjusted under 35 U.S.C. 154(b) by 178 days.

(21) Appl. No.: 10/437,262

(22) Filed: May 12, 2003

(65) Prior Publication Data
US 2004/0037127 A1 Feb. 26, 2004

Related U.S. Application Data

(63) Continuation-in-part of application No. 10/190,337, filed on Jul. 5, 2002, now abandoned.

(51) Int. Cl.⁷ .............................................. G11C 16/06
(52) U.S. Cl. ......................... 365/185.21; 365/185.18; 365/185.28
(58) Field of Search ................... 365/185.21, 185.18, 365/185.28, 207, 189.09, 189.07, 185.26

(56) References Cited

U.S. PATENT DOCUMENTS

| | | | |
|---|---|---|---|
| 4,935,702 A | 6/1990 | Mead et al. | |
| 5,068,622 A | 11/1991 | Mead et al. | 330/253 |
| 5,438,542 A | 8/1995 | Atsumi et al. | |
| 5,463,348 A | 10/1995 | Sarpeshkar et al. | |
| 5,517,044 A | 5/1996 | Koyama | |
| 5,541,878 A | 7/1996 | LeMoncheck et al. | |
| 5,596,524 A | 1/1997 | Lin et al. | |
| 5,617,358 A | 4/1997 | Kodama | |
| 5,627,392 A | 5/1997 | Diorio et al. | 257/315 |
| 5,633,518 A | 5/1997 | Broze | |
| 5,666,307 A | 9/1997 | Chang | |
| 5,687,118 A | 11/1997 | Chang | |
| 5,691,939 A | 11/1997 | Chang et al. | |
| 5,706,227 A | 1/1998 | Chang et al. | |
| 5,717,636 A | 2/1998 | Dallabora et al. | |
| 5,736,764 A | 4/1998 | Chang | |
| 5,761,121 A | 6/1998 | Chang | 365/185.14 |
| 5,777,361 A | 7/1998 | Parris et al. | |
| 5,790,060 A | 8/1998 | Tesch | |
| 5,796,656 A | 8/1998 | Kowshik et al. | |
| 5,798,967 A | 8/1998 | Sarin et al. | |
| 5,801,994 A | 9/1998 | Chang et al. | |

(Continued)

FOREIGN PATENT DOCUMENTS

| | | |
|---|---|---|
| EP | 0 298 618 | 1/1989 |
| EP | 0 776 049 | 5/1997 |
| EP | 0 778 623 | 7/2001 |

OTHER PUBLICATIONS

Chang, et al., "A CMOS-Compatible Single-Poly Cell for Use as Non-Volatile Memory", International Semiconductor Device Date Research Symposium, Dec. 1–3, 1999, pp. 50–57.

(Continued)

Primary Examiner—David Lam
(74) Attorney, Agent, or Firm—Thelen Reid & Priest LLP; David B. Ritchie

(57) ABSTRACT

A number of designs for differential floating gate nonvolatile memories and memory arrays utilize differential pFET floating gate transistors to store information. Methods of implementing such memories and memory arrays together with methods of operation and test associated with such memories and memory arrays are presented.

83 Claims, 41 Drawing Sheets

U.S. PATENT DOCUMENTS

| | | | |
|---|---|---|---|
| 5,825,063 A | 10/1998 | Diorio et al. | 257/316 |
| 5,841,165 A | 11/1998 | Chang et al. | |
| 5,844,300 A | 12/1998 | Alavi et al. | |
| 5,898,613 A | 4/1999 | Diorio et al. | 365/185.03 |
| 5,901,084 A | 5/1999 | Ohnakado | |
| 5,912,842 A | 6/1999 | Chang et al. | 365/185.11 |
| 5,939,945 A | 8/1999 | Thewes et al. | |
| 5,966,329 A | 10/1999 | Hsu et al. | 365/185.18 |
| 5,969,987 A | 10/1999 | Blyth et al. | |
| 5,972,804 A | 10/1999 | Tobin et al. | |
| 5,982,669 A | 11/1999 | Kalnitsky | |
| 5,990,512 A | 11/1999 | Diorio et al. | 257/314 |
| 6,028,789 A | 2/2000 | Mehta et al. | |
| 6,055,185 A | 4/2000 | Kalnitsky et al. | |
| 6,081,451 A | 6/2000 | Kalnitsky et al. | |
| 6,125,053 A | 9/2000 | Diorio et al. | |
| 6,137,722 A | 10/2000 | Kalnitsky et al. | |
| 6,137,723 A | 10/2000 | Bergemont et al. | |
| 6,137,724 A | 10/2000 | Kalnitsky et al. | |
| 6,144,581 A | 11/2000 | Diorio et al. | |
| 6,166,954 A | 12/2000 | Chern | |
| 6,166,978 A | 12/2000 | Goto | 365/207 |
| 6,190,968 B1 | 2/2001 | Kalnitsky et al. | |
| 6,208,557 B1 | 3/2001 | Bergemont et al. | |
| 6,294,427 B1 | 9/2001 | Furuhata et al. | |
| 6,320,788 B1 | 11/2001 | Sansbury et al. | |
| 6,452,835 B1 | 9/2002 | Diorio et al. | |
| 6,469,937 B2 * | 10/2002 | Fuchigami et al. | 365/185.21 |
| 6,479,863 B2 | 11/2002 | Caywood | |
| 6,534,816 B1 | 3/2003 | Caywood | |
| 6,563,731 B1 | 5/2003 | Bergemont | |
| 6,646,919 B1 * | 11/2003 | Madurawe et al. | 365/185.21 |
| 2003/0206437 A1 | 11/2003 | Diorio et al. | |
| 2004/0004861 A1 | 1/2004 | Srinivas et al. | |
| 2004/0021166 A1 | 2/2004 | Hyde et al. | |
| 2004/0037127 A1 | 2/2004 | Lindhorst et al. | |
| 2004/0052113 A1 | 3/2004 | Diorio et al. | |

OTHER PUBLICATIONS

Chang, et al., "Non–Volatile Memory Device with True CMOS Compatibility", Electronics Letters, vol. 35, No. 17, Aug. 19, 1999, pp. 1443–1445.

Diorio, "A p–Channel MOS Synapse Transistor with Self–Convergent Memory Writes", IEEE Transaction On Electron Devices, vol. 47, No. 2, pp. 464–472, Feb. 2000.

Raszka, J. et al., "Embedded Flash Memory for Security Applications in a 0.13 $\mu$m CMOS Logic Process", 2004 IEEE International Solid–State Circuits Conference, ISSCC Session 2 Nonvolatile Memory 2.4, pp. 46–47, Feb. 16, 2004.

Usuki, Tatsuya, et al., "Direct Tunneling Memory: Trade–off Between Nonvolatility and High–Endurance with Low Voltage Operations", Nonvolatile Semiconductor Workshop Symposium, Aug. 12, 2001; pp. 80–81.

Carley, L. Richard, "Trimming Analog Circuits Using Floating–Gate Analog MOS Memory", IEEE Journal of Solid–State Circuits, vol. 24, No. 6, Dec. 1989.

Partial International Search for International Application No. PCT/US03/31792, date mailed Apr. 2, 2004.

Christian E. Herdt, et al., "Analysis, Measurement, and Simulation of Dynamic Write Inhibit in an nvSRAM Cell", IEEE Transactions on Electron Devices, vol. 39, No. 5, May 1992, pp. 1191–1196.

S.S. Chung, et al., "N–Channel Versus P–Channel Flash EEPROM–Which One Has Better Reliabilities", IEEE Annual International Reliability, 2001, pp. 67–72.

Ying Shi, et al., "Polarity Dependent Gate Tunneling Currents in Dual–Gate CMOSFET's", IEEE Transactions on Electron Devices, vol. 45, No. 11, Nov. 1998, pp. 2355–2360.

Chris Diorio, et al., "A High–Resolution Non–Volatile Analog Memory Cell", IEEE Intl. Symp. on Circuits and Systems, vol. 3, 1995, pp. 2233–2236.

Chris Diorio, et al., "A Floating–Gate MOS Learning Array with Locally Computed Weight Updates", IEEE Transactions on Electron Devices, vol. 44, No. 12, Dec. 1997, pp. 1–10.

Jose E. Franca, et al., "Dynamic Analog Techniques", Design of Analog–Digital VLSI Circuits for Telecommunications and Signal Processing, Chapter 4, Second Edition, 1994, pp. 97–124.

* cited by examiner

DIFFERENTIAL FLOATING GATE NONVOLATILE MEMORIES

RELATED CASES

This application is a continuation-in-part of U.S. patent application Ser. No. 10/190,337 filed on Jul. 5, 2002, now abandoned in the name of inventors Shail Srinivas, Chad A. Lindhorst, Yanjun Ma, Terry Haas, Kambiz Rahimi and Christopher J. Diorio and commonly assigned herewith.

FIELD OF THE INVENTION

The present invention is directed to the field of nonvolatile memories (NVM). More particularly it is directed to NVMs implemented with pFET (p channel field effect transistor) floating gate devices in a differential configuration.

BACKGROUND OF THE INVENTION

Many CMOS (complementary metal oxide semiconductor) integrated circuits require small amounts of on-chip nonvolatile memory (NVM). Typical applications include storing security settings, RFID (radio frequency identification) data, system configurations, serial numbers, calibration and trim settings, and others. For reasons of cost and yield, the ideal NVM should be in state-of-the-art logic CMOS with zero additional process masks. Unfortunately, applications requiring relatively small amounts of NVM (a few hundred words) have been largely neglected by the major memory manufacturers as they focus on developing customized NVM processes that yield ever-increasing memory densities (e.g. 256 Mb Flash). Consequently, CMOS designers requiring small amounts of nonvolatile storage must (1) use technologies such as on-chip fuses, (2) pay the cost and absorb the yield degradation associated with using high-density embedded NVM, (3) resort to off-chip storage, or (4) use SRAM (static random access memory) storage powered by an associated battery backup.

Designers needing small amounts of NVM in highly integrated CMOS applications face some unpleasant tradeoffs. The obvious approach is to use a CMOS process with embedded NVM. Unfortunately, embedded NVM processes are burdened not only with higher wafer costs, but also tend to be older-generation technology. The higher cost is due to the fact that NVM processes generally require additional masks and fabrication steps (e.g., to obtain a second polysilicon layer). The older-generation technology arises because adding NVM to a logic process takes time and testing, so NVM processes typically lag the state-of-the-art by up to a year. The result can be that, for a precious few NVM bits, an entire CMOS chip will have higher cost and reduced performance.

One alternative to embedded NVM processes is to use fuses (or anti-fuses) that are either laser or electrically programmed. Applications requiring one-time programming may find this alternative attractive, but significant technology issues such as fuse "healing" and programming cost remain problematic. Furthermore, fuses and antifuses are often unavailable in state-of-the-art CMOS processes.

Another option is to use an off-chip solution such as a separate NVM chip or battery backup for on-chip SRAM. Unfortunately, this solution requires additional devices and, in the case of off-chip NVM, exposes the data to potential hacking. The benefit, of course, is that designers can implement the rest of the chip in a leading-edge technology without incurring the overhead of an NVM process. The disadvantage is higher cost, both in PCB (printed circuit board) area and parts count.

What CMOS designers need is an NVM capability in state-of-the-art logic CMOS.

BRIEF DESCRIPTION OF THE INVENTION

A number of designs for differential floating gate nonvolatile memories and memory arrays utilize differential pFET floating gate transistors to store information. Methods of implementing such memories and memory arrays together with methods of operation and test associated with such memories and memory arrays are presented.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1A:
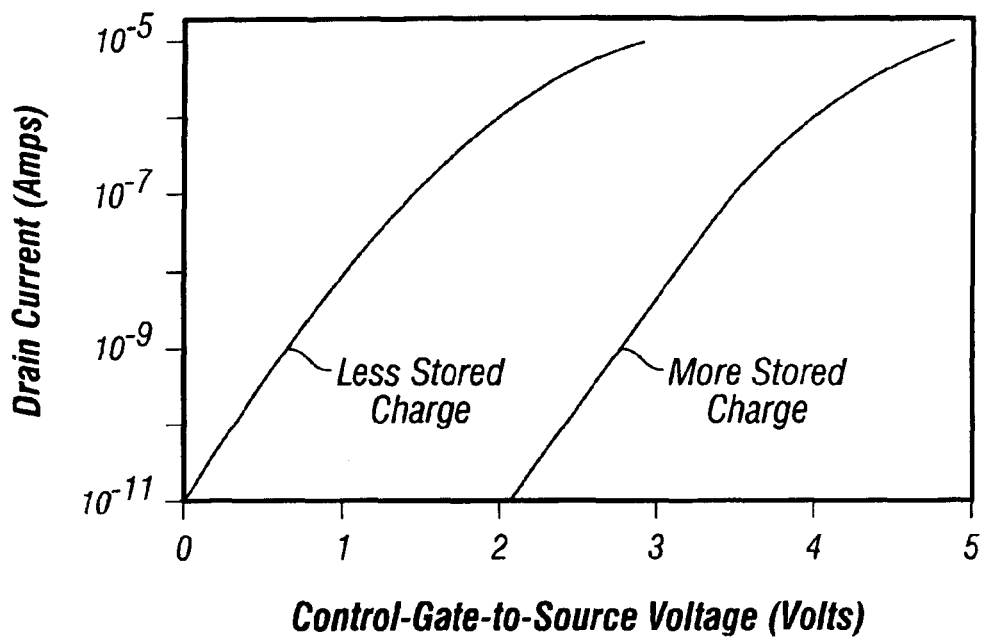
FIG. 1A is a plot of drain current vs. control-gate-to-source voltage for the floating gate MOSFET of FIG. 1B.

Embodiments of the present invention are described herein in the context of a differential floating gate nonvolatile memory. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

The present invention applies generally to nonvolatile memories, and has particular application in low-density embedded nonvolatile memories as might be found in embedded CMOS applications. Such embedded CMOS applications include (but are not limited to) storing: (1) chip serial numbers (i.e. chip tags), (2) configuration information in ASICs (application specific integrated circuits), (3) product, package and/or asset data in radio frequency identification (RFID) integrated circuits, (4) code or data in embedded microcontrollers, (5) analog trim information, (6) FPGA configuration information, and (7) a host of other applications as will now be apparent to those skilled in the art. Compared with conventional nFET-based nonvolatile memories, using pFETs has at least the advantages of decreased charge pump power, increased program/erase cycling endurance (due to reduced oxide wearout), and availability in logic CMOS processes (due to reduced memory leakage and the fact that the memory uses only nFETs and pFETs).

Any reprogrammable NVM technology must meet two key requirements: (1) endurance and (2) retention. Endurance refers to the number of erase/write cycles (NVMs ideally have an unlimited number of read cycles). Retention refers to the memory storage time. The evolution of flash and EEPROM technologies over the past two decades has resulted in a set of commercially accepted design standards for NVM. Any design in a standard CMOS process should meet these same standards. The two standards are 10-year retention and 10,000 (minimum) erase/write cycles.

NVM devices store information by changing the physical attributes of a transistor or other circuit element. In the case of floating-gate memories (e.g. Flash or EEPROM), the physical attribute is the quantity of electrons stored on the electrically isolated (floating) gate of a silicon MOSFET (metal oxide semiconductor field effect transistor). All NVM devices wear out, meaning that after a certain number of write/erase cycles the memory will no longer meet its 10-year retention requirement. In the case of floating-gate memories, wearout occurs because moving electrons through the oxide insulator surrounding an electrically isolated gate invariably damages this insulating oxide.

Figure 1B:
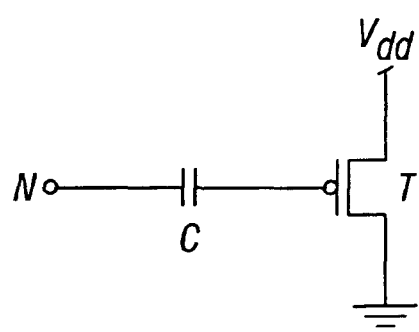

Floating-gate memory technologies store information as electrons on the floating gate of a silicon MOSFET. Adding or removing electrons from the floating gate changes the MOSFET's threshold voltage. FIG. 1A is a plot of drain current vs. control-gate-to-source voltage for the floating gate MOSFET of FIG. 1B. To read the memory, one measures the floating-gate MOSFET's channel current. If the left curve in FIG. 1A is observed, then the stored memory is a logic "1"; if the right curve in FIG. 1A is observed, then the stored memory is a logic "0", or vice versa. In the absence of a control gate, the floating gate's voltage determines the state of its associated transistor. For pFETs, low floating-gate voltages mean the transistors are more "on" (i.e. higher source-drain current), whereas high floating-gate voltages mean the transistors are more "off" (i.e. lower source-drain current). A logic "1" or logic "0" can be read based on the relative on/off state of the floating-gate transistors.

NVM designers can use either n-channel or p-channel floating-gate MOSFETs as memory transistors. Since the early 1980s they have used n-channel MOSFETs, because of small size and the existence of direct methods for injecting an nFET's channel electrons onto a floating gate. This choice enables high-density Flash and EEPROM in highly modified CMOS processes. In logic CMOS, however, the situation is reversed—pFETs are far superior to nFETs because pFET NVM has better retention than nFET NVM and pFET NVM allows more erase/write cycles than nFET NVM.

Of course, there are disadvantages to using pFET NVM. The pFET NVM has a larger size than the nFET NVM found in customized processes, and tends to have longer write times. For small memories (i.e., those of less than or equal to about 64 kbits), these disadvantages are significantly outweighed by the retention and endurance benefits and by the zero process-mask increase.

Figure 2A:
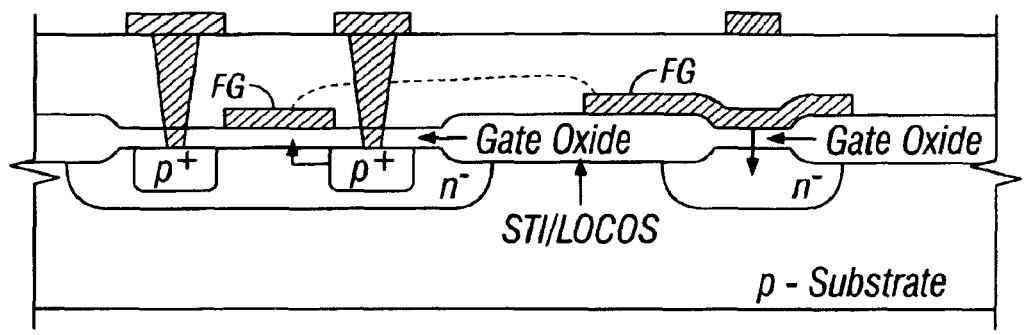
FIG. 2A is an elevational cross-section for a device in accordance with an embodiment of the present invention.
Figure 2B:
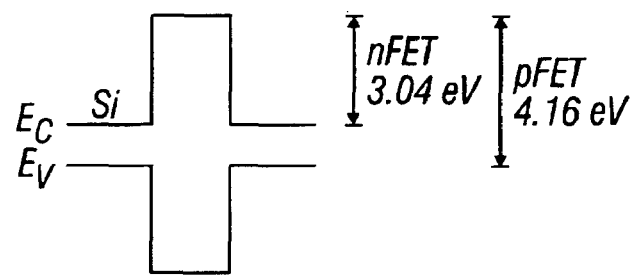
FIG. 2B is a MOS energy band diagram for the device of FIG. 2A.

FIG. 2A is an elevational cross-section for a device in accordance with an embodiment of the present invention. FIG. 2B is a MOS energy band diagram for the device of FIG. 2A. FIGS. 2A and 2B illustrate why pFET NVM has better retention than nFET NVM. Device physics shows that the energy barrier for electron leakage from a pFET is 4.16 eV, whereas that for an nFET is only 3.04 eV. This difference means the pFET memory, with its higher energy barrier, will exhibit significantly less electron tunneling through the gate oxide than an nFET memory at the same oxide thickness. In a custom CMOS process this difference is of no real consequence, because the process engineers merely thicken the gate oxide until the memory has 10-year retention. All current commercial nFET-based NVM uses 80 Å or thicker oxides. Unfortunately, there are no 80 Å oxides in modern logic CMOS (0.35 $\mu$m and smaller process linewidths). Consequently, nFET NVM in logic CMOS, constructed with 70 Å or thinner gate oxides, simply cannot meet the 10-year retention requirement over normal processing variations and temperature variations. The solution is to use pFET NVM. A 70 Å pFET, as is available in modern dual-gate-oxide CMOS processes, has the same data retention as an 82 Å nFET in a customized process. In short, retention is key to NVM, and pFETs have 10-year retention in current technology logic CMOS whereas nFETs do not.

U.S. Pat. No. 5,990,512, entitled "*Hole Impact Ionization Mechanism of Hot Electron Injection and Four Terminal pFET Semiconductor Structure for Long-Term Learning*", by Diorio, et al, describes a method for transferring charge to and from the gate of a floating gate pFET. Some embodiments of the present invention use floating gate pFETs as the memory storage transistors, with the Impact-ionized Hot Electron Injection (IHEI) and tunneling methods described in the '512 patent used to write the memory. Other embodiments of the present invention utilize direct tunneling instead of IHEI. Because IHEI and tunneling do not require special device processing, floating-gate devices can be built using the same IC processing as that used to make standard digital logic transistors.

Differential Memory Technology

By employing a differential memory instead of a standard single-ended memory, the memory fabricated in accordance with the present invention exhibits increased read speed, decreased read current and power consumption, decreased sensitivity to variations in tunneling and injection efficiency, relaxed requirements for precision on-chip current and voltage references, and reduced temperature and supply-voltage sensitivity. Consequently, the combined approach of using a pFET-based memory which is differential enables NVM in logic CMOS.

Figure 3:
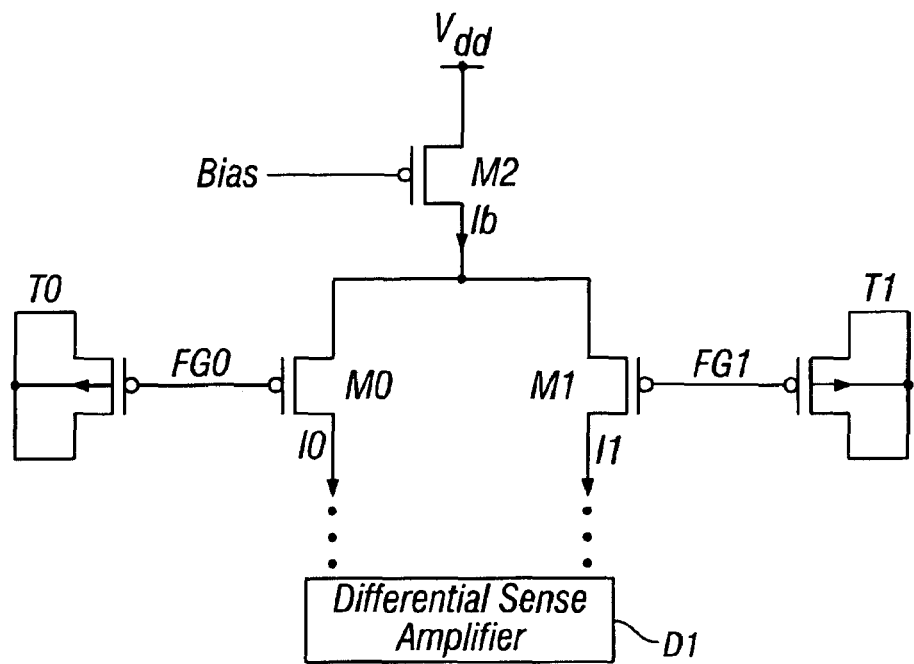
FIG. 3 is an electrical schematic diagram of a memory in accordance with one embodiment of the present invention. A pFET M2 is used to set the differential-pair bias current with the signal "bias" and floating-gate pFETs M0 and M1 act as the storage devices. Shorted pFETs T0 and T1 are used to remove charge from the floating gates and/or act as control gates. T0 and T1 could alternatively be implemented using shorted nFETs, as will now be apparent to those of ordinary skill in the art.

FIG. 3 is an electrical schematic diagram of a memory in accordance with one embodiment of the present invention. A pFET M2 is used to set the differential-pair bias current Ib with the signal "bias" and floating-gate pFETs M0 and M1 act as the storage devices. Shorted pFETs T0 and T1 are used to remove electrons from the floating gates and/or act as control gates. T0 and T1 could alternatively be implemented using shorted nFETs, or MOSCAPs, as will now be apparent to those of ordinary skill in the art. (A control gate is either a capacitor or a node that is capacitively coupled to the floating gate. In accordance with the present invention, such control gates may be implemented as capacitors or shorted pFETs and the like without the need to add another layer to the semiconductor wafer.) The logic state of the differential memory is determined by the difference in charge stored on the two floating gates, FG0 and FG1, rather than on the on-off state of a single memory element as is common in nFET-based NVM. Regardless of whether the memory element stores a logic 0 or a logic 1, both transistors have an inverted channel. A conventional differential sense amplifier circuit D1 reads the drain currents I0 and I1 of M0 and M1, respectively, to determine the state of the memory.

The erase cycle of the basic memory element works as follows. The differential memory is erased by using Fowler-Nordheim tunneling to remove electrons from both floating gates. This is done, in accordance with one embodiment of the invention, by bringing both tunneling junctions (T0 and T1) to about 10V. To stop the erase process before the pFET floating-gate transistors tunnel to a completely off state, the drain currents (I0 and I1) are monitored in a conventional manner during the erase process. A tunneling done (TunDone) signal is generated in a conventional manner once the drain currents of a particular memory element reach a predetermined minimum value (e.g., about 10 nA in accordance with one embodiment of the present invention). This signal can be used to stop the tunneling process on that floating gate or on a block of floating gates. This feedback process ensures that no floating-gate transistor is completely turned off when erased.

The program cycle of the basic memory element works as follows. To program a logic 1 to a memory location, a bias current is applied to the memory element using transistor M2 while a relatively large drain-to-source voltage is applied across transistor M1 (by applying a low or negative voltage to M1's drain). Typical values in a 0.18 um CMOS process are Vdd=1.8V and $V\_M1_{drain}$=−3.3V. Transistors M2 and M1 conduct, and electrons inject onto floating gate FG1 using the IHEI process discussed in U.S. Pat. No. 5,990,512. The same procedure is followed to write a logic 0, except transistor M0 is injected instead of M1.

Figure 4:
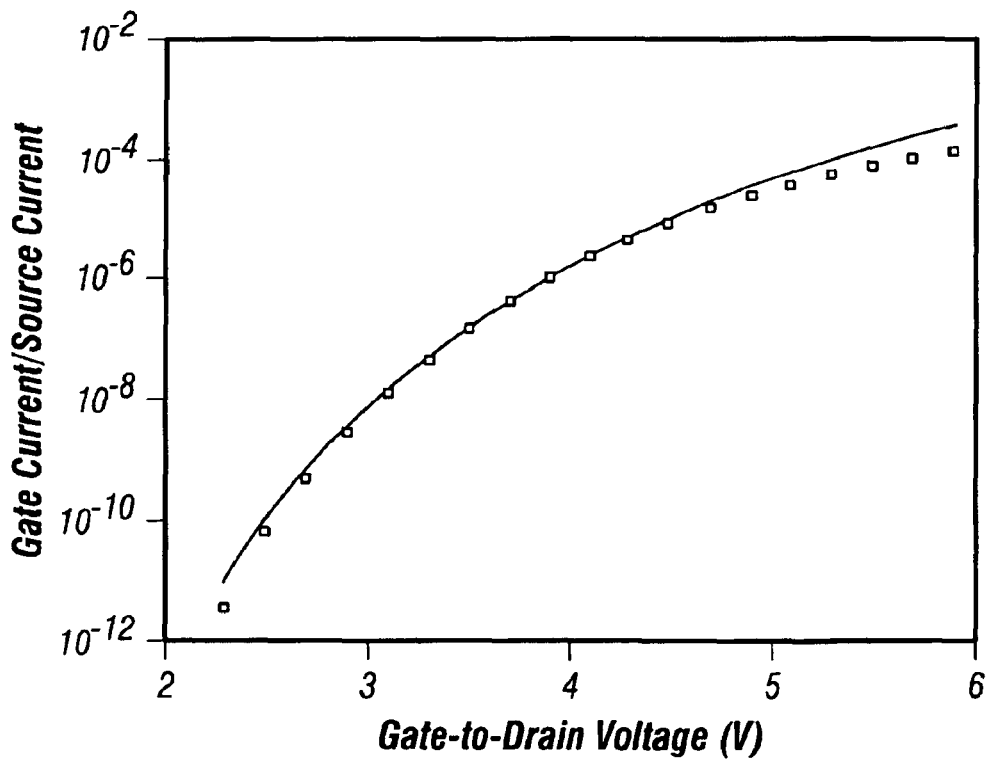
FIG. 4 is a plot of injection efficiency versus gate-to-drain voltage, where injection efficiency is defined as gate current divided by source current.

The injection process is self-limiting, meaning that as electrons inject onto a floating gate the transistor itself stops the injection process. Unlike an nFET, a pFET will self-limit its IHEI current because injection causes its floating gate voltage to drop. As the gate voltage drops, so does the injection transistor's drain-to-gate voltage. Because IHEI decreases exponentially with decreasing drain-to-gate voltage (as illustrated in FIG. 4 which is a plot of gate current/source current vs. gate-to-drain voltage), the transistor itself stops the IHEI process.

Alternatively, those of ordinary skill in the art will now realize that one can also create a signaling circuit that could be used to terminate the injection process, e.g., by halting the current through transistor M2 when the floating gate of the injection transistor reaches a predetermined voltage.

The read cycle of the basic differential memory element works as follows. To read the contents of a differential memory element, a bias current is first applied to the memory element using transistor M2. A read operates on the principle of distinguishing the more conductive path between the two halves of the differential memory element. If FG0 has a lower voltage than FG1, then M0 will be more conductive and a majority of the bias current will pass as I0. If FG1 has a lower voltage than FG0, the complementary case holds. A conventional differential sense amplifier then decides whether the memory element holds a logic 1 or logic 0 by comparing I0 and I1. Because the memory is differential, arbitrarily small bias currents may be used in transistor M2 while reading the memory. Consequently, the memory can use arbitrarily low power during read operations.

Tunneling Junctions

Figure 5A:
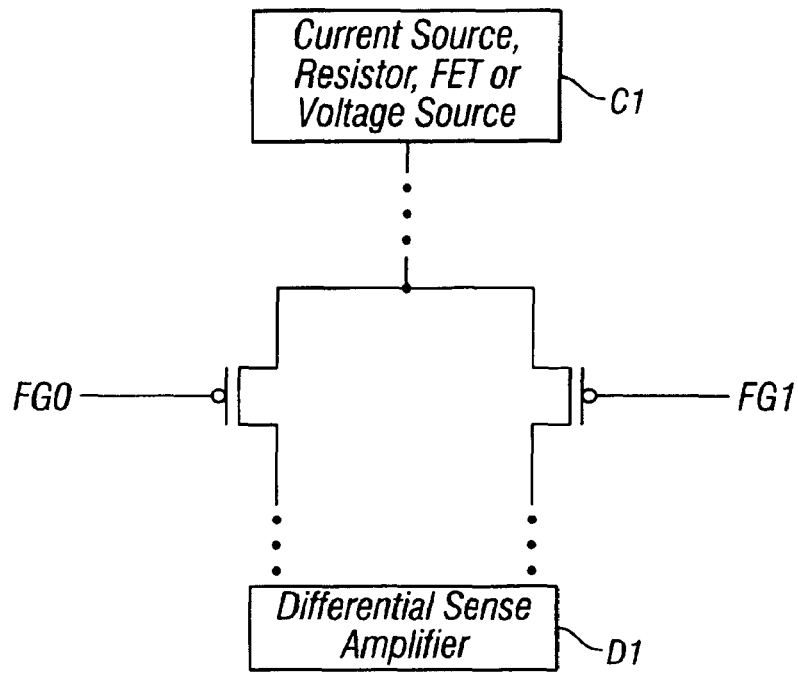
FIG. 5A is an electrical schematic diagram of a memory in accordance with an alternative embodiment of the invention comprising a differential memory without tunneling junctions. The floating gates may be erased using UV light or other techniques well known to those in the art, and the memory may be one-time programmed using injection.
Figure 5B:
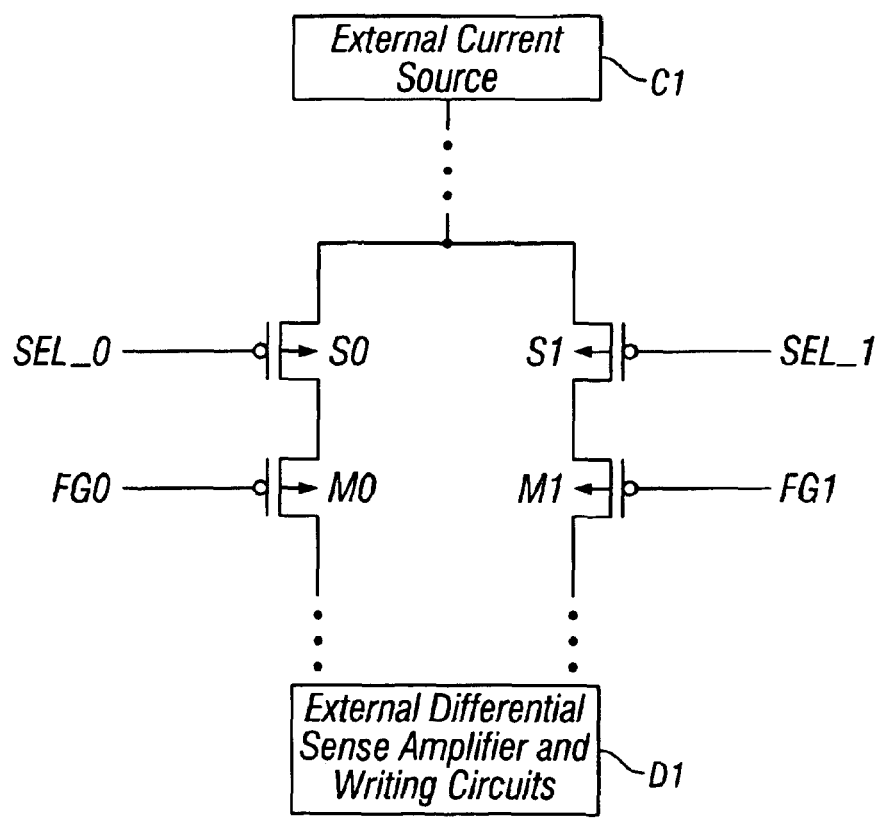
FIG. 5B is an electrical schematic diagram of a memory in accordance with an alternative embodiment of the circuit of FIG. 5A
Figure 46:
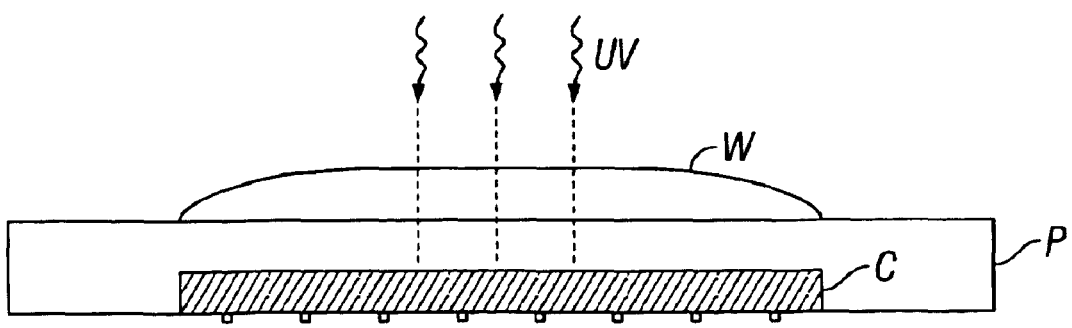
FIG. 46 is an elevational cross section of a windowed memory device which is UV-eraseable in accordance with the prior art.

FIG. 5A is an electrical schematic diagram of an alternative embodiment of the invention comprising a differential memory without tunneling junctions to remove electrons from the floating gates FG0 and FG1. The floating gates FG0 and FG1 on chip C of package P (as illustrated in FIG. 46) are erased in accordance with this embodiment by using electromagnetic radiation such as UV light shown upon the floating gates through an appropriate window W in the package P containing the device on chip C or other techniques well known to those of ordinary skill in the art, and the memory may be one-time programmed using injection powered by a current source, resistor, FET or voltage source (generally referred to herein as a current source). In this manner the layout area associated with the tunneling junctions is saved. The option to remove the tunneling junctions applies to all embodiments of this invention as does the option to put the tunneling junctions in either the same or in separate n− wells of the substrate. If the tunneling junctions are formed in separate n− wells, single nodes (i.e. single sides) of the memory can be selected for erasure. If the tunneling junctions are formed in the same n− well, die area is conserved and both sides of the differential memory are erased at the same time. The precise configuration to use in a particular implementation will be up to the designer. FIG. 5B illustrates an alternative embodiment of the memory of FIG. 5A including select transistors S0, S1 controlled by select lines Sel__0, Sel__1, respectively. No tunneling junctions are provided in this version.

The devices described herein may be erasable or one-time-programmable. For one-time-programmable devices no tunneling junction is required (although it may be included as a design choice). Those embodiments of the present invention that require erasure may implement a tunneling junction to tunnel electrons off of the floating gate. The tunneling junction may be implemented in a number of different ways. In one embodiment a separate n− well is disposed apart from the n− well in which the floating gate transistor is located. The floating-gate transistor is a pFET which may be used for IHEI, direct tunneling, or another similar process for moving electrons across the insulator to the floating gate. In accordance with this embodiment, the floating gate is disposed between the two n– wells. The tunneling junction may be: (1) a MOSCAP such as the one shown as element 124 in FIG. 24 which is implemented as an n+ region disposed in the n– well; (2) a shorted nFET (with drain and source connected together); (3) a shorted pFET (with drain, source and well contact connected together); or other arrangements as will now be apparent to those of ordinary skill in the art. See FIG. 2A for the general layout of a memory in accordance with one embodiment of the present invention.

Figure 21:
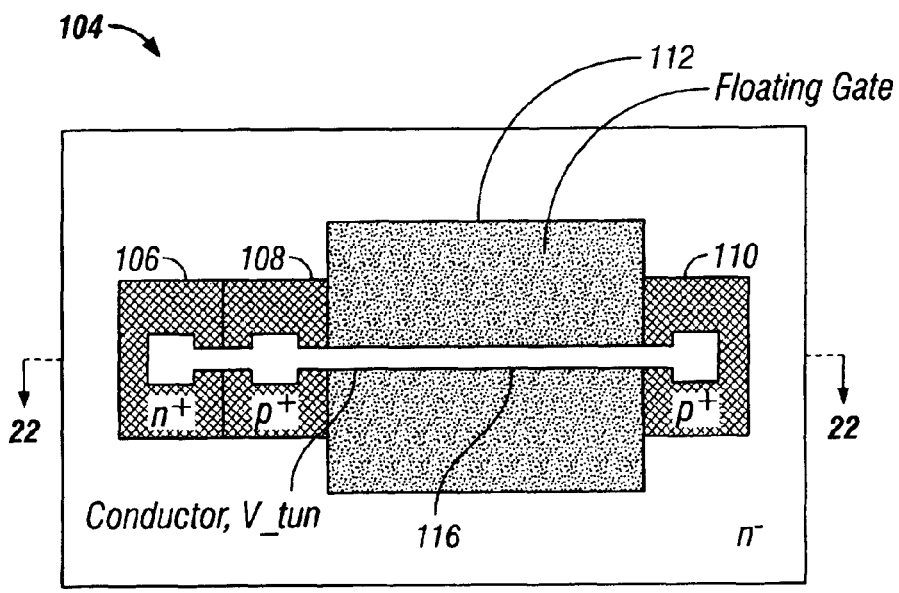
FIG. 21 is a layout view of a pFET tunneling junction device in accordance with one embodiment of the present invention.
Figure 22:
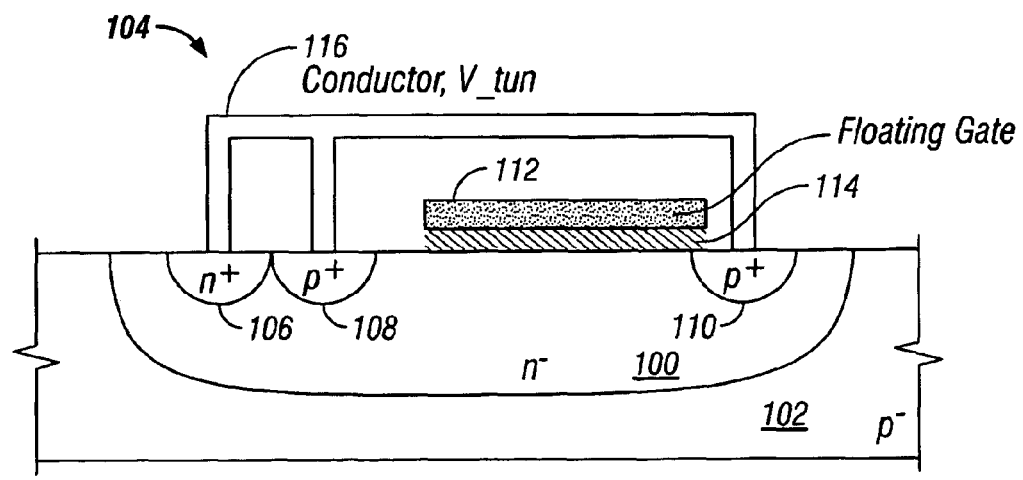
FIG. 22 is a cross sectional view taken along line 22—22 of FIG. 21.

Turning now to FIGS. 21 and 22, a pFET tunneling junction is illustrated. FIG. 21 is a layout (top) view of the pFET tunneling junction and FIG. 22 is a cross sectional view thereof taken along line 22—22 of FIG. 21. As can be seen, the device is disposed in an n– well 100 disposed in p-substrate 102. The pFET tunneling junction device 104 includes an n+ well contact region 106 and a source p+ region 108 and a drain p+ region 110, all of which can be shared from memory element to memory element within a page where possible. Floating gate 112 sits above the channel formed between the source and drain and is separated from the channel by a dielectric layer 114 such as silicon dioxide. The well contact, source and drain are shorted together by conductor 116 which may be formed of any suitable conductive material.

Figure 23:
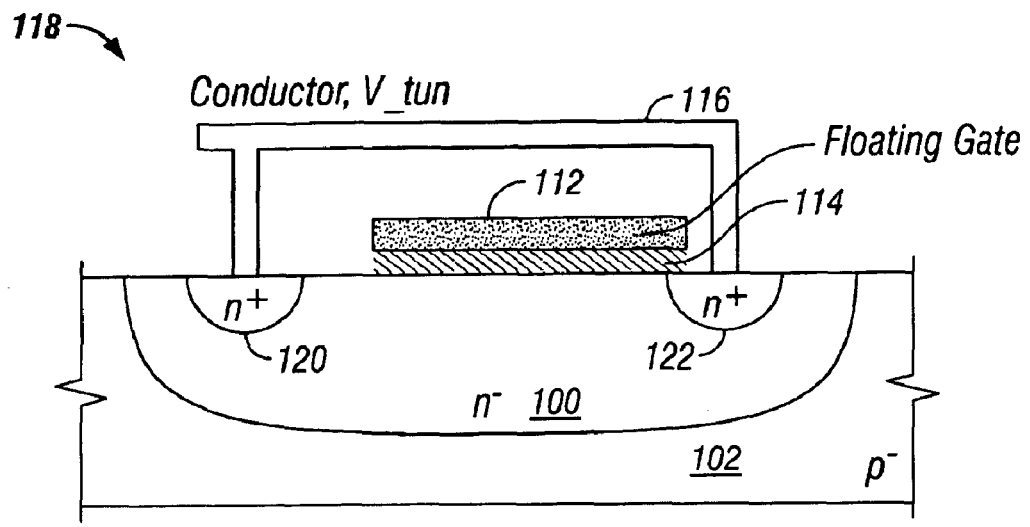
FIG. 23 is a layout view of an n– well bulk nFET tunneling junction device in accordance with one embodiment of the present invention.

Turning now to FIG. 23 a nFET tunneling junction device 118 is illustrated in cross sectional view. In this embodiment an n– well 100 is disposed in a p-substrate 102. Within the n– well 100 are a pair of n+ regions 120 and 122 which form the transistor's source and drain. These are shorted to one another by conductor 116 as described above. As above, floating gate 112 sits above the channel formed between the source and drain and is separated from the channel by a dielectric layer 114 such as silicon dioxide.

Figure 24:
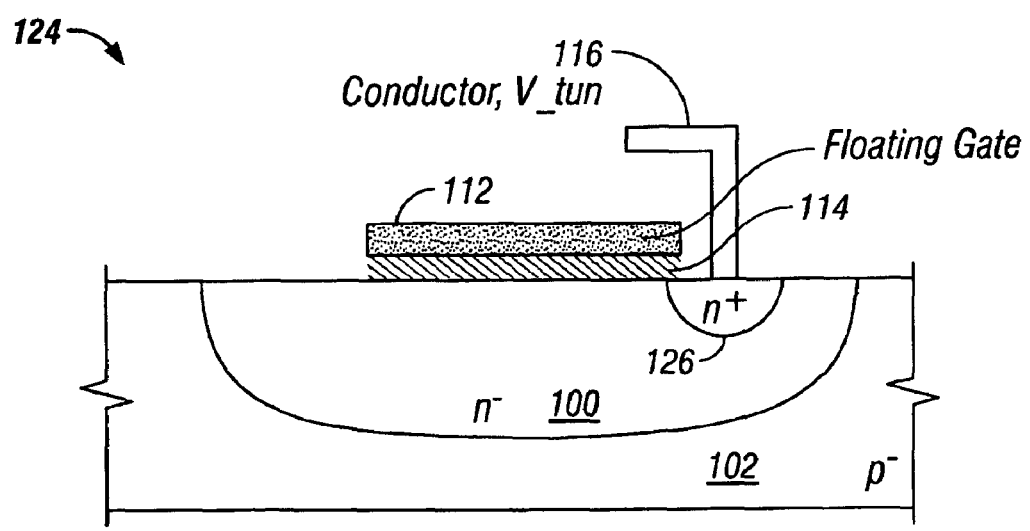
FIG. 24 is a cross sectional view of a MOSCAP type tunneling junction device in accordance with one embodiment of the present invention.

Turning now to FIG. 24 a MOSCAP tunneling junction device 124 is illustrated in cross sectional view. In this embodiment an n– well 100 is disposed in a p-substrate 102. Within the n– well 100 is an n+ region 126 which is coupled to conductor 116. The rest of the details of the device are as described above.

Limiting Injection to One Side of the Differential Memory

Figure 6A:
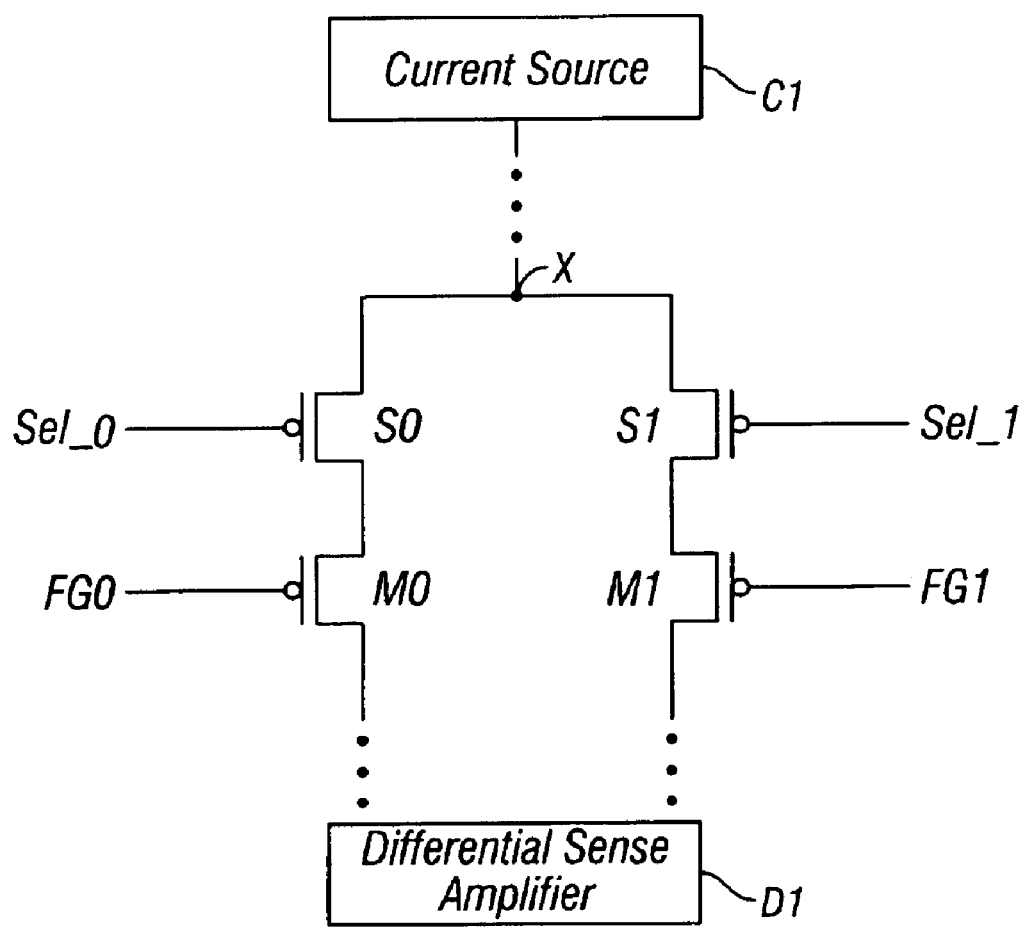
FIG. 6A is an electrical schematic diagram of a differential memory having select transistors to decide which side of the memory undergoes injection in accordance with an embodiment of the present invention.

FIG. 6A is an electrical schematic diagram of a differential memory with select transistors to decide which side of the memory undergoes injection in accordance with an embodiment of the present invention. The advantage of the memory of FIG. 6A over the memory in FIG. 3 is that the drains of both injection transistors M0, M1 can be brought low during injection, and one side may be selected for writing by enabling its corresponding select transistor S0, S1 by applying a select signal to its corresponding select line Sel_0, Sel_1. The input node X of this differential pair can be connected to either a bias transistor as in FIG. 3, or any other type of selectable current source circuit. As in each of the embodiments shown herein, input node X may be a current source disposed within the actual memory or a conductor leading to another current source disposed elsewhere. Sharing the current source among the memory elements in an array column, for example, will save layout area but may reduce speed due to increased capacitance at the shared node. If appropriate to the design, it is also possible to use an in-element current source for one of the read/write operations and an out-of-element current source for the other operation using appropriate selection transistors to channel the current to the node X as appropriate. In the claims, the term "current source" is meant to convey the notion of a node from which current can be drawn, thus, for example, if there is a node supplied with current in a memory element, that node can be a current source even if it is supplied with current by a transistor outside of the memory element itself.

Row Select

Figure 6B:
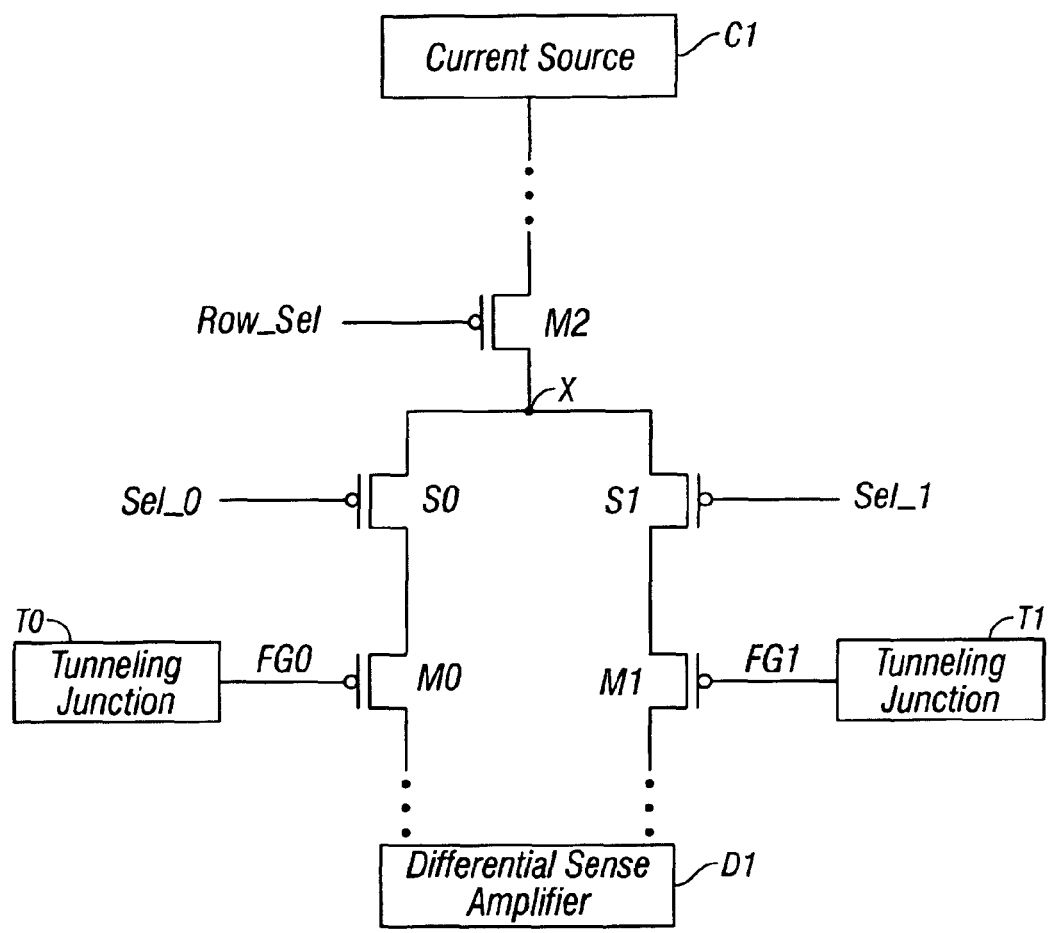
FIG. 6B is an electrical schematic diagram of a memory in accordance with an alternative embodiment to the memory of FIG. 6A which includes a row select switch in accordance with an embodiment of the present invention.

Turning now to FIG. 6B, a row select transistor M2 is added to the basic configuration of FIG. 6A. The Row_Sel line coupled to the gate of M2 controls whether the current source C1 is coupled to node X or not. In this way the capacitance seen by the external (column) current source is reduced because half as many transistors have their source/drains connected to it. This approach provides faster reads and writes due to the reduced capacitance.

Figure 7:
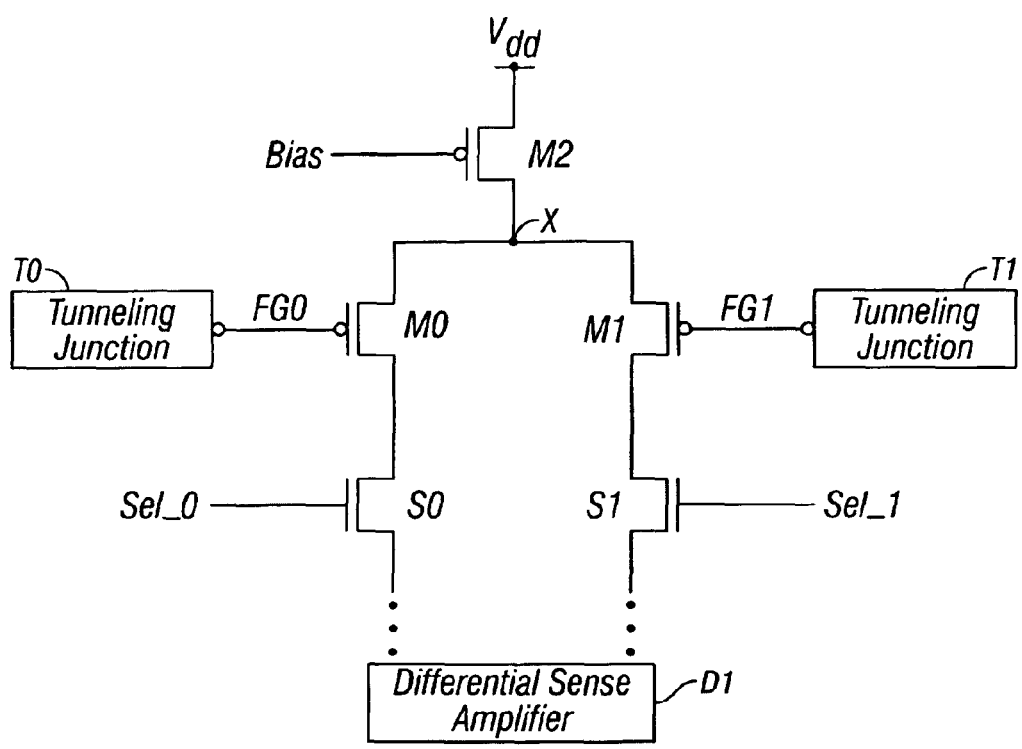
FIG. 7 is an electrical schematic diagram of a differential memory circuit coupled to a pFET current source having select transistors (S0, S1) (sometimes referred to herein as "series select switches") implemented in this instance with nFETs in accordance with an embodiment of the present invention.

FIG. 7 is an electrical schematic diagram of a differential memory coupled to a pFET current source and the select transistors (S0, S1) implemented with nFETs in accordance with an embodiment of the present invention. The memory is programmed by pulling Vdd high (to about 5V), turning on one of the select transistors (S0, S1) by setting its gate voltage to Vdd, and turning off the other select transistor by setting its gate voltage to ground. The floating gate transistor (M0, M1) on the "on" side will undergo IHEI, causing its gate voltage to drop. The floating-gate transistor (M1, M0) on the "off" side won't have any channel current, reducing its injection to negligible levels and causing its gate voltage to remain essentially unchanged.

In an alternative embodiment, the select transistors in FIG. 7 can be implemented with pFETs. The select transistors in FIG. 7 can also be used to separate multiple memory elements in an array from a single sense amplifier D1.

Figure 8:
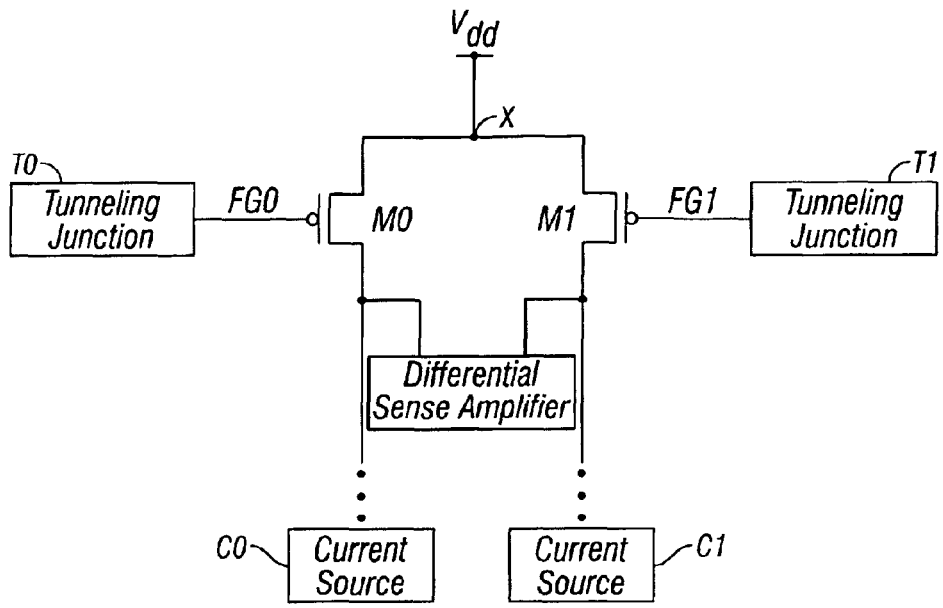
FIG. 8 is an electrical schematic diagram of a differential memory circuit in which the current is controlled at the drains of the floating-gate injection transistors in accordance with an embodiment of the present invention. Since there are two separate current controls, injection can be controlled separately in M0 and M1.

FIG. 8 is an electrical schematic diagram of a differential memory in which the current is controlled at the drains of the floating-gate injection transistors in accordance with an embodiment of the present invention. Since there are two separate current controls, IHEI can be controlled separately in M0 and M1. Current "sources" C0 and C1 may be current sinks in this embodiment. Current "sinks" sink current while current sources source current.

Figure 9:
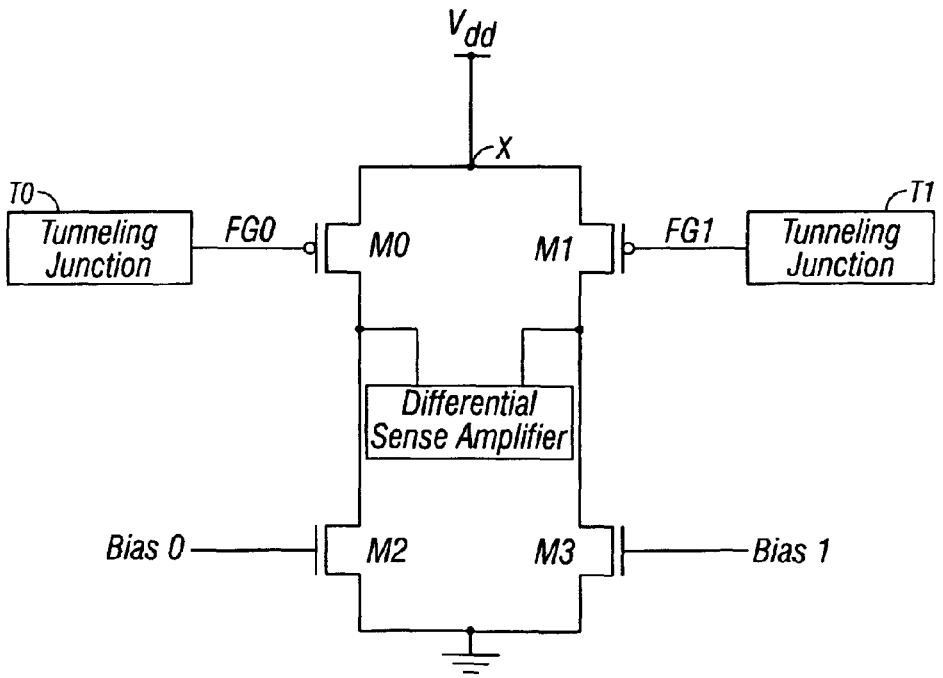
FIG. 9 is an electrical schematic diagram of a version of the differential memory circuit of FIG. 8 in accordance with another embodiment of the present invention. In this version, applying a positive bias voltage to either node bias0 or node bias1 and applying 0V to the other node will write the memory.

FIG. 9 is an electrical schematic diagram of a version of the circuit of FIG. 8 in accordance with an embodiment of the present invention. In this version, applying a bias voltage to either bias0 or bias1 and applying 0V to the other signal will write the memory. If bias0 is set to a bias voltage and bias1 is set to 0V, current will flow through M2 and M0, causing IHEI in M0 and lowering the voltage on FG0. In this case, no current will flow through M3 and M1, so the injection rate at M1 will be much smaller than that at M0. The complimentary case holds when bias1 is set to a bias voltage and bias0 is set to 0V. Both bias0 and bias1 can be set to 0V during read, preventing current from bypassing the sense amplifier.

The read operation for the memories of FIGS. 6A, 6B, 7, 8 and 9 is similar to that described for FIG. 3.

Figure 10:
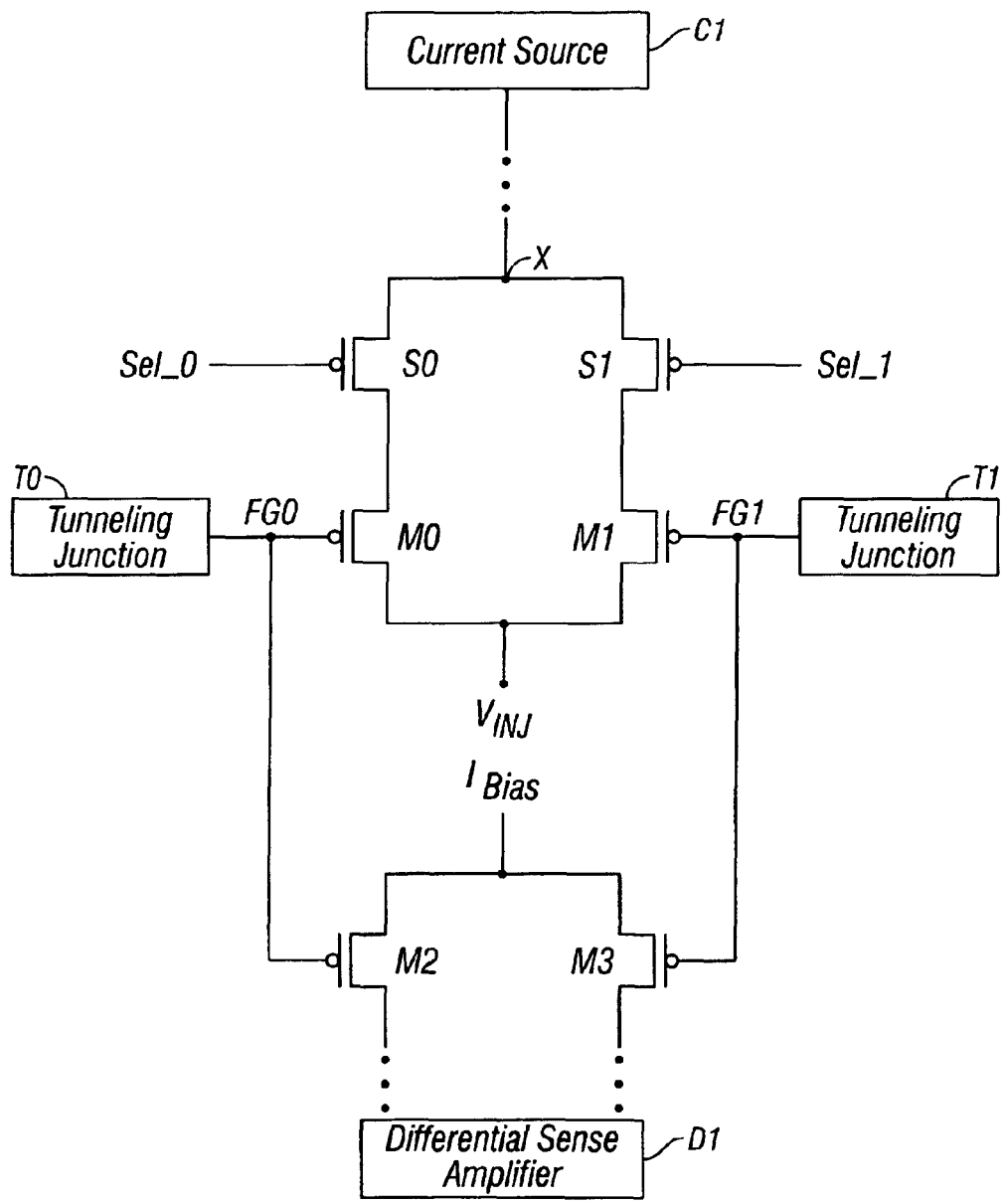
FIG. 10 is an electrical schematic diagram of a memory circuit in accordance with an embodiment of the present invention including a pFET read transistor associated with each floating gate.

The program and read functions can be separated by adding a pFET read transistor (M2, M3) to each floating gate as in the circuit of FIG. 10. FIG. 10 is an electrical schematic diagram of an embodiment of the present invention including a pFET read transistor associated with each floating gate. This modification allows the drain voltage (Vinj) of the injection transistor to be brought below ground, accelerating the IHEI process during writes. It also adds flexibility in the design of the differential sense amplifier.

Figure 11:
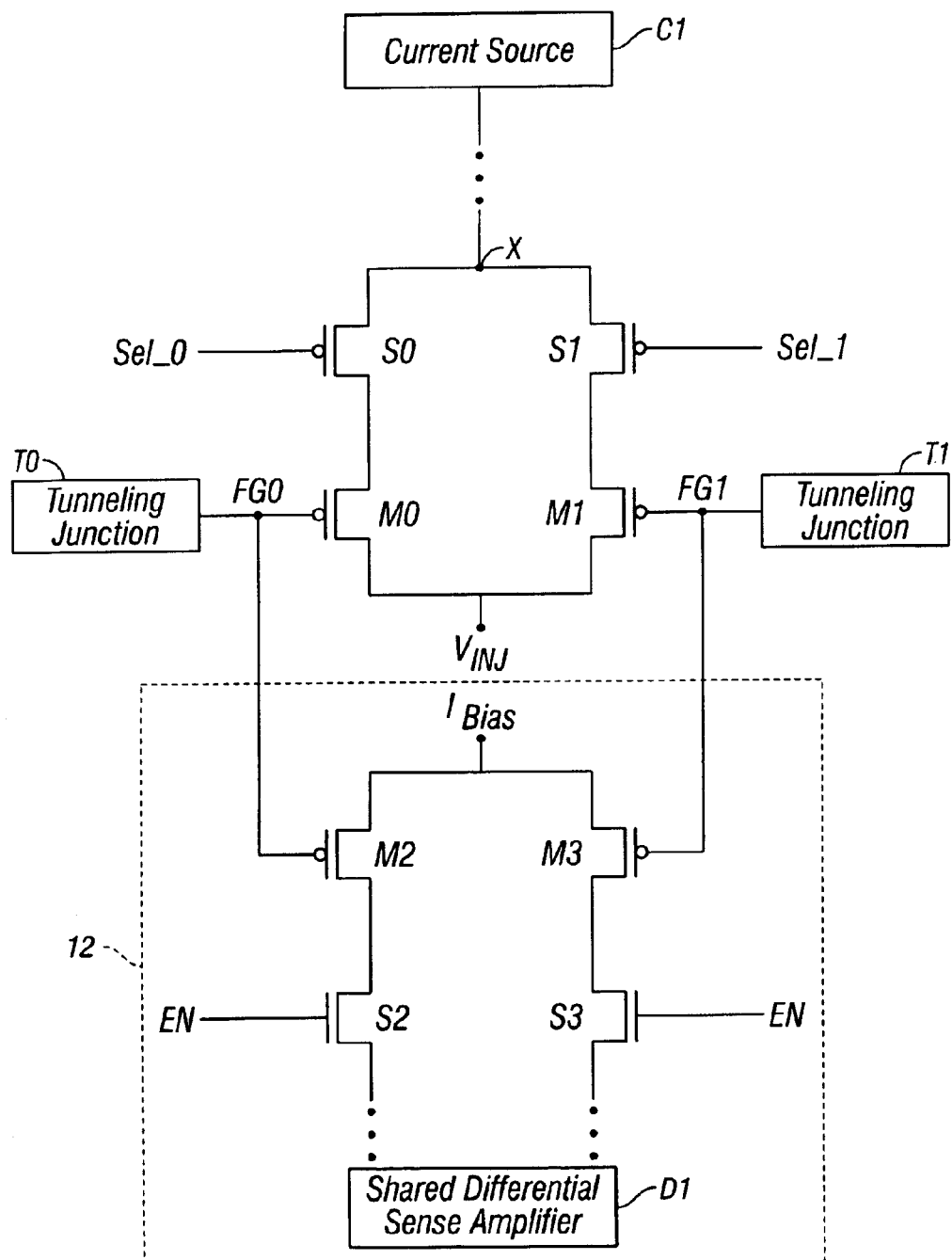
FIG. 11 is an electrical schematic diagram of a memory circuit in accordance with an embodiment of the present invention similar to that of FIG. 10, but including row select transistors (M0, M1) to selectively isolate individual memory locations from the differential sense amplifier.

FIG. 11 is an electrical schematic diagram of an embodiment of the present invention similar to that of FIG. 10, but including row select transistors (S2, S3 which are selectively activated by the "EN" signal) to isolate memory elements from the differential sense amplifier. This modification allows multiple memory elements to share a single differential sense amp D1. The select transistors (S2, S3) can be either nFETs (as shown in the figure) or pFETs, as desired.

Figure 12:
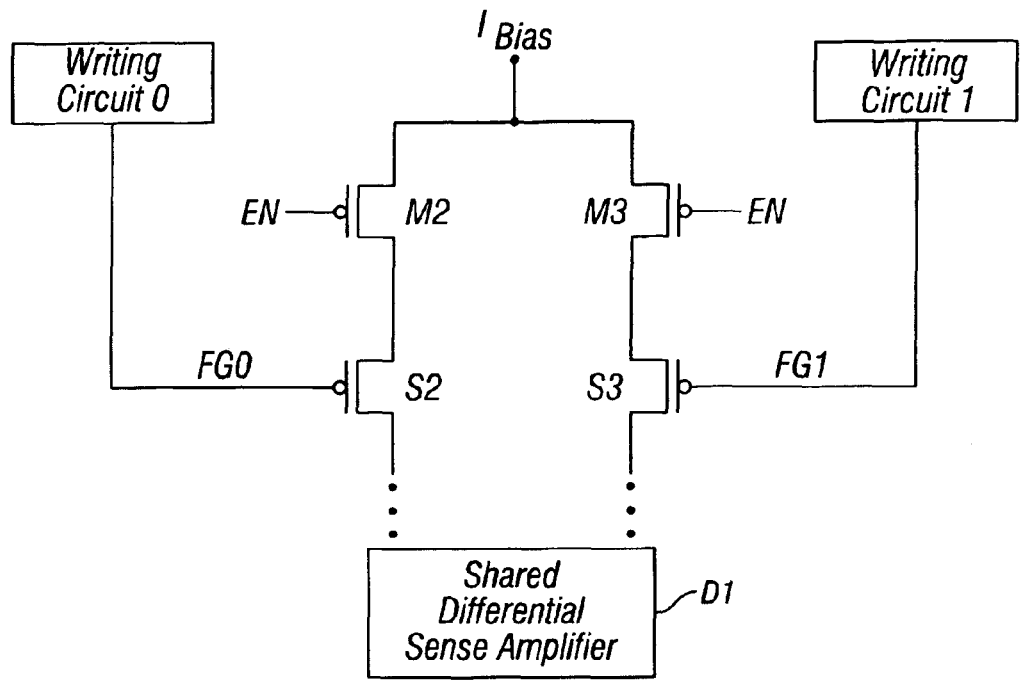
FIG. 12 is an electrical schematic diagram of an alternate portion of the circuitry contained in box 12 of FIG. 11 in accordance with one embodiment of the present invention.

FIG. 12 is an electrical schematic diagram of an alternate portion of the circuit contained in box 12 of FIG. 11 in accordance with one embodiment of the present invention. In this alternate embodiment the select transistors (S2, S3) are pFETs and are in a different arrangement with the pFET read transistors M2, M3. The effect is the same.

Figure 13:
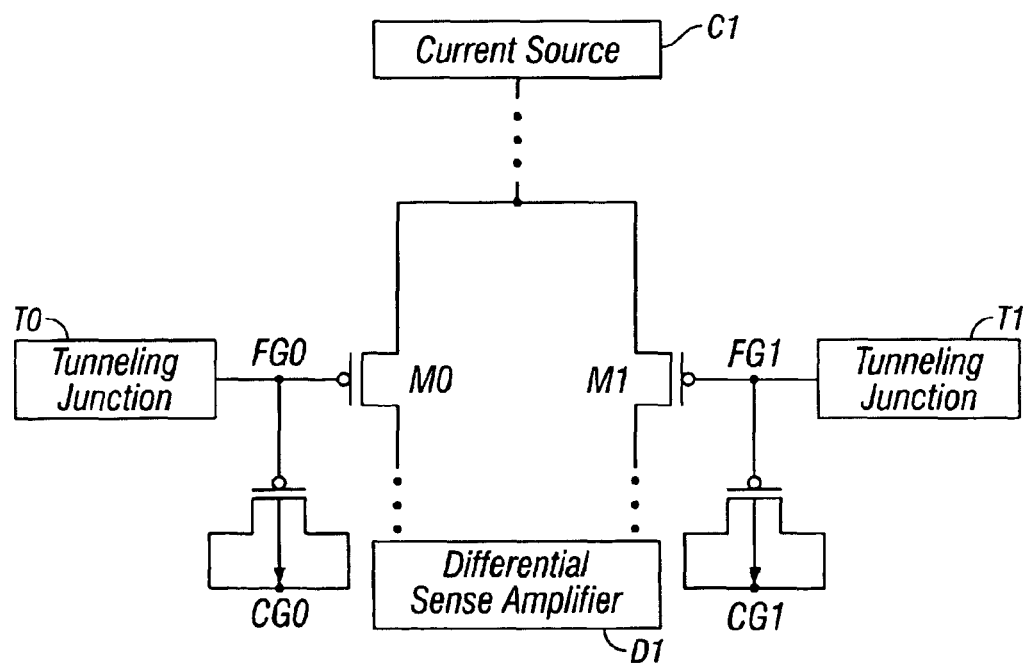
FIG. 13 is an electrical schematic diagram of an embodiment of the present invention implementing bi-directional tunneling.

FIG. 13 is an electrical schematic diagram of an embodiment of the present invention implementing bi-directional tunneling. In this embodiment bi-directional Fowler-Nordheim (FN) tunneling is used for program/erase rather than FN tunneling and IHEI. To enable bi-directional tunneling in a single-well CMOS process, control gates CG0, CG1 are added (in this case pFETs with source, drain and well shorted (which is also a type of MOSCAP)) that capacitively couple to the floating gate, allowing the floating-gate voltage to be changed. To program the memory, one of the MOSCAP control gates is set to a high voltage (Vcg is about 10V) and the tunneling junction is set to ground. By using a large control-gate MOS capacitor relative to the tunneling junction capacitance and any parasitic capacitance, the floating-gate voltage is brought close to Vcg by capacitive coupling, and electrons tunnel from the tunneling junction onto the floating gate. To erase the memory, the tunneling junction is brought high (to about 10V) and the control gate is pulled to ground. Electrons tunnel off the floating gate to the tunneling junction. The control gates in FIG. 13 can also be useful in memory such as that illustrated in FIG. 3 because they can bias the floating gate to maximize writing efficiency. In one embodiment, the MOSCAPs shown in FIG. 13 may be disposed in separate n– wells. Alternatively, these two MOSCAPs may also share a single n– well to save area. To save even more area, at the expense of reduced MOSCAP capacitance, they may be placed in the same n– well as the other pFETs (M0 and M1) in the memory. Alternatively, M0 and M1, given sufficient capacitance, may take over the function of CG0 and CG1, which may then be omitted.

Figure 14:
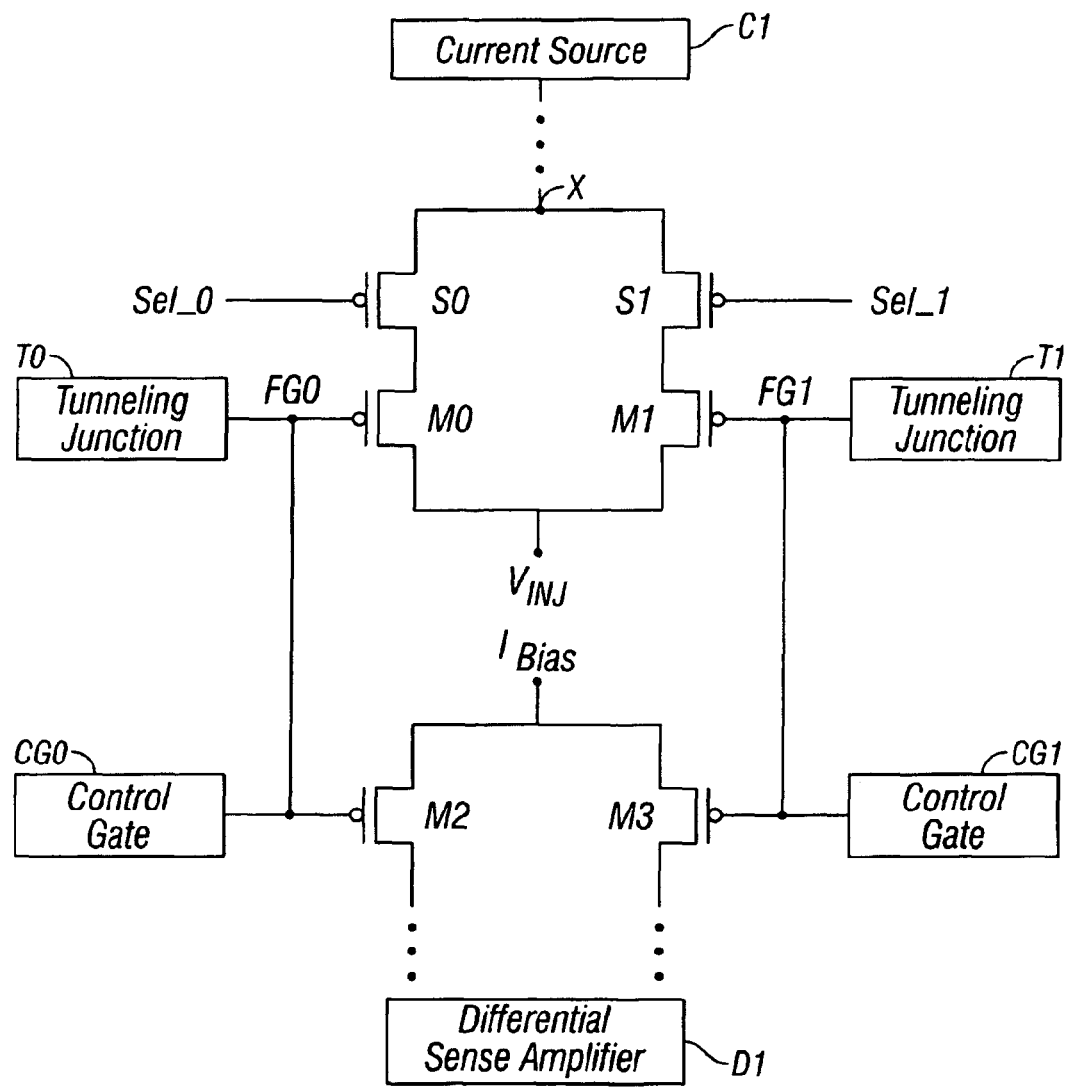
FIG. 14 is an electrical schematic diagram of an alternate embodiment of the present invention based on that of FIG. 13. In this version the memory is written by electron injection, and a pFET read transistor is associated with each floating gate. Capacitively coupled control gate input nodes facilitate margin reads and the write disturb mitigation processes presented herein.

FIG. 14 is an electrical schematic diagram of an alternate embodiment of the present invention based on that of FIG. 13. In this version a sense amplifier is added to the memory of FIG. 13, and the memory is written by injection rather than by bi-directional tunneling. If a pFET is initially off, the floating-gate voltage can be pulled down through capacitive coupling, facilitating the start of the injection process. Also, the control gate can be used to end the tunneling process by pulling the floating gate high when tunneling is done, decreasing the oxide voltage (i.e. decreasing the difference between the tunneling voltage and the floating-gate voltage) and with it the tunneling current. This latter example requires sensing and feedback circuits as can now be easily designed by those of ordinary skill in the art. The control-gate transistors used here have the same options associated with their n– well connections as the control-gate transistors in FIG. 13.

Figure 15:
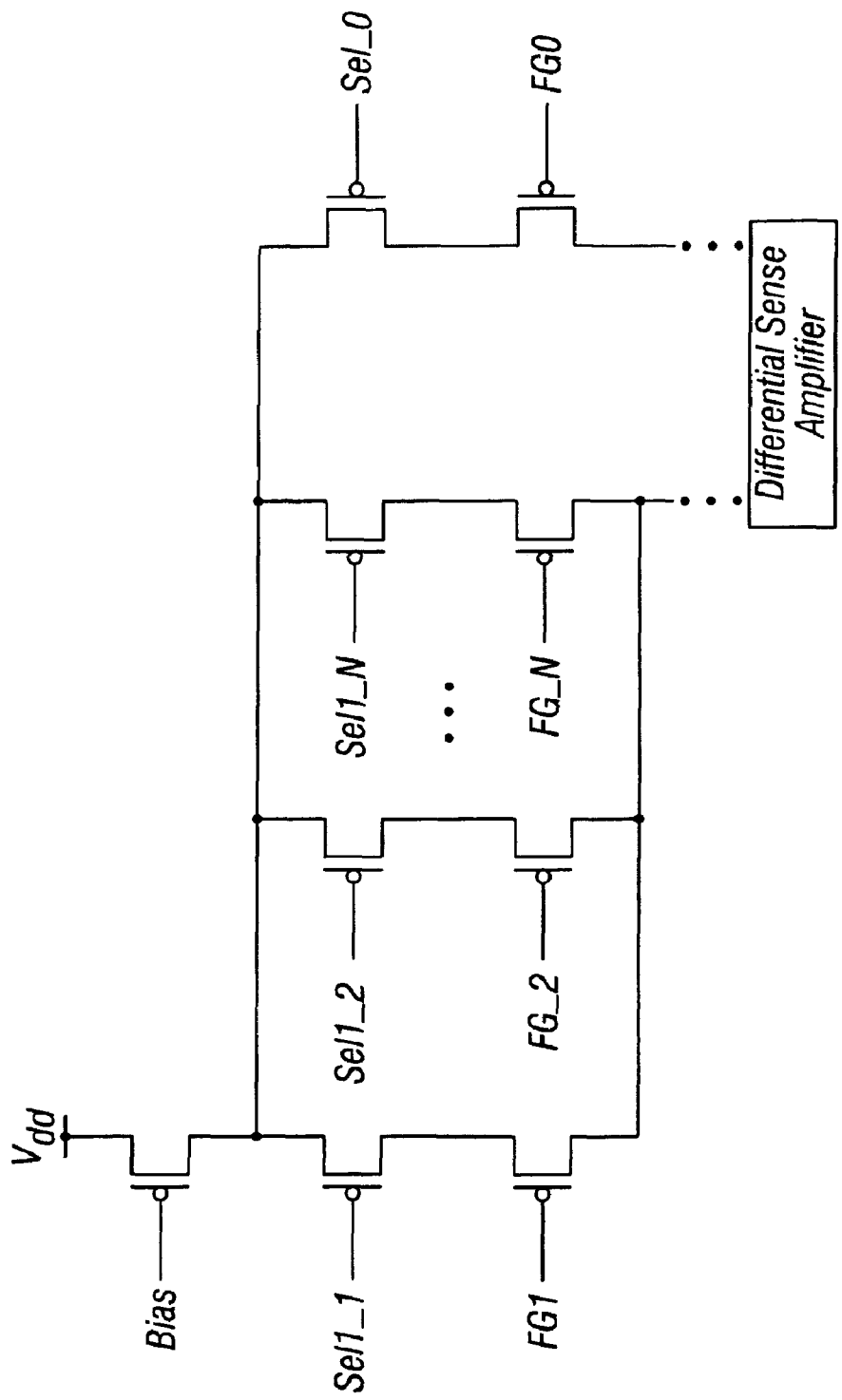
FIG. 15 is an electrical schematic diagram of an embodiment of the present invention where one half of the differential memory location is shared by all memory locations in a row of a memory array. This embodiment is particularly useful for memory banks of differential memories.

FIG. 15 is an electrical schematic diagram of an embodiment of the present invention where one half of the differential memory is shared by all memory elements in a row of the memory. In the embodiment illustrated in FIG. 15, the right side of the differential pair in each memory element has been replaced with a single, shared right side comprising transistors with Sel0 and FG0 as their gates. In this embodiment the shared memory element is written to half way between a logic 0 and a logic 1 state, and each of the unshared memory elements (on the left in the figure) to either a 0 state or a 1 state depending on the stored value. During readout, Sel1_x is set to Vdd for all x except one. (This is used as a bit select.) Using the right side as a neutral reference, the differential sense amplifier will decide if the selected floating-gate transistor in the left of the figure has been written to a 0 state or a 1 state. One possible modification to this memory removes the current source shown at the top of the figure. In this case, the sources of all the select transistors are connected to Vdd. While the circuit no longer works like a true differential pair, the differential sense amplifier still compares a reference current (from the FG0 leg of the circuit) with a data current (from the FGx leg of the circuit.) Alternatively, there could be two shared memory elements (replacing the Sel0 and FG0 devices in the figure), one of which is written to a logic 0 state and the other to a logic 1 state, so that the logic 0 and logic 1 currents are averaged during a read operation to generate a value half way between logic 0 and logic 1. Alternatively, there could be any number (up to N) of sense amplifiers to allow reading multiple memory elements within the same row at one time. During readout, a plurality of the Sel1_x lines are brought to a low voltage at the same time, enabling only those memory elements and allowing multibit reads. A current mirror may be required in configurations without bias transistors to make duplicate copies of the reference current for each bit.

Figure 16:
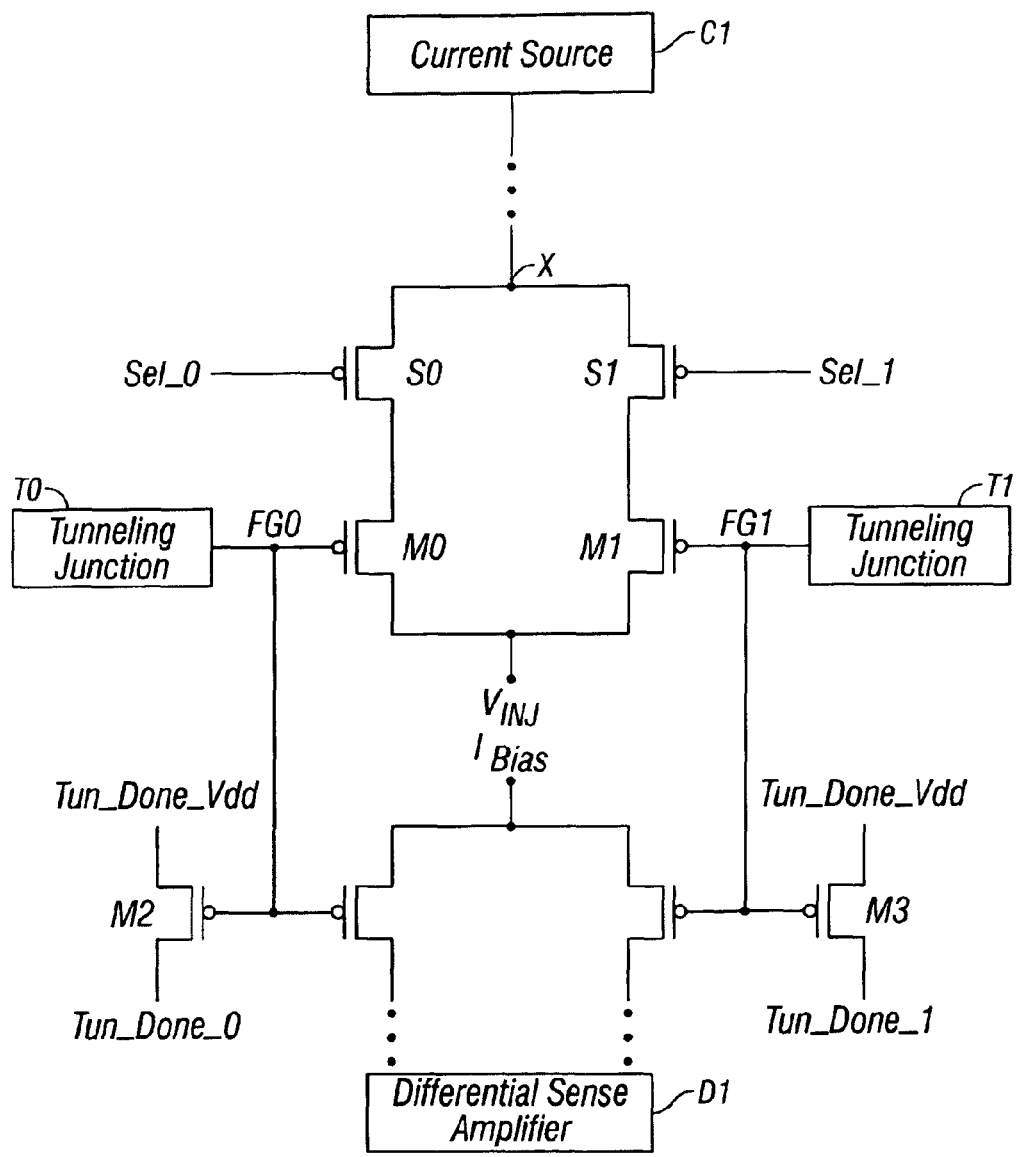
FIG. 16 is an electrical schematic diagram of an embodiment of the present invention that modifies the version of FIG. 14 by adding a pair of floating-gate transistors (M2, M3) to monitor the end of the tunneling process.

FIG. 16 is an electrical schematic diagram of an embodiment of the present invention that modifies the version of FIG. 14 by adding a pair of floating-gate transistors (M2, M3) to monitor the end of the tunneling process. By applying an appropriate Tun_done_Vdd, those of ordinary skill in the art will now appreciate that the TunDone0 and TunDone1 signals generated by the circuit may be used to enable and/or disable the tunneling process. This design is particularly useful for ensuring that tunneling doesn't completely turn off any of the pFET floating-gate transistors in a memory.

Figure 17:
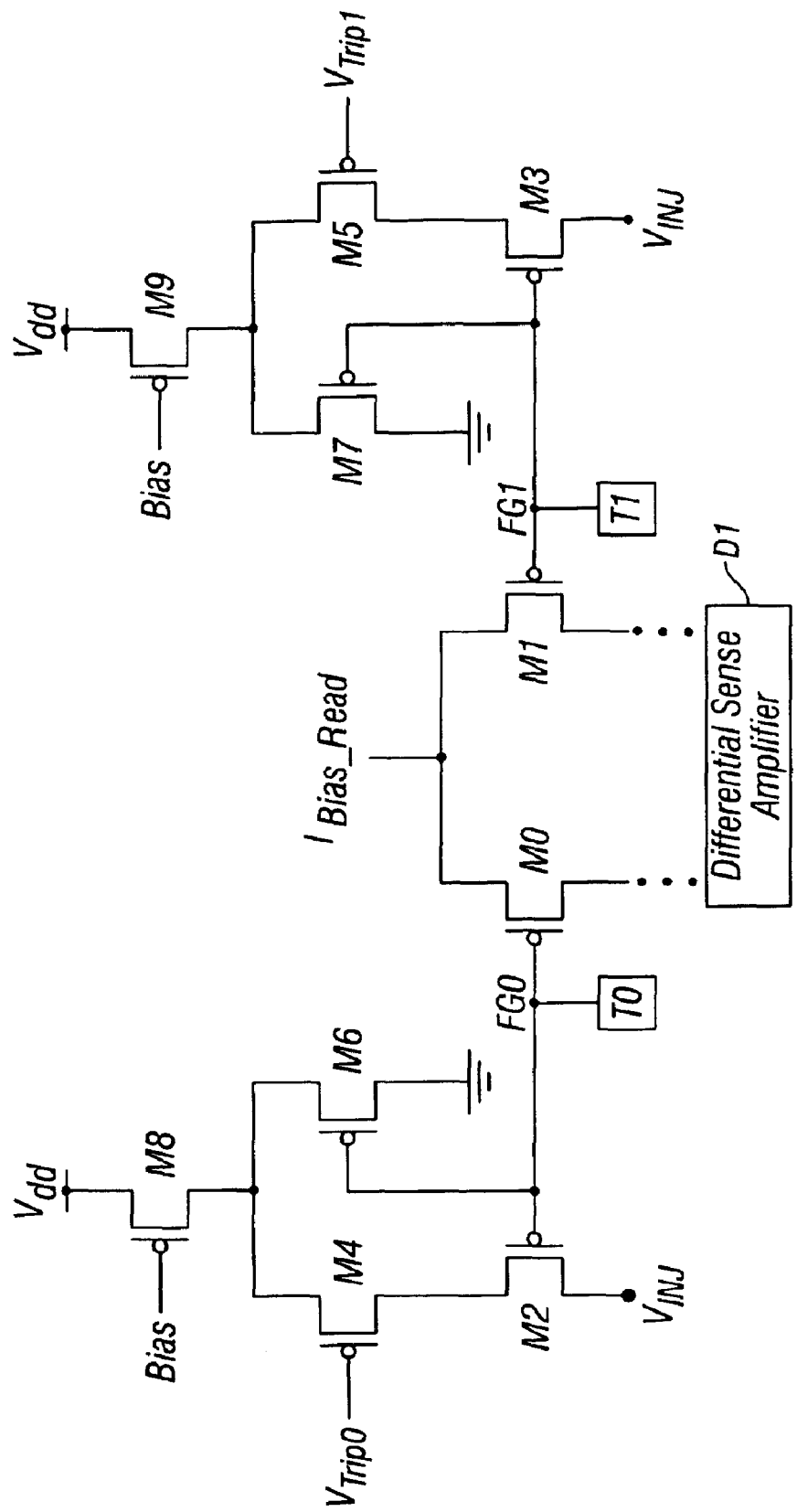
FIG. 17 is an electrical schematic diagram of an embodiment of the present invention that uses feedback to judiciously apply small amounts of injection to a memory during tunneling, to prevent over-tunneling the floating gates of the memory.

FIG. 17 is an electrical schematic diagram of an embodiment of the present invention that illustrates how to use feedback to judiciously apply small amounts of IHEI to a memory during tunneling, to prevent over-tunneling the memory. As the floating gate (FG0 or FG1) increases in voltage, increasing amounts of current flow through injection transistors (M2, M3). The net result is that, when the floating gate has tunneled to its high voltage, the number of electrons added to the floating gate by IHEI is equal and opposite to the number of electrons removed by tunneling. In this state, the floating-gate voltage is stable. Careful design of the regulation circuit allows the final floating-gate voltage to be determined by the designer. (It is largely dependant on the voltage of Vtrip (Vtrip0, Vtrip1) shown in the figure.) This method ensures that the memory never turns completely off, and allows for erasure that is largely independent of tunneling rate mismatch, IHEI mismatch, device mismatch, and other operating conditions.

Figure 18:
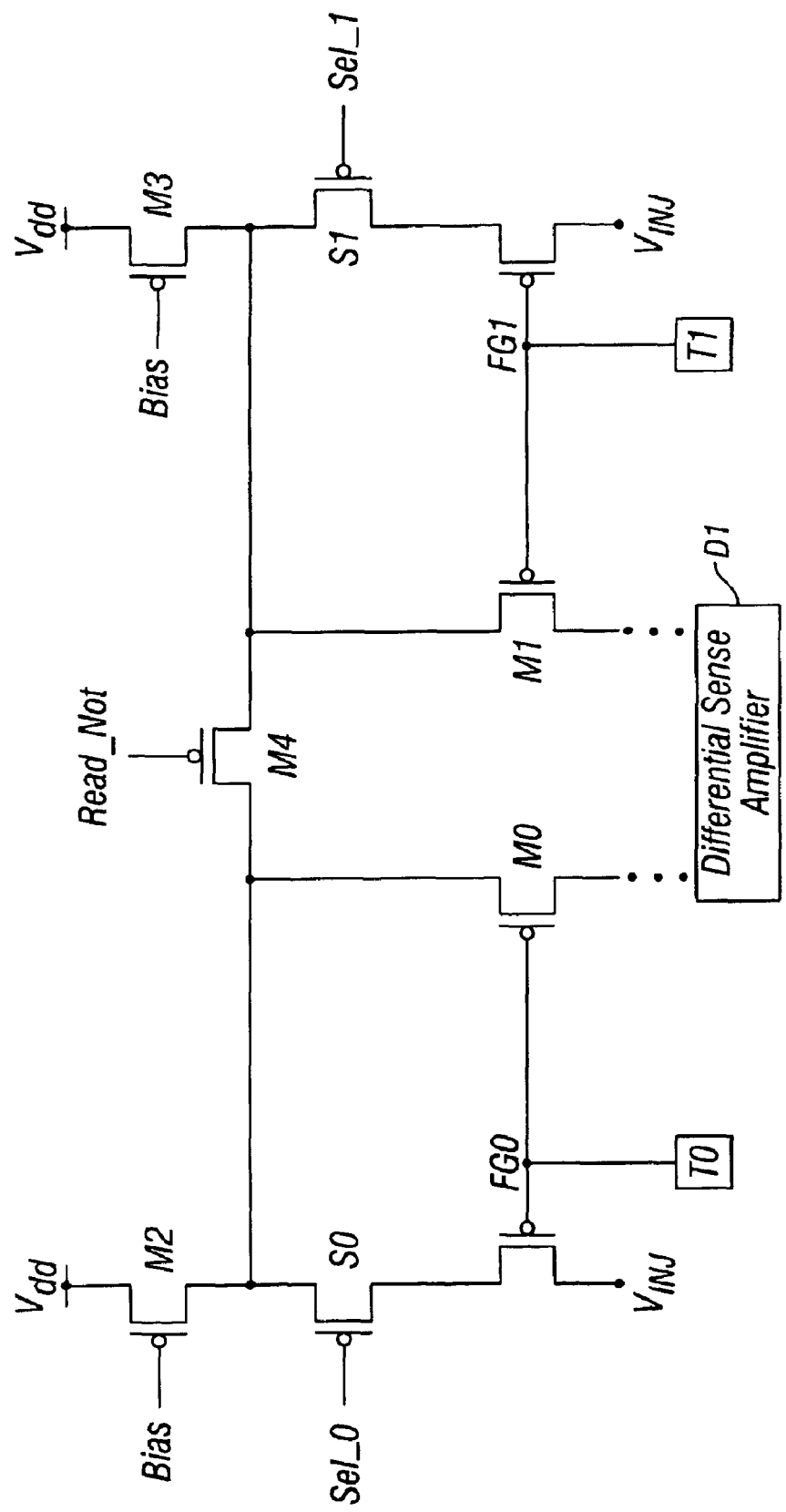
FIG. 18 is an electrical schematic diagram of an embodiment of the present invention presenting a simplification of the memory of FIG. 17. The Read_not signal is used to configure the memory for read mode.

FIG. 18 is an electrical schematic diagram of an embodiment of the present invention presenting a simplification of the memory of FIG. 17. The Read_not signal is used to configure the memory for read versus write/erase mode. During write/erase, the Read_not transistor M4 is turned off, separating the memory element into two half-elements and simplifying writing/erasing. During read, the Read_not transistor M4 is turned on and the two current sources M2 and M3 combine to form a single current source that supplies the equivalent of Ibias_read in FIG. 17. S0 and S1 are used as select transistors during injection, and as current controllers during tunneling. (They take on the same role as M3 and M4 in FIG. 17.)

Figure 19:
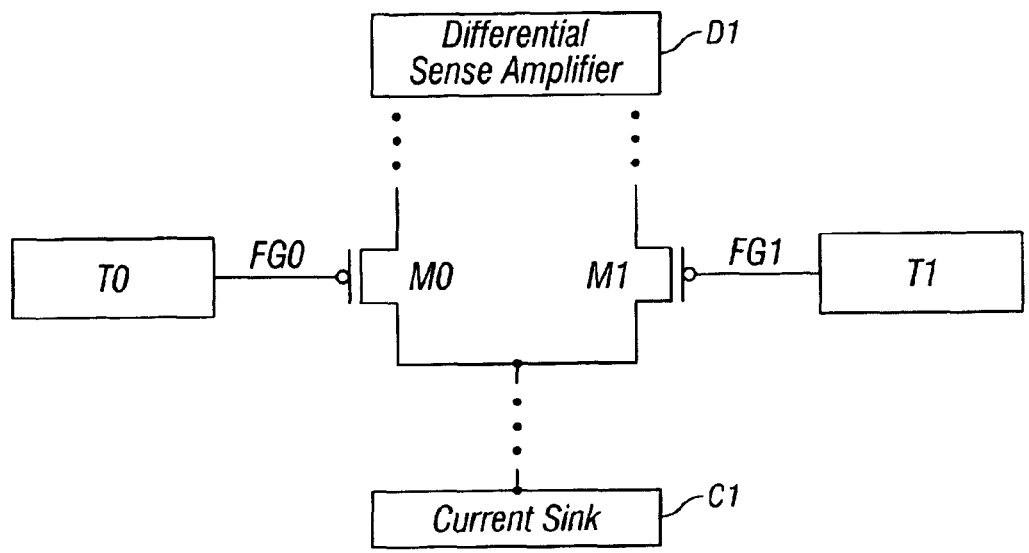
FIGS. 19 and 20 are electrical schematic diagrams of an embodiment of the present invention that illustrate that the memory current can be controlled at the drain side of the injection transistors. The embodiment of FIG. 20 has an explicit nFET current sink M0 that controls the write and read currents.
Figure 20:
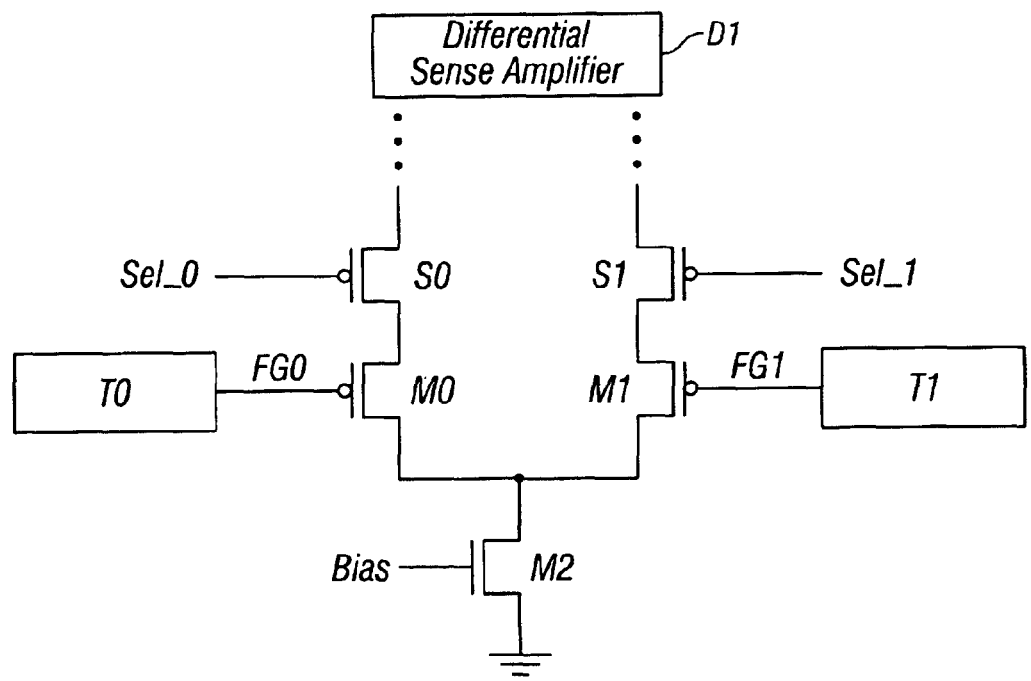

FIGS. 19 and 20 are electrical schematic diagrams of an embodiment of the present invention that illustrate that the current can be controlled at the drain side of the injection transistors. The embodiment of FIG. 20 has an explicit nFET current sink M2 that controls the write and read currents. SEL_0 and SEL_1 have similar functions to the same signals in the memory of FIG. 6A. The differential sense amplifier for this memory must accept current in reverse polarity compared to the amplifiers for the memory presented above. Note that this form of current control can also be applied when the read and write functions are separated, as in FIG. 10.

Example Memories

Figure 25:
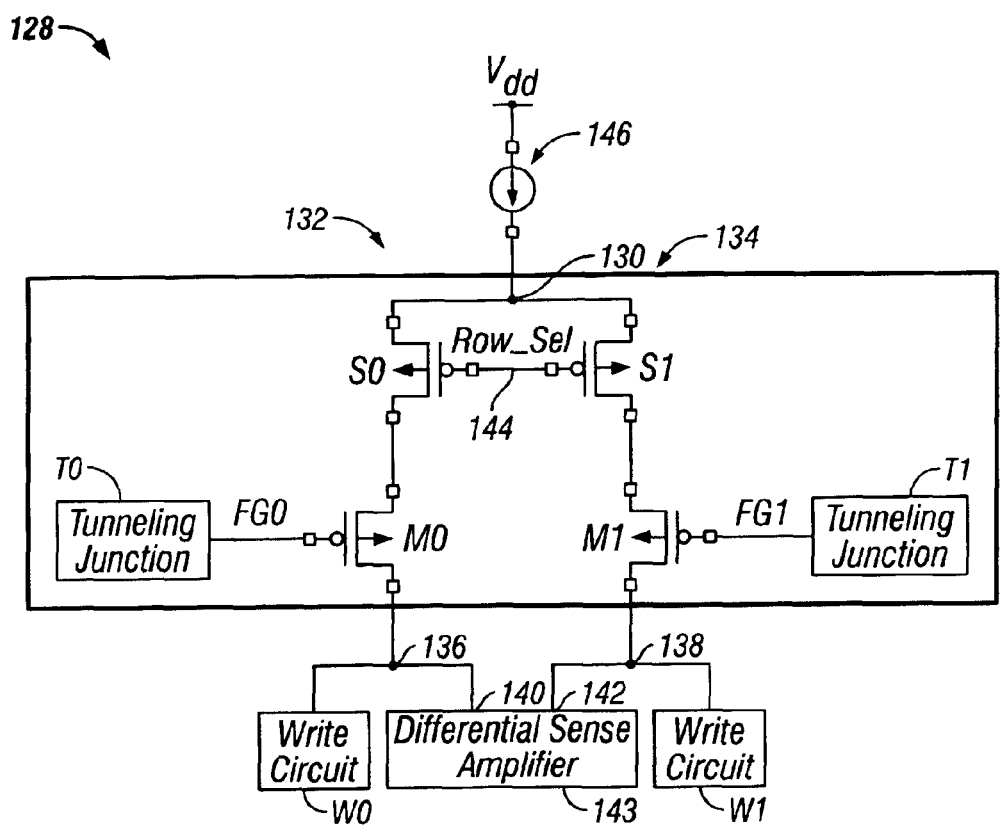
FIG. 25 is an electrical schematic diagram of a differential memory in accordance with one embodiment of the present invention.

Turning now to FIG. 25 a novel memory 128 is illustrated. The memory 128 is provided with off-memory element bias current at node 130, which acts as a current source for the memory 128. The left and right sides 132 and 134, respectively, of the memory each comprise a select transistor (here a pFET) S0, S1, respectively, coupling the current source node 130 to the sources of floating gate charge injection transistors M0, M1, respectively (here shown as pFETs). Tunneling junction circuits T0, T1 (which are optional and may be constructed as discussed above) are provided to remove electrons from floating gates FG_0 and FG_1, respectively. The drains of M0, M1 are coupled to nodes 136, 138, respectively, and these are each coupled to a write circuit W0, W1, respectively and to differential inputs 140, 142 of a differential sense amplifier circuit 143. To read this memory element, one selects the row containing the memory element (generally a row of a two-dimensional array of memory elements) by asserting the Row_Sel signal at node 144 and applies bias current to node 130 with, for example, the bias current circuitry 146 as illustrated. One then uses the differential sense amplifier circuit 143 to read the contents of the selected memory element. Writing is accomplished by asserting the Row_Sel signal at node 144, which selects the row, and applying bias current to node 130. Either the left side write circuit, W0, or the right side write circuit, W1, is turned on to write a respective 0 or 1 (or vice versa depending upon configuration) to the memory 128 by causing electrons to be injected to the respective floating gate (FG_0 or FG_1). In this manner the same transistors are used for both reading and writing and the write circuits, differential sense amplifier circuits and current source circuits may, if desired, be located outside of the memory element and shared by a number of different memory elements for increased density as will now be fully appreciated by those of ordinary skill in the art.

Figure 26:
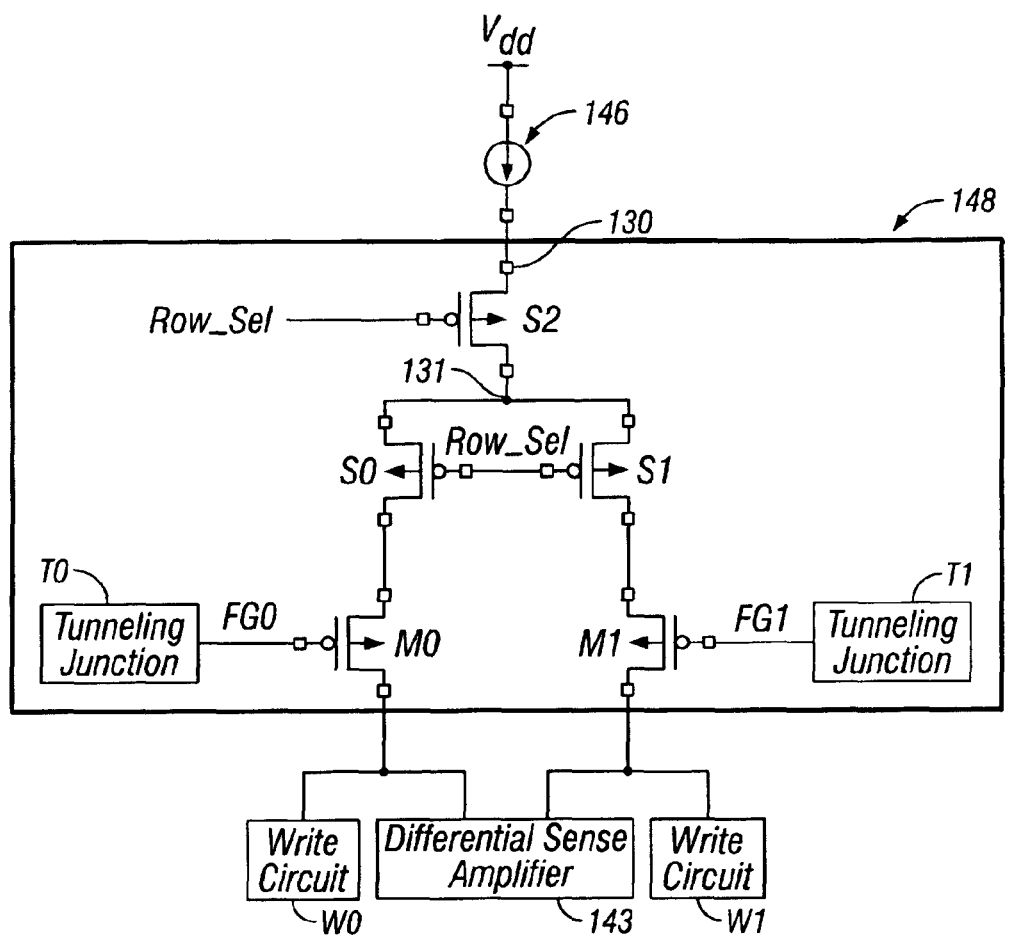
FIG. 26 is an electrical schematic diagram of an alternative differential memory in accordance with another embodiment of the present invention.

Turning now to FIG. 26, a memory 148 is illustrated which differs from the memory 128 of FIG. 25 in that a row select transistor controlled by the Row_Sel signal is disposed between current source node 130 and node 131 which is, in turn, coupled to the sources of select transistors S0, S1. This improvement reduces the capacitance seen by the current source circuitry 146 for memory elements in which Row_Sel is not asserted. Reduced capacitance improves performance at the cost of a single additional transistor per memory element. Operation of the memory is essentially identical to that of the memory of FIG. 25.

Figure 27:
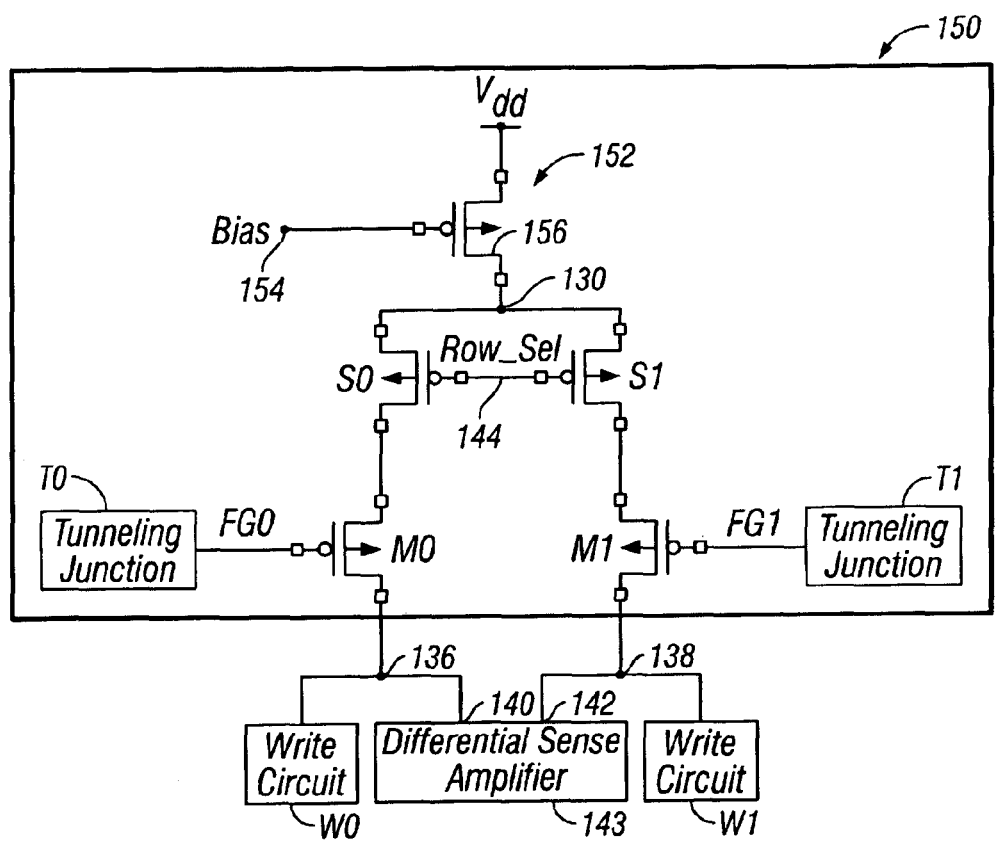
FIG. 27 is an electrical schematic diagram of yet another differential memory.

Turning now to FIG. 27, a memory 150 is illustrated which differs from the memory 128 of FIG. 25 in that the current source circuitry 152 is disposed within the memory 150 and is coupled to current source node 130. To read the memory, the row is selected with Row_Sel as before, voltage bias is applied to node 154 at the gate of bias transistor (here, a pFET) 156 and the output is measured with differential sense amplifier circuit 143. Writing is performed by selecting the row with Row_Sel, applying a bias voltage to node 154 and turning on one of the two write circuits W0, W1. In accordance with this version, the bias signal applied to node 154 can be a global net for the whole memory array. Having the current source transistor 156 disposed within the memory element itself reduces the capacitance needed to be charged up to accomplish reads and writes and, thus, realizes improved performance. There is a penalty associated with this embodiment that may or may not pose a difficulty with various applications of the memory. Current source matching from memory element to memory element will be poor as each memory element will have its own current source transistor 156 and they will tend to be small-area devices resulting in more variation from device to device. This can be overcome, if necessary in a particular application, by utilizing known matching techniques at the cost of increased circuit complexity and/or area.

Figure 28:
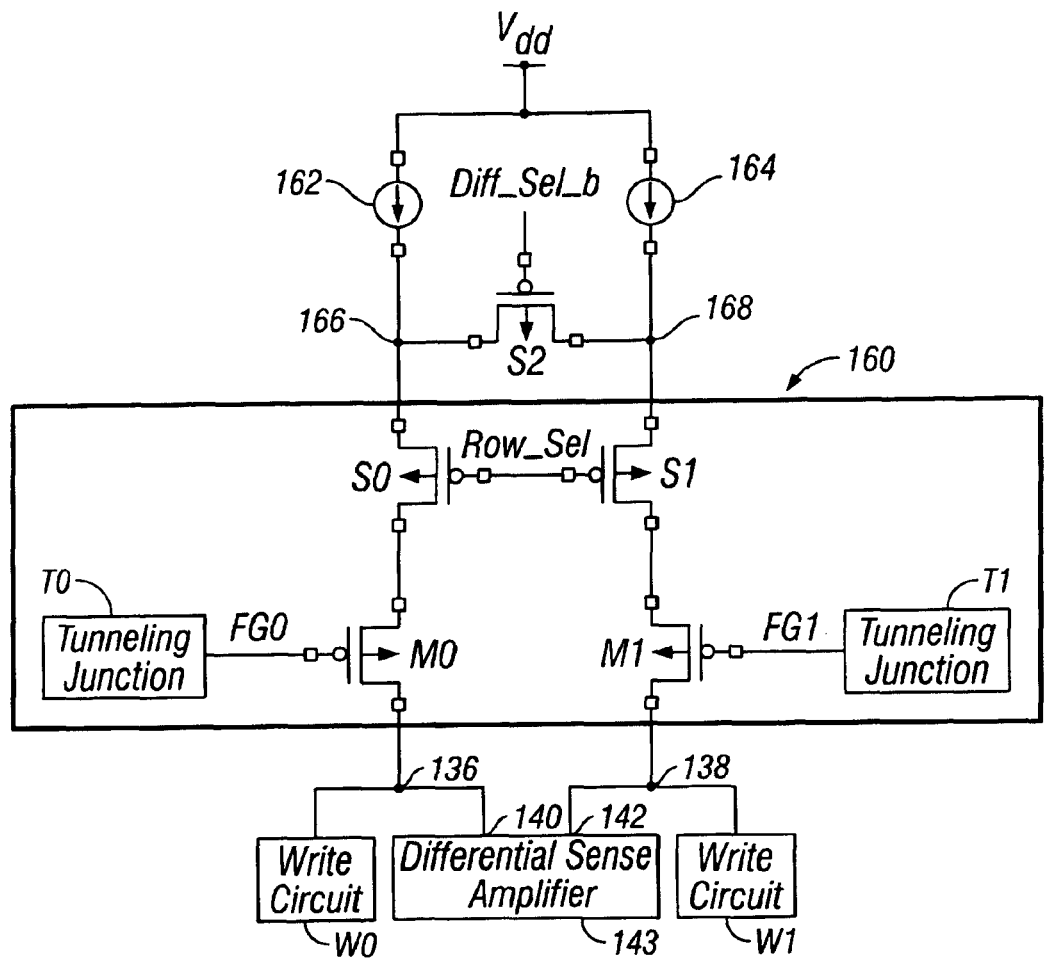
FIG. 28 is an electrical schematic diagram of a differential memory with the capability of having its different sides written independently.

Turning now to FIG. 28, a memory 160 is illustrated which differs from the memory 128 of FIG. 25 in that current source node 130 is omitted and, instead, a pair of independent current sources 162, 164 are provided (which may be transistors or other suitable current source devices or conductors coupled to other current sources). A select transistor S2 (here, a pFET) is provided with its source and drain coupled between nodes 166 and 168 for coupling and decoupling nodes 166 and 168. This allows the memory element to be coupled to both current sources 162 and 164 simultaneously, or the right side of the memory and the left side of the memory to be coupled only to their respective current sources 162, 164, depending upon the state of signal Diff_Sel_b applied to the gate of select transistor S2. In this fashion, both sides of the memory element may be written independently (and thus single-endedly) and simultaneously by decoupling the sides with the Diff_Sel_b signal. Reading is accomplished by selecting a row with the Row_Sel signal as before, enabling current sources 162 and 164, asserting the Diff_Sel_b signal on the gate of select transistor S2 (to couple the right and left sides of the memory element) and reading the memory with differential sense amplifier 143. Writing is accomplished by selecting a row with Row_Sel, enabling current sources 162 and 164, deasserting the Diff_Sel_b signal on the gate of select transistor S2 and using one or both of the write circuits W0 and W1 to write information into the memory 160.

Switch S2 in this application is important in that it allows one to change the differential memory element into two single-ended memory elements. With the switch S2 closed, the memory is differential. Applications include differential readout, where the current can be steered from one side of the memory element to the other based upon the floating gate voltages. In this mode the circuit operates as if there were a single current source, even though there may be two (e.g., 162, 164 in this version). With switch S2 opened, the memory element is split into two separate half-elements. One can now write on one side of the memory element at one time and on the other at another time, or independently on both sides of the memory element at the same time, all without affecting the other side. It also becomes possible to read out the current from one side of the memory at a time in a debugging mode in order to determine each of the floating gate voltages.

Figure 29:
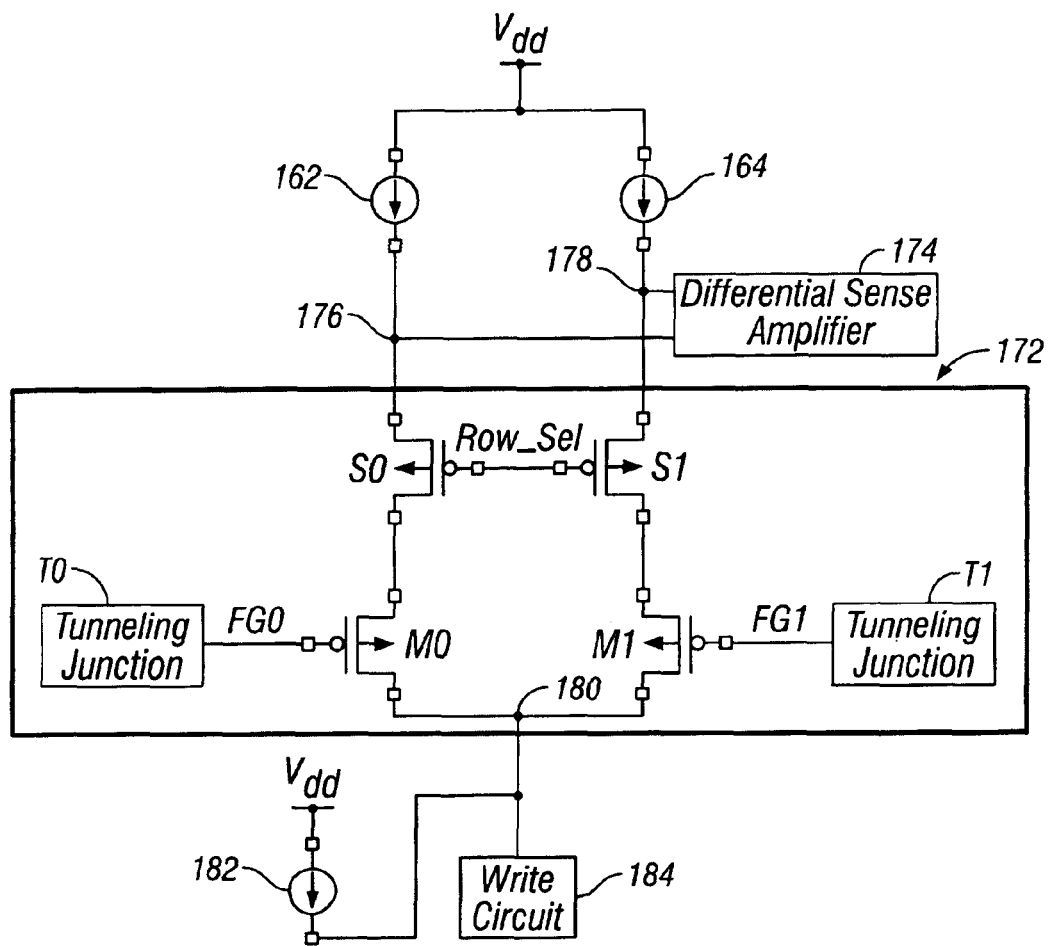
FIG. 29 is an electrical schematic diagram of another alternative differential memory.

Turning now to FIG. 29, a memory 172 and supporting circuitry is illustrated. This memory differs from that illustrated in FIG. 28 as follows. Current sources 162, 164 are coupled to the sources of select transistors S0 and S1 (nodes 176 and 178). Also coupled to those nodes is a differential sense amplifier circuit 174. The drains of injection transistors M0, M1 are coupled to node 180, as well as current source 182 and write circuit 184. To read the memory assert Row_Sel to select the row, apply bias current from current source 182, disable current sources 162 and 164 and read the state of the memory with the differential sense amplifier 174. To write the memory, select the row with the Row_Sel signal as before, disable bias current from current source 182, apply bias current with one of current sources 162 and 164 and enable write circuit 184 to write the memory. This memory can write both the right and left hand sides at the same time (turn on both current sources) and requires only one writing circuit as opposed to the two used in other designs presented herein.

Figure 30:
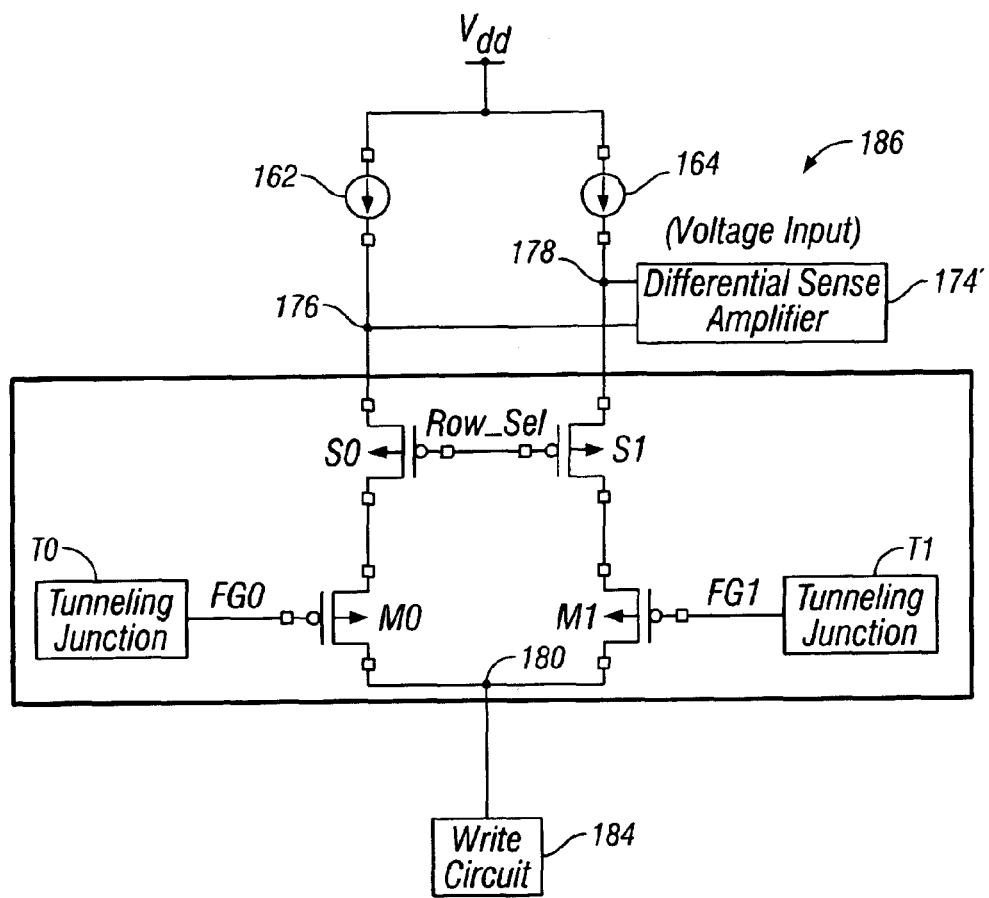
FIG. 30 is an electrical schematic diagram of another alternative differential memory.

Turning now to FIG. 30, a memory 186 similar to that of FIG. 29 but with slightly different supporting circuitry is illustrated. In this version, a single write circuit 184 is coupled to node 180 with no additional current source coupled to that node as in the FIG. 29 embodiment. A voltage input differential sense amplifier circuit 174' is used to read the memory. To read a memory element the Row_Sel signal is asserted as before, bias current is applied on both sides of the memory element with each side of the memory acting as an independent source follower. The voltages are read with differential sense amplifier 174'. To write the memory, the Row_Sel signal is asserted, one or both current sources 162, 164 is turned on and the write circuit 184 is enabled.

Figure 31:
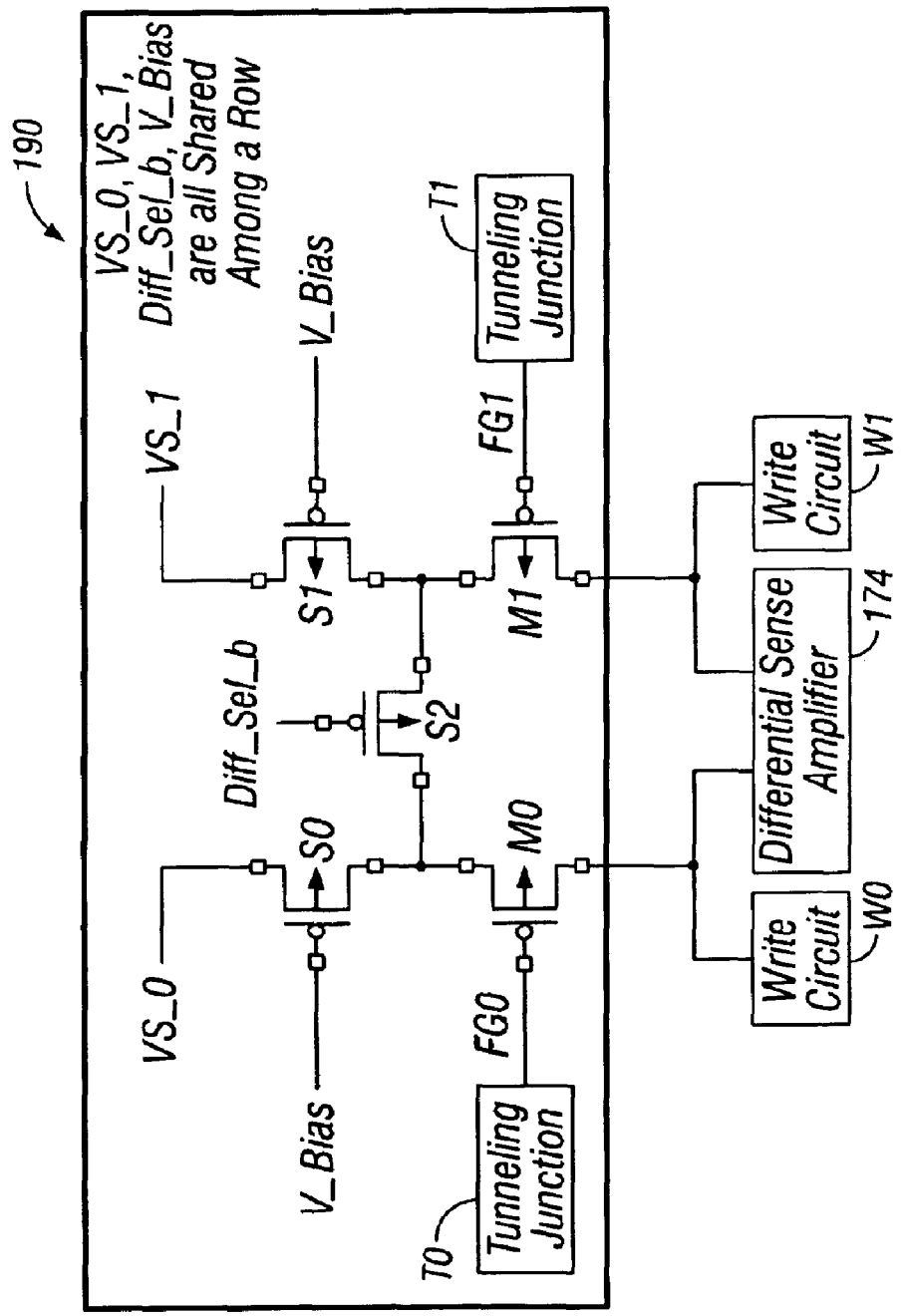
FIG. 31 is an electrical schematic diagram of another alternative differential memory.

Turning now to FIG. 31, another embodiment of a memory 190 in accordance with the present invention is illustrated. This memory has a pair of floating-gate injection transistors M0, M1 with their floating gates coupled (if desired) to tunneling junctions T0, T1 as described before. Write circuits W0, W1 are respectively coupled to the drains of M0, M1 and these drains also comprise the inputs of differential sense amplifier 174. Source transistors (pFETs) S0 and S1 have their gates coupled to V_bias and their sources coupled to VS_0 and VS_1, respectively. The drains of S0 and S1 are coupled to the sources of M0 and M1 and are cross-coupled by select transistor S2 (here, a pFET) the gate of which is controlled by the Diff_Sel_b signal. VS_0, VS_1, Diff_Sel_b and V_bias are signals carried on lines all shared among a row's memory elements in a two-dimensional array of memory elements. A read is accomplished by setting VS_0 and VS_1 to Vdd, applying voltage bias with V_bias to the source transistors S0, S1, asserting Diff_Sel_b to couple the left and right sides of the memory 190, and using the differential sense amplifier 174 to read the memory. To write the memory, set VS_0 and VS_1 to Vdd, apply the voltage bias with V_bias, deassert Dif_Sel_b to isolate the right and left sides of the memory 190, and enable one or both write circuits W0, W1 to write the memory's contents. This embodiment uses current sources within the memory (S0, S1) for faster operation, can write both sides of the memory (i.e., both floating gates FG_0 and FG_1) simultaneously, and only uses one additional transistor (S2) over the embodiment of FIG. 30.

Figure 32:
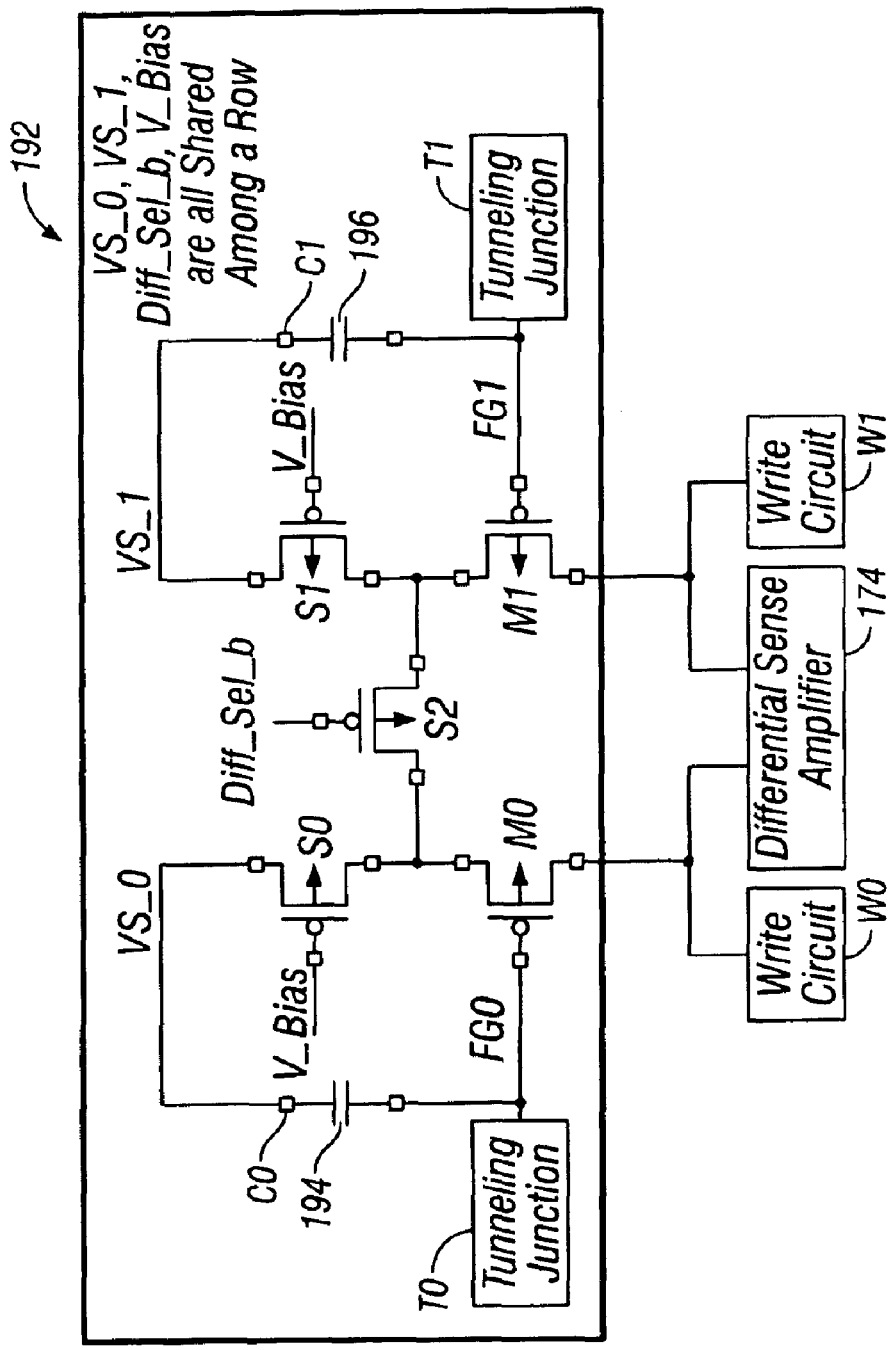
FIG. 32 is an electrical schematic diagram of another alternative differential memory.

A variant of the embodiment of FIG. 31 is illustrated in FIG. 32. In the embodiment of FIG. 32 the floating gate injection transistors include control gates (which are not required in the embodiments that do not explicitly show them, but are always an option for any memory). The control gate terminals C0, C1 are coupled to the sources of source transistors S0, S1, respectively and are schematically represented as capacitors 194, 196, respectively. In this manner, connecting the control gates to the VS_x signal lines makes for efficient routing as VS_x serves as both the control gate input (to Cx) and the power supply for the current sources (Sx) ("x" representing 0 or 1 as appropriate). Setting VS_x low not only shuts off the current sources in the memory, but it also pulls the floating gates FG_x to a lower voltage to reduce write disturb. Note that there is no requirement that the control gate signals be combined with the VS_x signals and it is possible to modify other versions of the memory described herein to utilize this feature. In other respects the memory 192 operates in the same manner as the memory 190 of FIG. 31.

Figure 33:
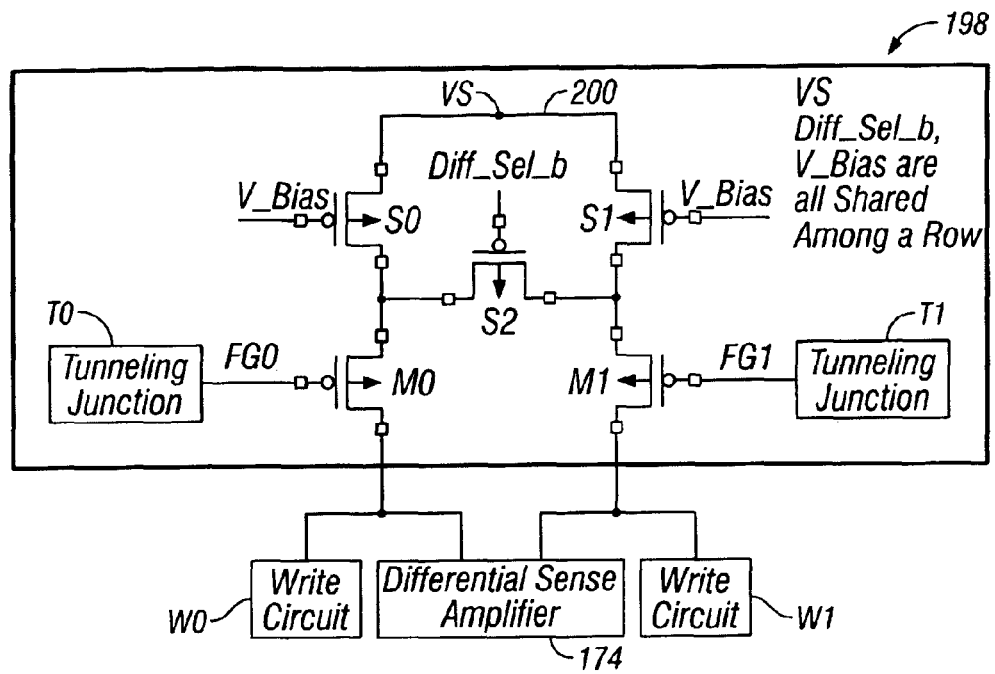
FIG. 33 is an electrical schematic diagram of another alternative differential memory.

Another variant of the embodiment of FIG. 31 is illustrated in FIG. 33. In the embodiment of FIG. 33 the VS_x signals are not distinct and there is a signal instead denoted VS supplied to node 200 that is tied to both sources of source transistors S0, S1. This embodiment saves routing of a second VS line but inhibits use of the technique of FIG. 32 in conjunction with that of FIG. 34. This is because the two control capacitors of FIG. 34 cannot be controlled independently once VS_0 and VS_1 have been merged into one signal, VS, as in FIG. 33. In other respects the memory 198 operates in the same manner as the memory 190 of FIG. 31.

Multi-Bit Storage

One way to store more than one bit of information in a differential memory structure such as those described herein is to write a reference on one side of the memory and store one of many levels on the other side. By adding various offsets to the readout system and determining how much offset is required to cause the readout to change state, the stored multi-bit value can be retrieved. This is an example for a two-bit system:

1. Write a value of 0.5 to side A;
2. Write any one of the following to side B {1, 0.75, 0.25, 0};
3. During readout, compare side A against side B with the offsets: {0, +/−⅜};
4. Depending on the result of the first compare, it will be determined that the stored value is one of {1, 0.75} or one of {0.25, 0}. The offset for the second compare narrows the list to one value in this two-bit case. In general, one would continue doing comparisons with different offsets until the value is determined. Each comparison yields one bit of information.

To apply the offsets, either currents can be added to the memory or a capacitively coupled control input node can be used to move the floating gate voltages directly.

In another example, one would write both sides of the memory structure to different values, do some operation on them (such as subtraction) and then take the result and compare it against some fixed set of references.

Margin Reading

Figure 34:
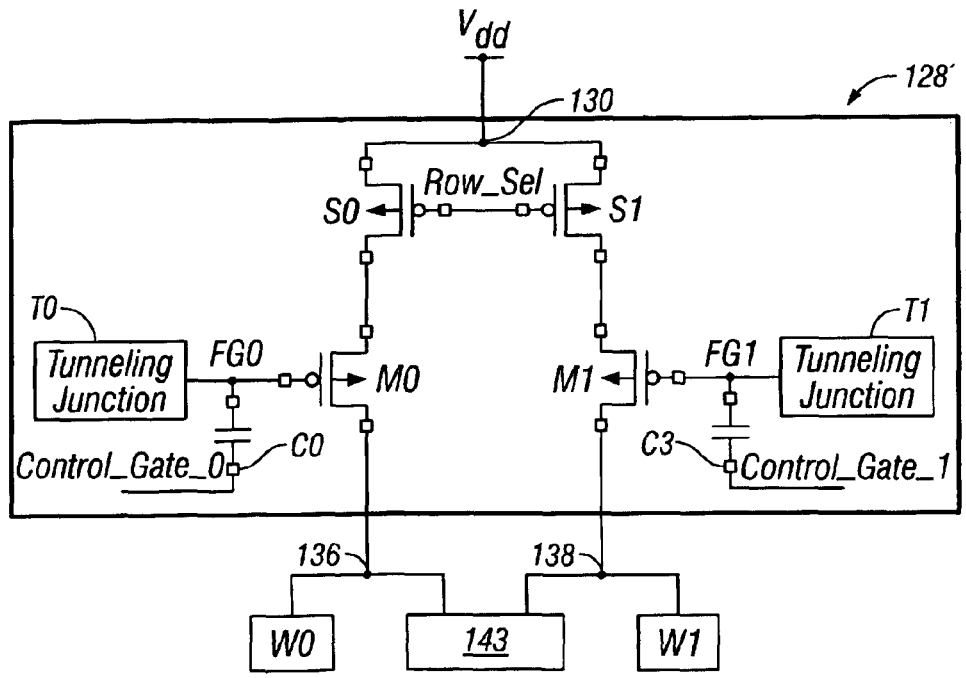
FIG. 34 is an electrical schematic diagram of another alternative differential memory used to illustrate a first method of margin reading.

Quality control processes prior to final customer shipment usually require that a memory be capable of properly storing and reliably retrieving a desired value. Thus, a method for verifying the margin with which the memory can read a stored value is valuable. The memory elements described in this disclosure pose some interesting challenges in designing and conducting such verifications. The problem is that the differential readout mechanism used by most of the memory presented here is so robust that even a very small differential floating-gate voltage will result in correct operation. The goal is to insure a relatively large differential floating gate voltage for the best retention and a truly robust design. In accordance with a first basic approach, memory 128' is illustrated in FIG. 34. Memory 128' is in most respects the same as memory 128 of FIG. 25 except that control gates are explicitly required. In order to check the margin, the following procedures are used:

Zero Stored in Memory . . .
1. If a 0 is stored in the memory, then the FG_0 voltage should be less than the FG_1 voltage;
2. Apply a voltage to node C0 of control_gate_0 that is some desired small amount higher than a voltage applied to node C3 of control_gate_1;
3. As a result of capacitive coupling, FG_0's voltage increases, relative to that of FG_1, making it harder to read out the contents of the memory correctly; and
4. If the memory still reads out correctly under these conditions, then the voltage margin between FG_0 and FG_1 is as desired.

One Stored in Memory . . .
1. If a 1 is stored in the memory, then the FG_0 voltage should be greater than the FG_1 voltage;
2. Apply a voltage to node C0 of control_gate_0 that is some desired small amount less than a voltage applied to node C3 of control_gate_1;
3. As a result of capacitive coupling, FG_1's voltage increases, relative to that of FG_0, making it harder to read out the contents of the memory correctly; and
4. If the memory still reads out correctly under these conditions, then the voltage margin between FG_0 and FG_1 is as desired.

This technique may be used with versions of the other memories described herein. Additionally, it may be acceptable for a particular test protocol to provide some of the memory elements on a chip or in an array with a control gate for performing the test described above without providing all with control gates and testing of some or all of the control gate-supplied memory elements may be deemed sufficient to validate a particular chip in the absence of individual testing of all memory elements on the chip. Also note that "control gates" are not required per se, only low leakage capacitors, each with one terminal coupled to (or being) the floating gate. It is a requirement that the capacitors be independent of one another so that the floating gates may be manipulated independently.

Figure 35:
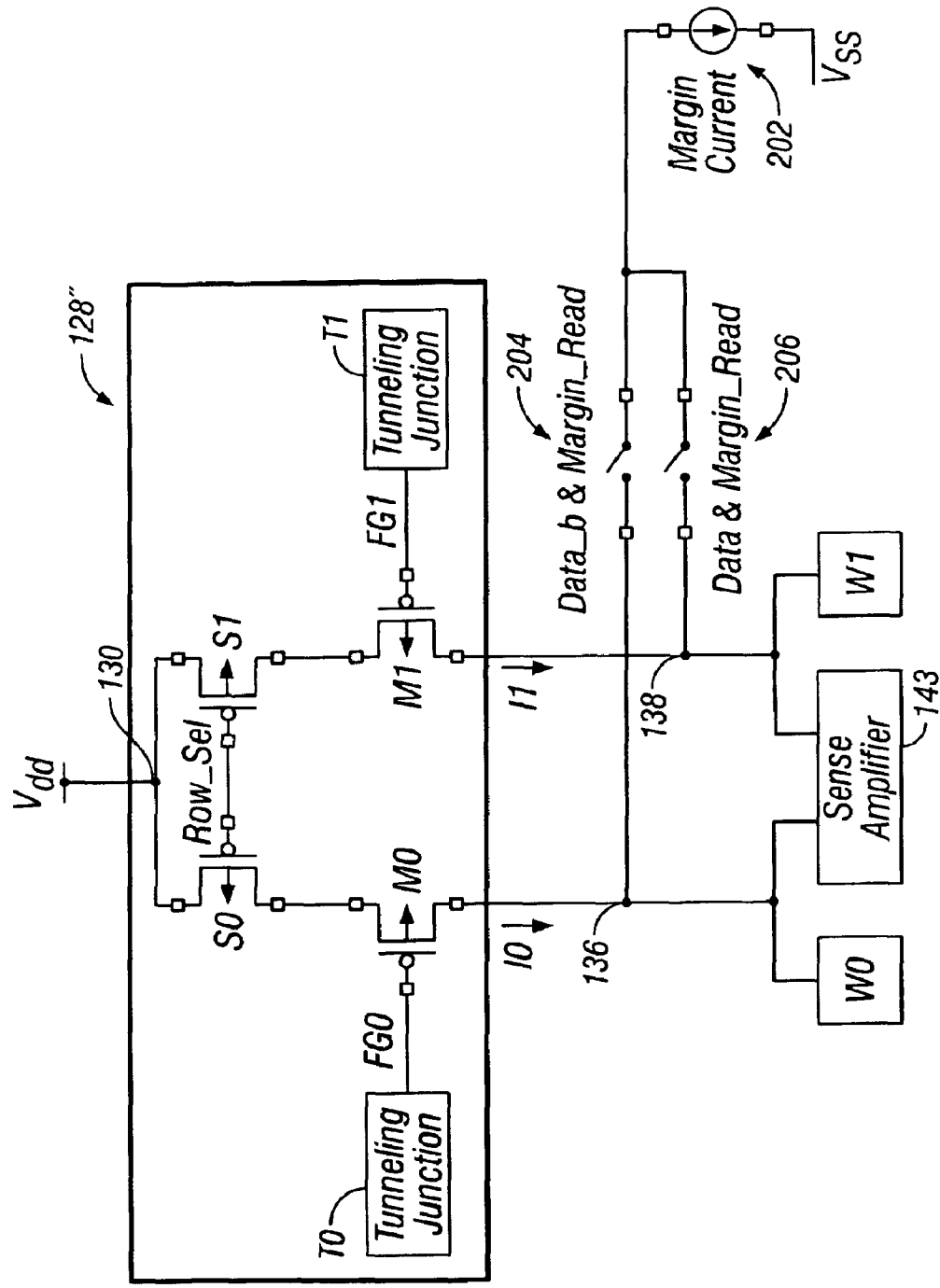
FIG. 35 is an electrical schematic diagram of another alternative differential memory used to illustrate a second method of margin reading.

Turning now to FIG. 35, an alternative margin read method is illustrated. The memory 128" is in most respects similar to memory 128 of FIG. 25. The difference is that a mechanism for adding/subtracting an offset current to the sense amplifier inputs (nodes 136, 138) is provided. In accordance with the embodiment illustrated in FIG. 35, a margin current source (or sink) circuit 202 is provided. Switches 204 and 206 are independently controllable to couple circuit 202 to node 136 or node 138 (sometimes referred to herein as "sense nodes" because they couple to the inputs of the differential sense amplifier 143). The current provided by circuit 202 is set or designed to be an appropriate current margin for the memory element. If the memory still reads out correctly with the current added/subtracted from the input to the sense amplifier circuit 143, then there is adequate margin. If not, i.e., the memory element output changes state, then there is inadequate margin and a potential defect. This may be done, for example, with the following procedures:

1. 0 is stored in memory 128" and V(FG_0) is less than V(FG_1). This means that the source-drain current I0 through M0 is greater than the source-drain current I1 through M1. In order for the memory element to have adequate current margin, I0 should be greater than I1 by a predetermined margin.
2. Close switch 204 to "steal" a predetermined amount of current from node 136. This will reduce the current flowing into the differential sense amplifier 143 from node 136.
3. If the state of the sense amplifier does not change, then there is adequate current margin. If it does change, then the margin is inadequate and a potential defect exists.

Alternatively:
1. 1 is stored in memory 128" and V(VG_0) is more than V(FG_1). This means that the source-drain current I0 through M0 is less than the source-drain current I1 through M1. In order for the memory to have adequate current margin, I0 should be less than I1 by a predetermined margin.
2. Close switch 206 to "steal" a predetermined amount of current from node 138. This will reduce the current flowing into the differential sense amplifier 143 from node 138.
3. If the state of the sense amplifier does not change, then there is adequate current margin. If it does change, then the margin is inadequate and a potential defect exists.

Reducing Write Disturb

Figure 36:
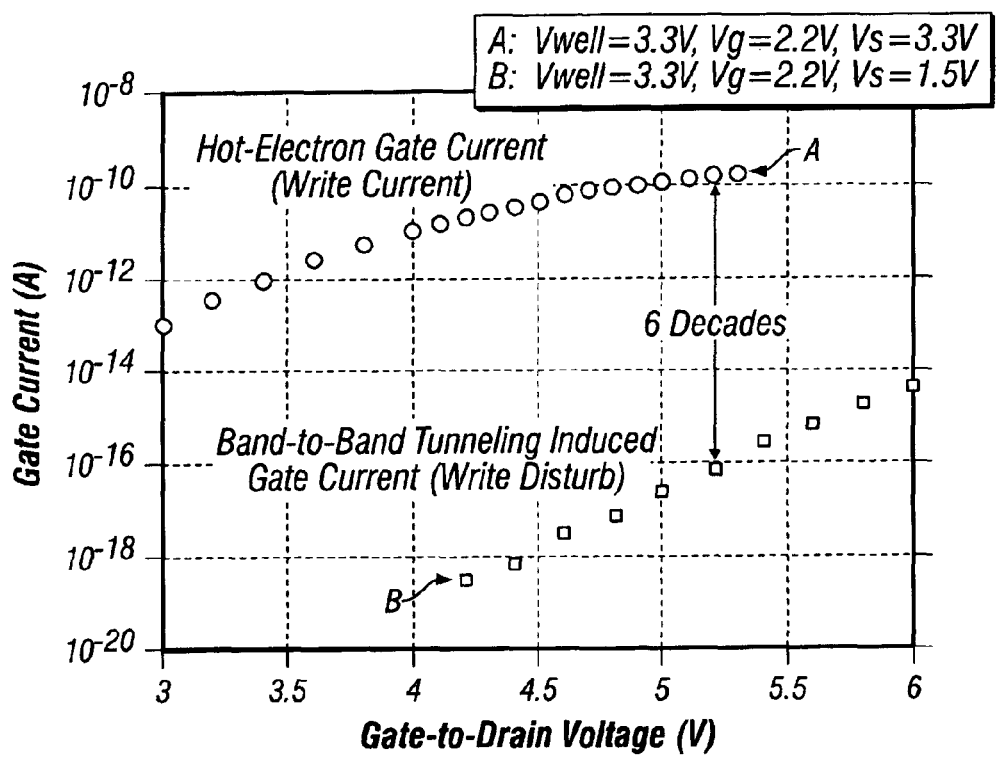
FIG. 36 is a plot of write current and write disturb current vs. write voltage for memories like those contemplated by the present invention.

Turning now to FIG. 36, a plot of write disturb vs. gate-to-drain voltage for a 0.25 micron process device is shown. Write disturb occurs when the gate is at a relatively high voltage and the drain is at a relatively low voltage. The data set labeled "A" represents the hot electron gate current (write current) in amperes shown on the vertical axis at a range of gate-to-drain voltages shown in the horizontal axis. The data set labeled "B" represents band-to-band tunneling induced gate current (write disturb). The write disturb is associated with band-to-band tunneling current at the drain of off-state memory elements during write operations to other memory elements. Write disturb can result in data corruption, so it needs to be minimized. As can be seen, lower gate-to-drain voltages result in lower write disturb currents and the magnitude of the difference between the write current and the write disturb current increases significantly with decreased voltage. Data set A represents data where the well voltage Vwell was 3.3 volts, the gate voltage Vg was 2.2 volts and the source voltage Vs was 3.3 volts. Data set B represents data where Vwell=3.3V, Vg=2.2V and Vs=1.5V. As can be seen from FIG. 36, the write current is six orders of magnitude greater than the write disturb current at 5.25V in a 0.25 micron process. As process dimensions continue to shrink, it is estimated that this margin will shrink to roughly 4 orders of magnitude in a 0.13 micron process. Reducing the gate-drain voltage will shift the effect to the left of the diagram thus reducing the write disturb current to a much smaller fraction of the write current.

Figure 37:
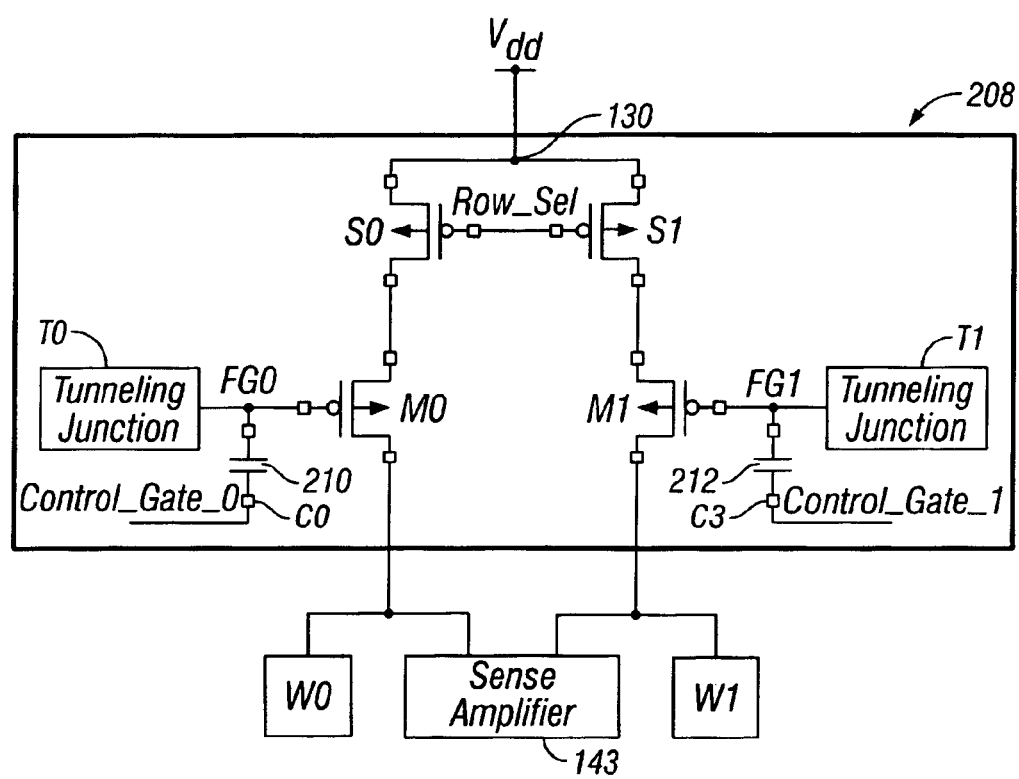
FIG. 37 is an electrical schematic diagram of a modified memory designed to reduce write disturb.

Turning now to FIG. 37, a memory 208 very much like that of memory 128 of FIG. 25 is shown. This memory includes capacitors 210, 212 coupled to FG0 and FG1, respectively, which include nodes C0 and C3, respectively. These may be control gates, for example.

In order to reduce the gate-drain voltage, the following procedure is used: (control_gate_x refers to control_gate_0 and control_gate_1; Cx refers to C0 and C3)
1. For the selected row (the one being written) set control_gate_x at node Cx to high;
2. For unselected rows (the rows not being written) set control_gate_x at node Cx to low; and
3. The capacitors couple floating gates in the unselected rows to a lower voltage, thus reducing their gate-drain voltage and, in turn, reducing their band-to-band tunneling current, thereby reducing write disturb.

Note that this concept may now be applied to the various configurations of memory described herein and is not limited to use in a particular memory such as that of FIG. 37.

NVM Arrays

Figure 38A:
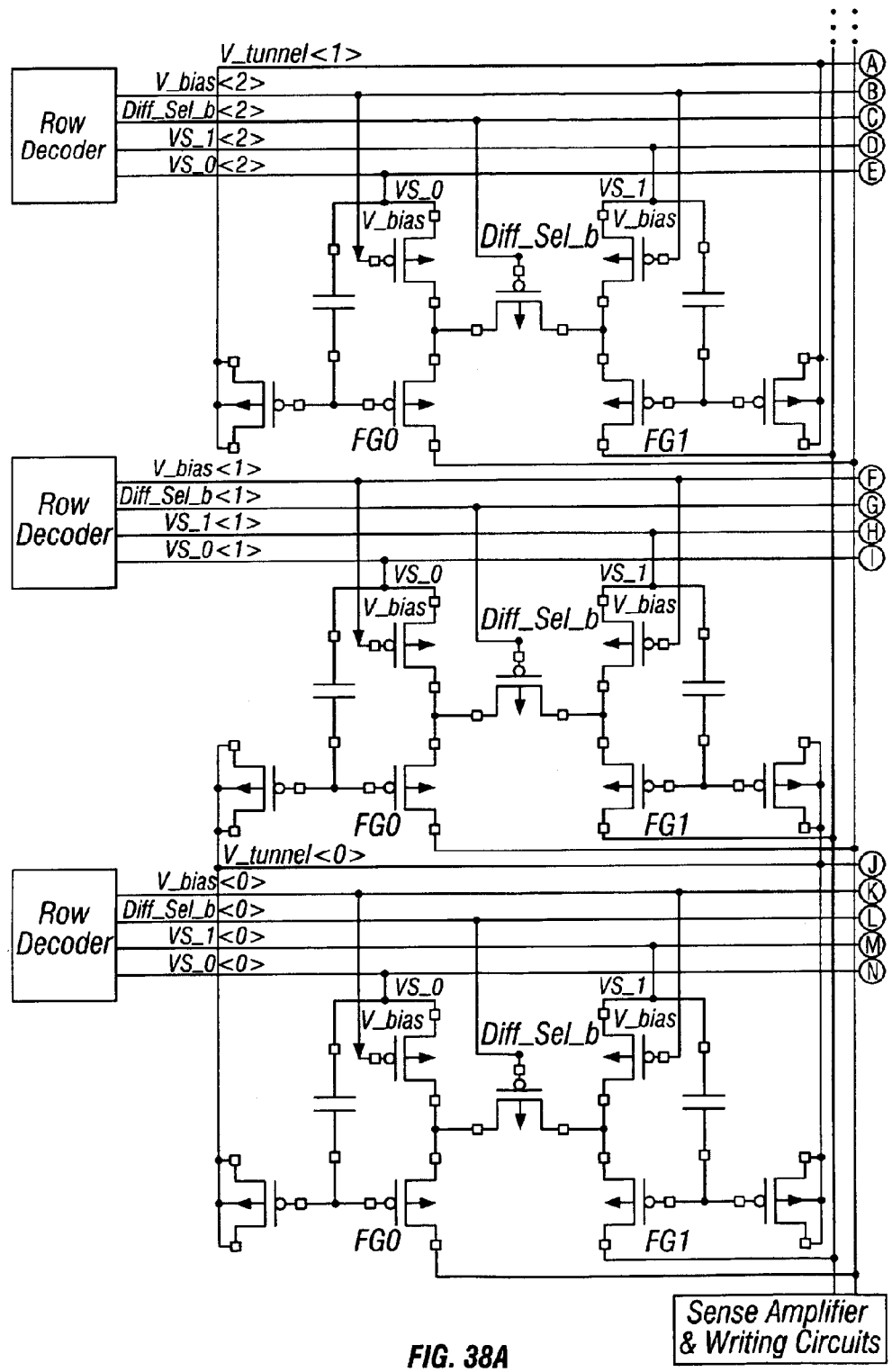
FIGS. 38, 39 and 40 are alternative implementations of differential memory arrays with various types of differential memories.
Figure 38B:
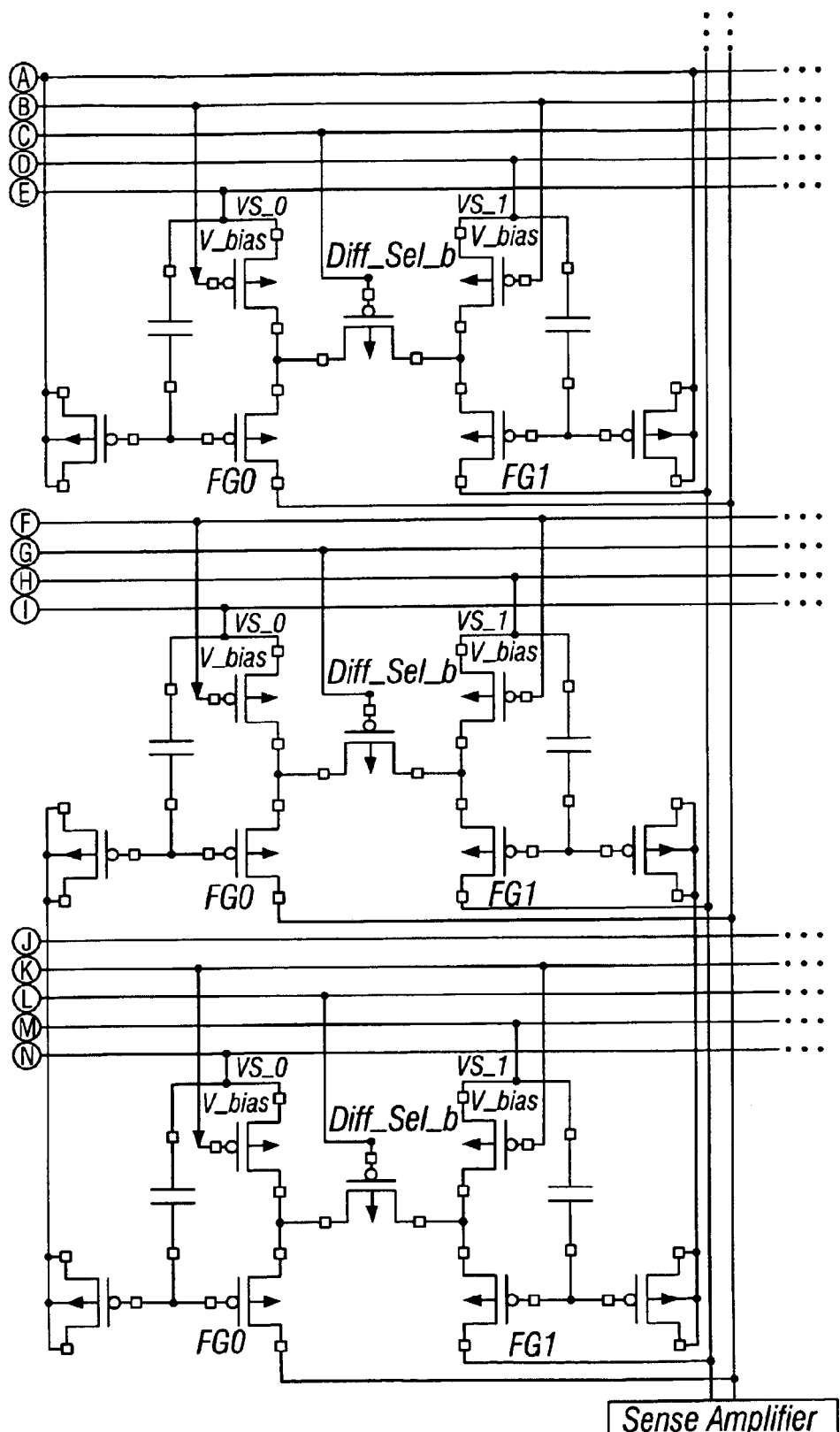
Figure 39A:
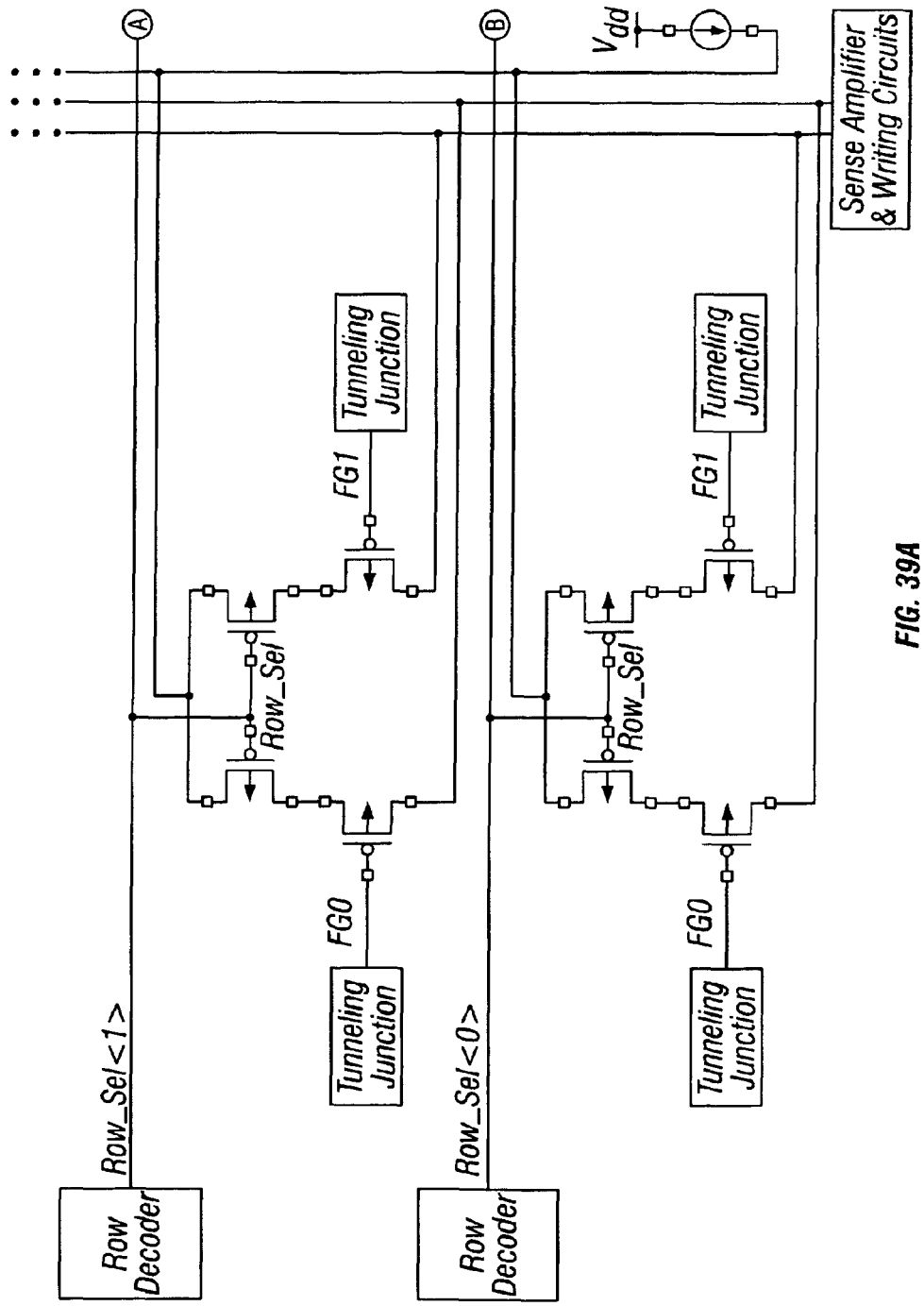
Figure 39B:
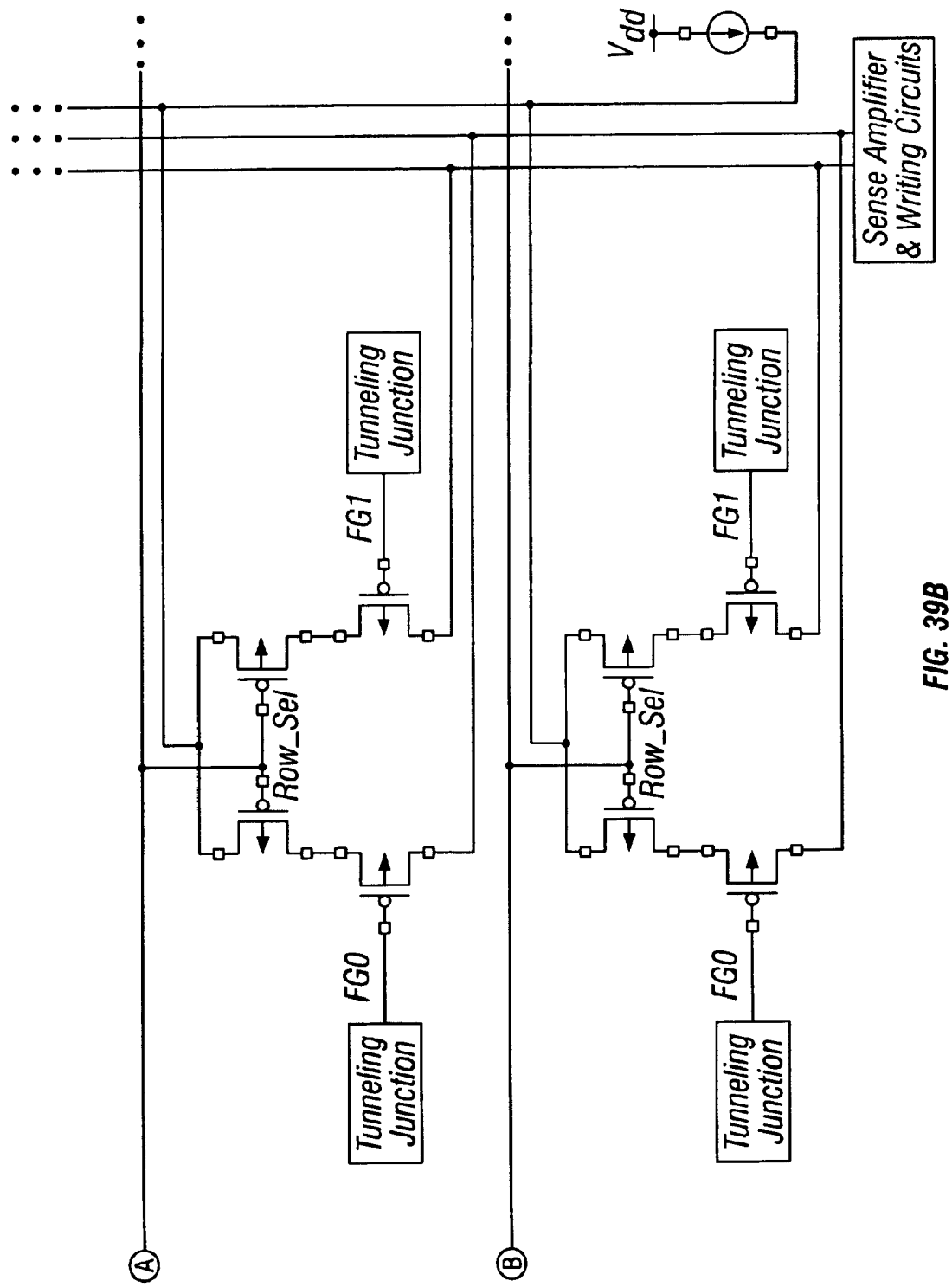
Figure 40A:
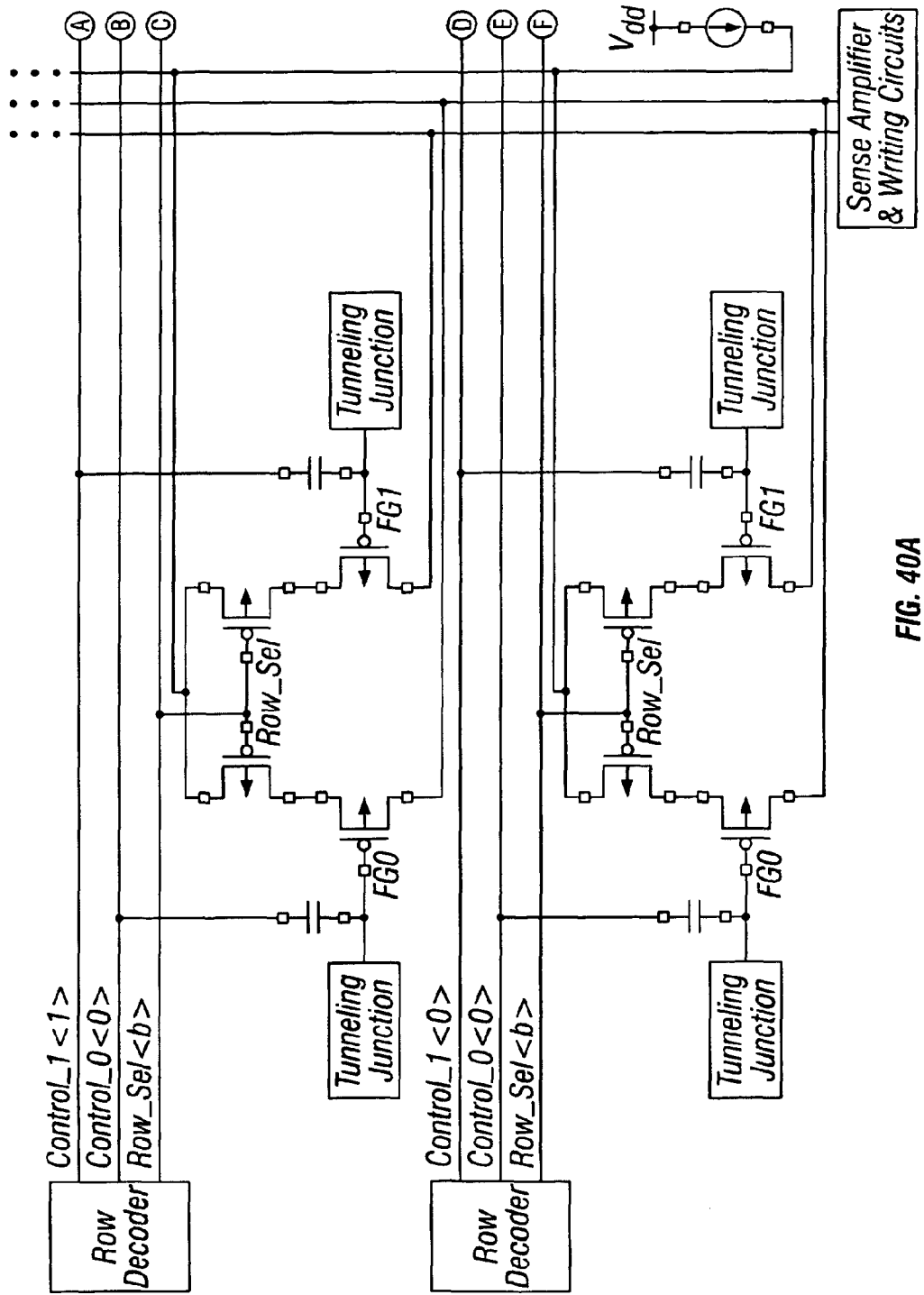
Figure 40B:
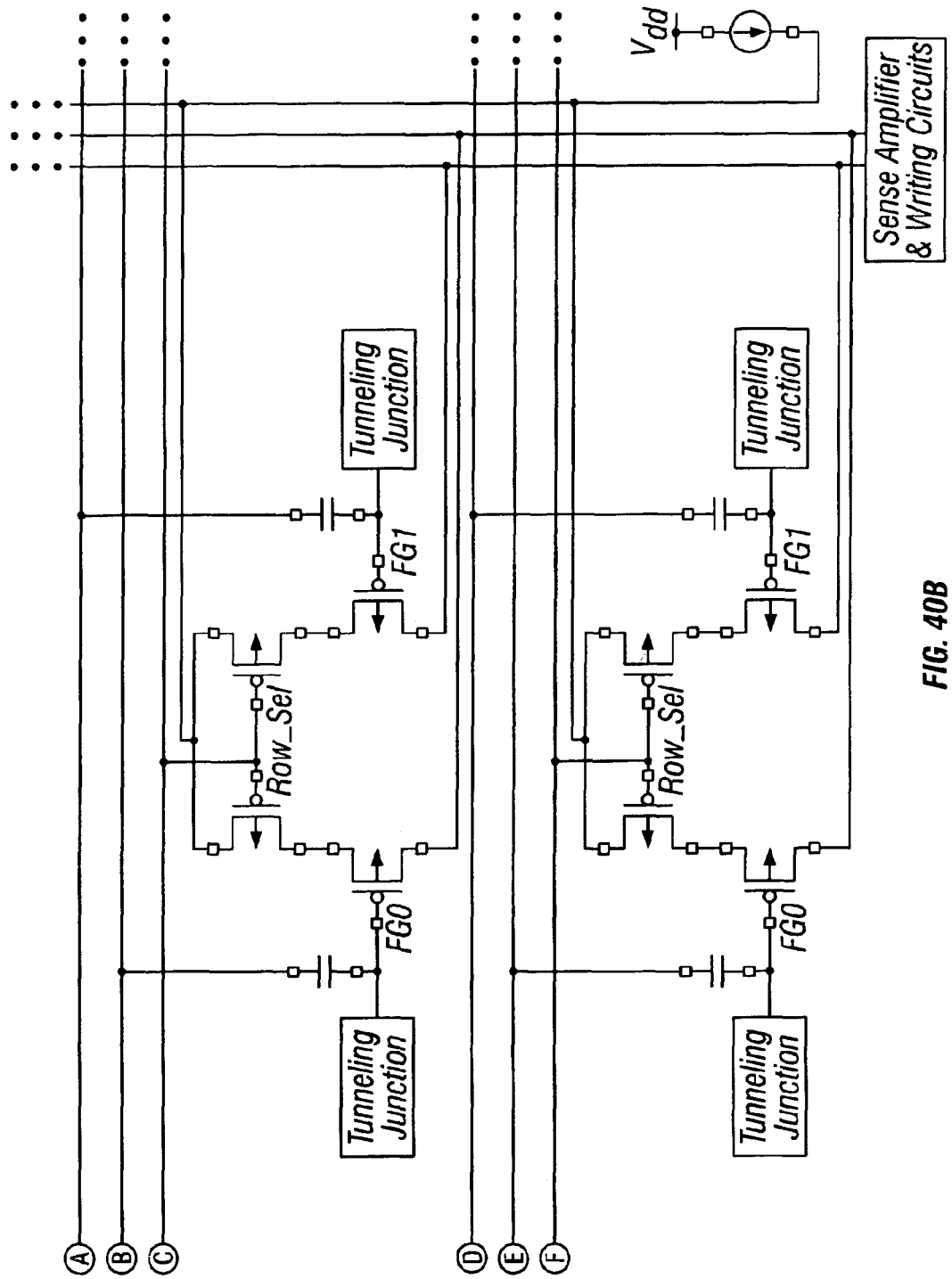

FIGS. 38, 39 and 40 are electrical schematic diagrams illustrating examples of NVM arrays that may be built in accordance with embodiments of the present invention. Turning to FIG. 38, an array of the memory depicted in FIG. 32 is shown. In this example, the VS_0 and VS_1 conductors serve as capacitor inputs, the tunneling junctions are implemented with pFETs in accordance with the design of FIGS. 21 and 22, and all tunneling junctions within a particular row are tied together with a conductor (V_tunnel<1>, for example.) A page is defined as a group of memory elements that share a common erase signal and hence are erased simultaneously. This example has two pages. Page 0 contains four bits at the bottom of the array and page 1 contains two bits at the top of the array. The number and size of such pages can be configured by coupling different numbers of rows' tunneling junctions together.

Turning now to FIG. 39, an array of the memory depicted in FIG. 25 is shown. Since only one current source per column is required in this embodiment, less conductor routing has to be provided, significantly reducing the complexity of the circuit over that of FIG. 38. A drawback of this design is that relatively large capacitance on common current-source conductors results in slower read times. However, sharing a single current source for a whole memory column provides benefits because it can be bigger and there can be fewer of them in the array providing for better intrinsic matching.

Turning now to FIG. 40, an array of the memory depicted in FIG. 34 is shown. In accordance with this embodiment of the present invention, there is one current source per column and capacitors (control gates or otherwise) are used to provide margin read capability and to reduce write disturb, as discussed above.

It is important to note that the examples shown in FIG. 38, FIG. 39, and FIG. 40 do not comprise a comprehensive set of array configurations for the memory presented herein. The examples make it clear that those of ordinary skill in the art can design functional memory arrays of virtually any size from the memory presented herein.

Figure 44:
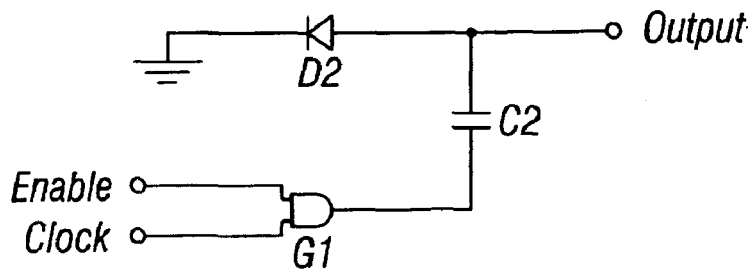
FIG. 44 is an electrical schematic diagram of an example write circuit in accordance with an embodiment of the present invention.

Turning now to FIG. 44, a sample negative charge pump write circuit such as that denoted as "W0" and "W1" in the various figures is illustrated. The output is tied to one of the sense nodes. Diode D2 can be a diode-connected pFET, if desired. Capacitor C2 can be a MOSCAP or any other suitable capacitor. Gate G1 in this embodiment is an AND gate and when ENABLE and CLOCK are both asserted the circuit causes the memory to be written. Those of ordinary skill in the art will now realize that any number of different circuits could be used to accomplish the same basic function.

Figure 45:
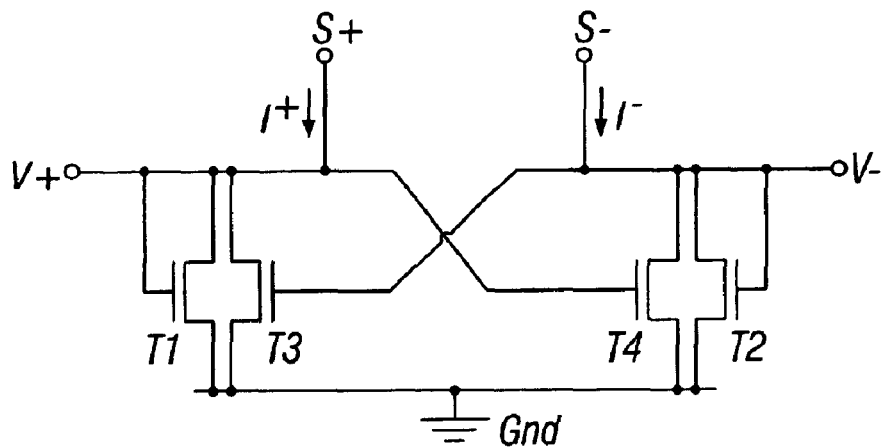
FIG. 45 is an electrical schematic diagram of an example differential sense amplifier circuit in accordance with the prior art.

Turning now to FIG. 45, a sample prior art sense amplifier circuit is illustrated. This embodiment uses nFETs T1, T2, T3 and T4. Sense inputs S+ and S− receive currents I+ and I− from the respective sense nodes of the differential memory. The output of the amplifier is at nodes V+ and V−. If I+>I−, then V+>V−; If I+<I−, then V+<V−. Those of ordinary skill in the art will now realize that any number of alternative circuits (including those built with pFETs instead of nFETs) may be constructed to achieve the same basic function.

External Injection

While unusual, it is possible for NVM constructed in accordance with the present invention to come back from fabrication with a certain level of charge disposed on the floating gates (and a correspondingly high gate voltage). The idea is to somehow connect externally applied voltages to the drains and/or sources of the memory in order to cause them to undergo IHEI and/or band-to-band tunneling. This is useful for the case where the memory comes back from the fabrication process with its gates turned "off" so that the internal charge pumps are not able to cause significant amounts of IHEI because there is no drain-source current in the injection devices.

Figure 41:
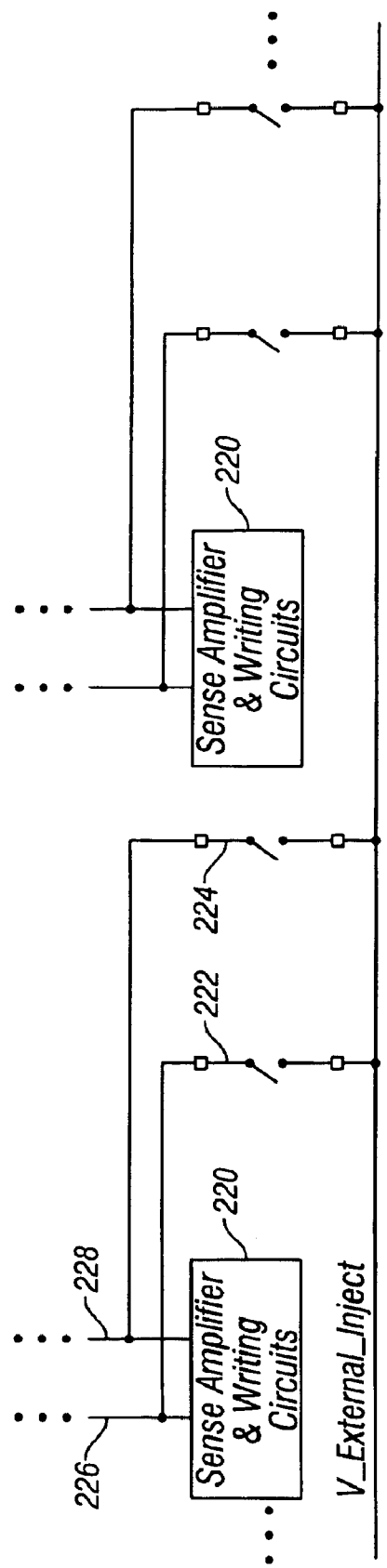
FIGS. 41 and 42 are alternative implementations of external injection circuits used for unsticking memories manufactured with relatively high floating gate voltages which might otherwise prevent injection of electrons onto the floating gate.

Turning now to FIG. 41, one approach is to switch in a negative voltage to the drains of the memory. Switches can be used to selectively set the drain voltage through a pin (called V_External_Inject). With externally applied voltages, the drains can be set to a very low voltage (about −5 to about −4 volts in a 0.18 um process) which will cause band-to-band tunneling.

In accordance with FIG. 41, each column's sense amplifier and writing circuits 220 are also coupled through a pair of switches 222, 224 to an external voltage source denoted V_external_inject which lowers the voltage of the drains of the injection transistors relative to the floating gates inducing band-to-band tunneling from the drain onto the floating gate to "unstick" the memory. This is implemented in the following procedure:

1. Apply a relatively low voltage to the V_External_Inject line.
2. Close switches 222, 224 to couple V_External_Inject to the drains of the floating gate pFETs of the memories (this may be done on a column by column basis, or array wide simultaneously, as desired).
3. Wait while the bits "unstick".
4. Open switches 222, 224 to terminate the process.
5. Measure bit currents with the differential sense amplifiers to verify proper operation.

Figure 42:
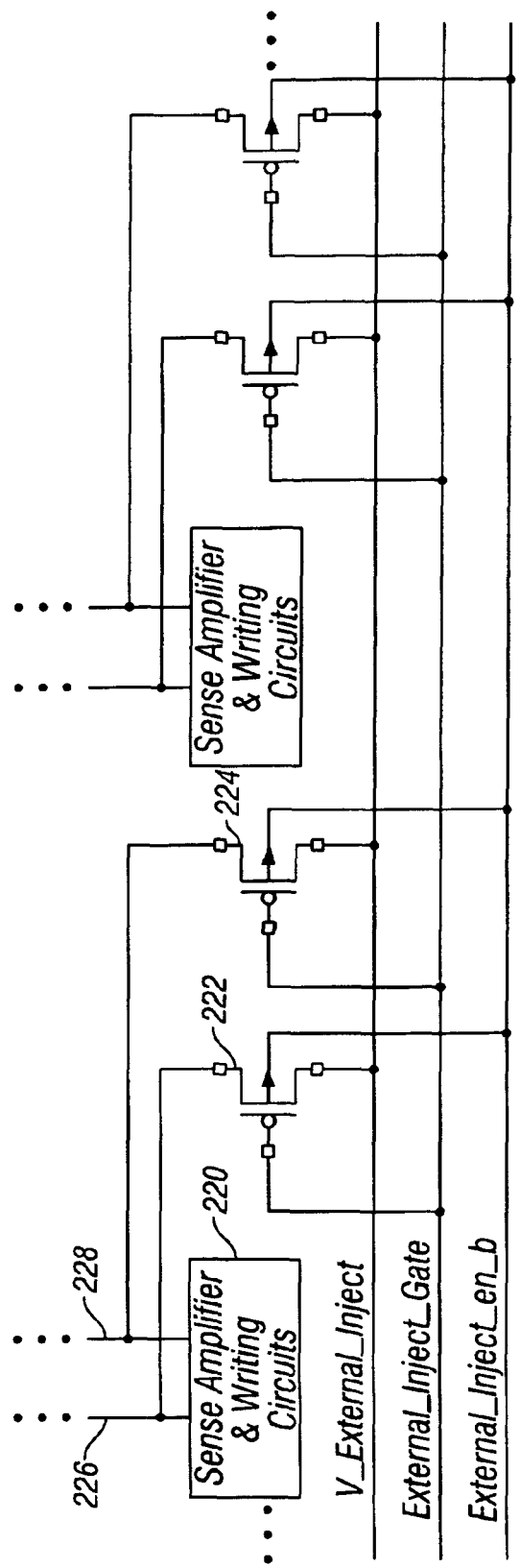

In accordance with the embodiment illustrated in FIG. 42, pFETs may be used as the switches 222, 224. In this case, switches 222 and 224 are implemented as pFETs having their sources coupled to the memory sense lines 226, 228. Another externally applied signal is required: External_Inject_Gate. This signal must be lower than V_External_Inject by at least a Vt, also taking into account the body effect on the pFET because its well voltage does not match its source voltage. This is required to turn on the switches 222, 224. The well itself (driven by External_Inject_en_b) should be switched from 0V (external inject mode enabled) to Vdd (external inject mode disabled). This switching is required to reduce the voltages on the pn junctions in the pFET. Breakdown may otherwise occur. In accordance with one embodiment of the present invention, External_Inject_Gate is set to about −5 volts, V_External_Inject is set to about −3 volts and External_Inject_en_b is set to about 0 volts.

Other ways to do the same thing are available as those of ordinary skill in the art will now realize. For example, setting the "source" voltage on the IHEI transistor to be very high while holding its drain low (ground or lower) has the same net effect, but is a bit more difficult to implement. Note that the "source" side here may actually be the "drain" side of the transistor during normal operation.

Turning now to FIG. 45, a more specific implementation of the idea illustrated in FIG. 44 is shown. In this version, switches 222 and 224 are implemented as pFETs having their sources coupled to the memory sense lines 226, 228. Their wells are coupled to a line denoted External_Inject_en_b, their gates are coupled to a line denoted External_Inject_Gate, and their drains are coupled to a line designated V_external_inject. In one example, the External_Inject_Gate line is set to about −5 volts, the V_external_inject line is set to about −3 volts, and the External_Inject_en_b line is set to about 0 volts.

Tunneling Junction Layout

Figure 43:
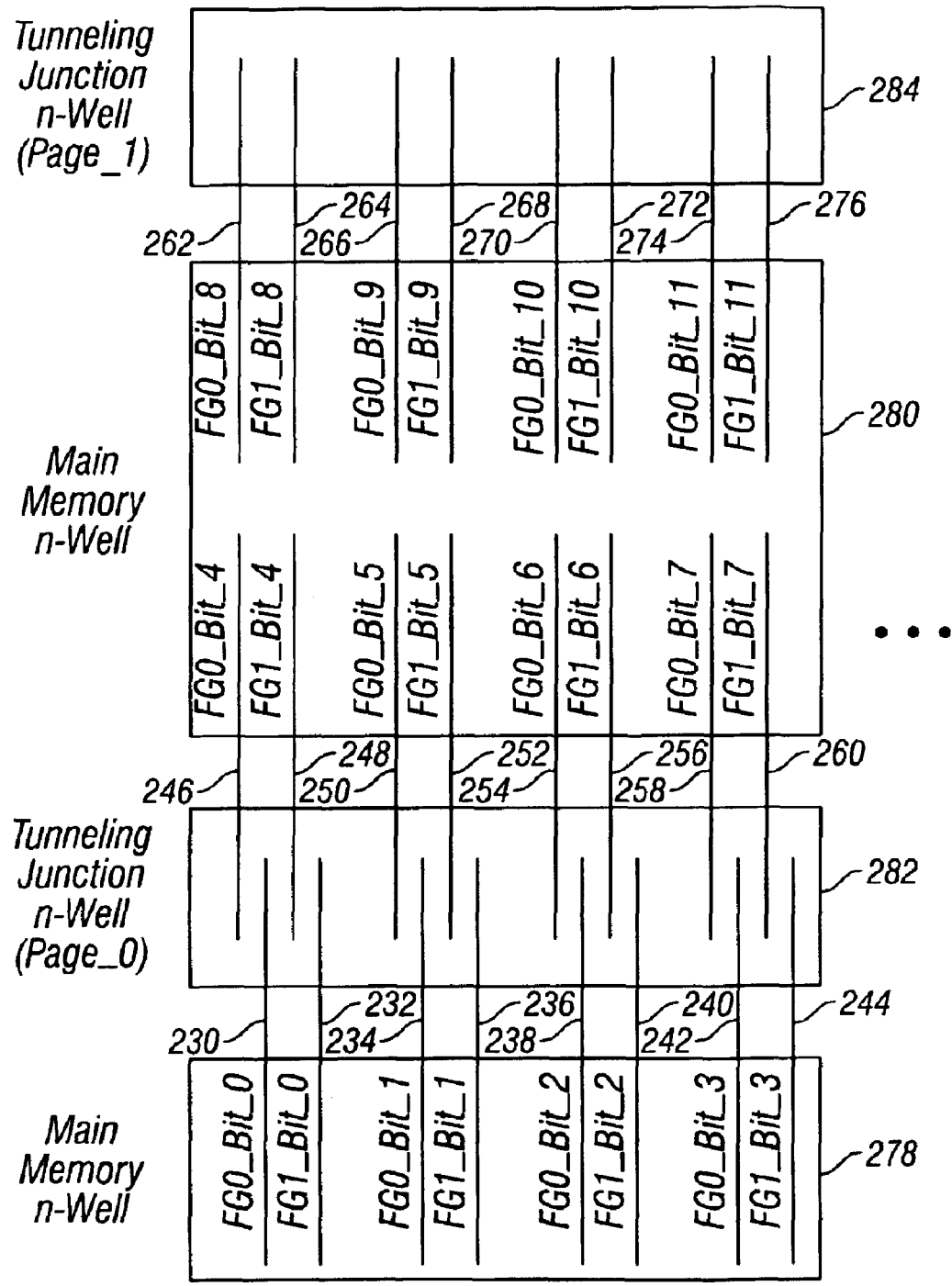
FIG. 43 is a diagram illustrating the layout of a memory array in accordance with one embodiment of the present invention.

Most arrays contemplated in the present invention share tunneling junctions among many memory elements. Some tunneling junctions require their own n– well separate from the n– well that supports the rest of the memory. Interleaving the tunneling junction n– wells offers an efficient layout because n– well to n– well spacing tends to be relatively large due to manufacturing constraints. When using this scheme, memory page sizes are in multiples of two rows of memory elements. An example of a layout of tunneling junctions in a memory array in accordance with one embodiment of the present invention is illustrated in FIG. 43. This example shows the n– wells for a 4-column, 3-row, 2-page array of memory. Lines 230–276 are floating gates which couple a main memory n– well 278, 280 with a corresponding tunneling junction n– well 282, 284, as illustrated.

Summary

In the NVM application, a pFET floating gate transistor has several advantages over an nFET:

1. A p-channel floating-gate MOSFET can inject electrons onto its floating gate at smaller channel currents than are typical for n-channel floating-gate MOSFETs. Consequently, charge pumps (circuits normally required on-chip in order to provide voltages in excess of Vdd used for erase and write operations) for pFET-based memories typically consume less power than those designed for nFET memory.
2. IHEI in pFETs generates predominantly channel hot electrons, whereas the equivalent mechanism in nFETs (channel hot-electron injection or CHEI) generates channel hot holes. Because hot electrons damage gate oxide much less than hot holes, pFETs have reduced oxide wearout and better program/erase cycle endurance than nFETs.
3. The barrier height for electrons tunneling off a floating-gate pFET with a p+ doped gate is about 4.2 eV (see FIG. 2) as compared with about 3.04 eV for an nFET with an n+ doped gate. Consequently, leakage currents are smaller in pFETs than in nFETs, so the data retention characteristics of pFET floating-gate memories are better than those of nFET floating-gate memories with the same oxide thickness. As a result, pFET memories can use thinner gate oxides, such as the 70 Å oxides found in standard dual-gate-oxide CMOS processes (with 3.3V I/O devices). By comparison, memories based on nFET floating gate transistors need additional process steps to make thicker gate oxides (typically 80 Å minimum thickness).

In the NVM application, a differential memory has several advantages over a single-ended memory:

1. The logic state of a differential memory is determined by the difference in charge on the two floating gates. When there are more electrons on the "1" floating gate than electrons on the "0" floating gate, the read current will pass primarily through the transistor with the "1" gate, and vice versa. Consequently, it is possible to distinguish the logic 1 and logic 0 states while both floating gates are negatively charged with respect to the n– well voltage. This property implies that neither side has such a high gate voltage that it cannot be subsequently turned on and injected.
2. Charge leakage mechanisms tend to cause charge on both the "1" and "0" floating gates to leak in the same direction (i.e. both sides leak charge either onto their gates or off of their gates in a common direction). A differential memory has common-mode rejection, meaning that it is sensitive to the voltage difference between the floating gates rather than to their absolute voltages. Consequently, common-mode charge leakage does not affect the stored logic state. Therefore the retention of the differential memory is superior to that of single-ended memory.
3. The read operation uses the principle of distinguishing the more conductive path between the two halves of the differential memory. Arbitrarily small tail currents can be used when reading a memory, as long as the sense amplifier has adequate sensitivity to determine which path the current takes through the memory. Consequently, the memories described herein allow for low power memory circuits.
4. Because the two halves of a differential memory are usually in close proximity on a chip, they are usually well matched in transistor characteristics. For example, the gate oxide thicknesses of two adjacent floating gate transistors match more closely than those of two transistors spaced far apart. As a result, a differential memory design is less sensitive to transistor variations that could affect the read accuracy of single-ended memory.
5. A differential memory is self-referencing, meaning that one side of the memory is the reference for the other side. Consequently, differential memory eliminates the need for precision on- or off-chip current or voltage reference circuits typical in single-ended memory. This self-referencing property holds whether each element in the memory is differential, as in FIG. 3, or whether multiple memory elements share a single half-memory element, as in FIG. 15.
6. Because the differential memory is self-referencing, it has excellent common-mode rejection. Common-mode rejection gives the differential memory better immunity to power-supply and temperature fluctuations than single-ended memory.
7. A differential NVM element has a differential output similar to that of SRAM elements well known in CMOS design. Consequently, a differential NVM element can use the ultra-fast sense amplifiers and bit-line precharging techniques common in SRAM design (and well known to those of ordinary skill in the art and which are not further described herein to avoid overcomplicating this disclosure). The result is that differential NVM elements allow faster reads with lower power consumption than single-ended memory elements.

In summary, differential memory based on pFET floating gate transistors have many advantages over single-ended memory, over nFET memory, and over differential nFET memory. They enable low power, high speed, and high reliability NVMs in logic CMOS.

While embodiments and applications of this invention have been shown and described, it would be apparent to those skilled in the art having the benefit of this disclosure that many more modifications than mentioned above are possible without departing from the inventive concepts herein.

For example, it is to be noted that while aspects of the present invention may be implemented in a single well, single poly process and will work with low voltage processes (e.g., <=3 volts), the invention is not so limited and can be implemented in processes that support multiple polysilicon layers, multiple wells, and/or in higher (or lower) voltage devices.

Furthermore, the concept of an n– well as used herein is intended to encompass not only conventional n– well devices, but also NLDD (N-type Lightly Doped Drain) devices and other lightly doped, or isolated structures that increase the reliable gate-drain and drain-source voltages of the device so that it, in effect, behaves like a conventional n– well device in this respect. It may also be implemented in thin film above the substrate with equivalent thin film structures.

In one embodiment of the present invention, current sink devices may be used in whole or in part as a substitute for current source devices discussed above.

In another embodiment of the present invention, select transistors S0, S1, S2, etc. as discussed above may, in general, be implemented with nFETs instead of pFETs if desired.

Finally, because the charge on the floating gates can be carefully and precisely written, it is possible to use these structures, coupled with a higher resolution readout circuit, known in the prior art, to store more than one digital bit per memory element. With the memory disclosed herein, it would be straightforward to store four different levels of charge, for example using the memory of FIG. 15. Instead of a single reference half-pair FG0 that stores a charge value ½, there could be three reference half-pairs FG0_A, FG0_B, and FG0_C, storing values ¼, 1/2, and ¾ respectively. During readout the sense amplifier would compare the value stored on one floating gate, say FG1, with FG0_A, FG0_B, and FG0_C in turn. If the value stored on FG1 is less than that on FG0_A, then FG1 stores a zero. If the value on FG1 is greater than FG0_A but less than FG0_B, then FG1 stores a one. If the value on FG1 is greater than FG0_B but less than FG0_C, then FG1 stores a two. If the value on FG1 is greater than FG0_C, then FG1 stores a three. By storing four discernable charge values, each half-element holds two bits of information. This approach is clearly extensible to storing three or more bits per memory element, limited only by the accuracy of the write, retention, and read processes. The invention, therefore, is not to be restricted except in the spirit of the appended claims.

What is claimed is:

1. A differential nonvolatile floating gate memory, comprising:
   a first pFET floating gate transistor having a first floating gate;
   a second pFET floating gate transistor having a second floating gate; and
   a differential sense amplifier coupled to receive currents from said first pFET floating gate transistor and said second pFET floating gate transistor.

2. The memory of claim 1, further comprising:
   a first tunneling junction coupled to remove electrons from said first floating gate; and
   a second tunneling junction coupled to remove electrons from said second floating gate.

3. The memory of claim 2, further comprising:
   a first select switch coupled in series with said first pFET floating gate transistor; and
   a second select switch coupled in series with said second pFET floating gate transistor, said first and second select switches controlled by signals applied thereto to determine which of said first floating gate and said second floating gate may undergo electron injection at a given time.

4. The memory of claim 1, further comprising:
   means for removing electrons from said first floating gate; and
   means for removing electrons from said second floating gate.

5. The memory of claim 1, further comprising:
   a window for coupling light to said first and second floating gates.

6. The memory of claim 1, further comprising:
   a first select switch coupled in series with said first pFET floating gate transistor; and
   a second select switch coupled in series with said second pFET floating gate transistor, said first and second select switches controlled by signals applied thereto to determine which of said first floating gate and said second floating gate may undergo electron injection at a given time.

7. The memory of claim 1, further comprising:
   a first control input node capacitively coupled to said first floating gate; and
   a second control input node capacitively coupled to said second floating gate.

8. The memory of claim 7, further comprising:
   a first tunneling junction coupled to remove electrons from said first floating gate; and
   a second tunneling junction coupled to remove electrons from said second floating gate.

9. The memory of claim 1, further comprising:
   a first select transistor coupled to selectively conduct between a first node and a source of said first pFET floating gate transistor; and
   a second select transistor coupled to selectively conduct between said first node and a source of said second pFET floating gate transistor.

10. The memory of claim 9, further comprising:
    a row select transistor coupled to selectively conduct between a current source and said first node.

11. The memory of claim 9, further comprising:
    a first tunneling junction coupled to remove electrons from said first floating gate; and
    a second tunneling junction coupled to remove electrons from said second floating gate.

12. The memory of claim 1, further comprising:
    a first select transistor coupled to selectively conduct between a drain of said first pFET floating gate transistor and a first sense node; and
    a second select transistor coupled to selectively conduct between a drain of said second pFET floating gate transistor and a second sense node.

13. The memory of claim 12, further comprising:
    a first node coupled to a source of said first pFET floating gate transistor and to a source of said second pFET floating gate transistor.

14. The memory of claim 13, further comprising:
    a current source coupled to said first node.

15. The memory of claim 14, further comprising:
    a row select transistor coupled to selectively conduct between said current source and said first node.

16. The memory of claim 15, further comprising:
    a first tunneling junction coupled to remove electrons from said first floating gate; and
    a second tunneling junction coupled to remove electrons from said second floating gate.

17. The memory of claim 1, further comprising:
    a first node coupled to a source of said first pFET floating gate transistor and to a source of said second pFET floating gate transistor,
    a second node coupled to a drain of said first pFET floating gate transistor;
    a third node coupled to a drain of said second pFET floating gate transistor;
    a first bias transistor coupled between a fourth node and said second node;
    a second bias transistor coupled between a fifth node and said third node.

18. The memory of claim 17, wherein said first and second bias transistors are nFETs.

19. A differential floating gate nonvolatile memory, comprising:
   a first means for storing charge;
   a second means for storing charge;
   a third means for adding charge to said first means;
   a fourth means for adding charge to said second means;
   a fifth means for removing charge from said first means;
   a sixth means for removing charge from said second means; and
   a seventh means coupled to said first and second means for sensing which of said first means and said second means is storing a greater amount of charge.

20. The memory of claim 19, further comprising:
   an eighth means coupled in series with said third means, said eighth means for controlling the operation of said third means; and
   a ninth means coupled in series with said fourth means, said ninth means for controlling the operation of said fourth means.

21. A differential floating gate nonvolatile memory, comprising:
   a first pFET floating gate transistor having a first floating gate;
   a second pFET floating gate transistor having a second floating gate;
   a first gate of a first transistor coupled to said first floating gate;
   a second gate of a second transistor coupled to said second floating gate; and
   a source of a bias current coupled to pass current from a single node in parallel through said first and said second transistor to a differential sense device, charge on said first floating gate and said second floating gate controlling the flow of current through said respective first and second transistors.

22. The memory of claim 21, wherein said first and second transistors are pFETs.

23. The memory of claim 21, further comprising a first tunneling junction coupled to remove electrons from said first floating gate and a second tunneling junction coupled to remove electrons from said second floating gate.

24. The memory of claim 21, wherein said first and second transistors are nFETs.

25. The memory of claim 21, further comprising a first select switch coupled in series with said first pFET floating gate transistor and a second select switch coupled in series with said second pFET floating gate transistor.

26. The memory of claim 25, wherein said first select switch and said second select switch are pFET transistors.

27. The memory of claim 21, further comprising a first enable switch coupled in series with said first transistor and a second enable switch coupled in series with said second transistor, said enable switches controlling the flow of current to said differential sense device.

28. The memory of claim 21, further comprising:
   a first control input node capacitively coupled to said first floating gate; and
   a second control input node capacitively coupled to said second floating gate.

29. The memory of claim 28, further comprising:
   a first tunneling junction coupled to remove electrons from said first floating gate; and
   a second tunneling junction coupled to remove electrons from said second floating gate.

30. A method for storing information in a semiconductor device, the semiconductor device having a first floating gate pFET and a second floating gate pFET, said method comprising:
   placing charge onto a floating gate of the first floating gate pFET;
   placing charge onto a floating gate of the second floating gate pFET;
   removing charge from said floating gate of the first floating gate pFET;
   removing charge from said floating gate of the second floating gate pFET; and
   measuring charge on said floating gates of the first and second floating gate pFETs.

31. The method of claim 30, wherein said measuring is performed with a differential sense amplifier.

32. A method for storing information in a semiconductor device, the semiconductor device having a first floating gate pFET with a first floating gate and a second floating gate pFET with a second floating gate, said method comprising:
   (1) measuring charge on said first floating gate; and
   (2) measuring charge on said second floating gate.

33. The method of claim 32, wherein steps (1) and (2) are performed simultaneously.

34. The method of claim 32, wherein step (1) is performed before step (2).

35. The method of claim 32, wherein steps (1) and (2) are performed with a differential sense amplifier.

36. A method for storing multiple bits of information in a semiconductor device, the semiconductor device having a first floating gate and a second floating gate, each said floating gate coupled to the gate of a corresponding first and second floating gate pFET, said method comprising:
   placing a first charge having one of a plurality of levels onto said first floating gate;
   placing a second charge having one of a plurality of levels onto said second floating gate;
   measuring said first charge on said first floating gate to determine which level of charge is stored thereon;
   measuring said second charge on said second floating gate to determine which level of charge is stored thereon; and
   determining a multi-bit output based upon said measuring said first charge and said measuring said second charge.

37. A method for storing multiple bits of information in a semiconductor device, the semiconductor device having a first floating gate pFET with a first floating gate and a second floating gate pFET with a second floating gate, said method comprising:
   placing a first reference charge onto said first floating gate;
   placing a second charge having one of a plurality of predetermined levels onto said second floating gate; and
   initially comparing the charge stored on said first floating gate pFET with the charge stored on said second floating gate pFET.

38. The method of claim 37, wherein:
   said initially comparing is performed by comparing a source-drain current of said first floating gate pFET with a source drain current of said second floating gate pFET; and said initially comparing includes combining at least one of said source-drain current of said first floating gate pFET and said source-drain current of said second floating gate pFET with a first fixed current.

39. The method of claim 38, further comprising:
subsequently comparing said source-drain current of said first floating gate pFET with said source-drain current of said second floating gate pFET, wherein said subsequently comparing includes combining at least one of said source-drain current of said first floating gate pFET and said source-drain current of said second floating gate pFET with a second fixed current during said subsequently comparing step.

40. A differential floating gate nonvolatile memory, comprising:
a first pFET floating gate transistor having a first floating gate;
a plurality of second pFET floating gate transistors, each having a corresponding separate floating gate and having their drains and sources coupled in common through at least one select switch per transistor; and
a differential sense amplifier coupled to receive drain currents from said first pFET floating gate transistor and a selected one of said second pFET floating gate transistors.

41. A differential floating gate nonvolatile memory, comprising:
a first pFET floating gate transistor having a first floating gate and coupled to a bias node;
a plurality of second pFET floating gate transistors, each having a corresponding separate floating gate and at least one series select switch and having their sources coupled in common to said bias node and also having their drains coupled together and to a drain node; and
a differential sense amplifier coupled to said drain node and to a drain of said first pFET floating gate transistor, a select signal selecting one of said plurality of second pFET floating gate transistors.

42. A differential nonvolatile floating gate memory, comprising:
a first pFET floating gate transistor having a first floating gate;
a second pFET floating gate transistor having a second floating gate;
a first select switch coupled in series with said first pFET floating gate transistor;
a second select switch coupled in series with said second pFET floating gate transistor, said first and second select switches controlled by signals applied thereto;
a first pFET read transistor;
a second pFET read transistor;
a source of said first pFET read transistor and a source of said second pFET read transistor coupled to a common node;
a gate of said first pFET read transistor coupled to said first floating gate;
a gate of said second pFET read transistor coupled to said second floating gate; and
a differential sense amplifier coupled to receive currents from said first pFET read transistor and said second pFET read transistor.

43. The memory of claim 42, further comprising:
a first tunneling junction coupled to remove electrons from said first floating gate; and a second tunneling junction coupled to remove electrons from said second floating gate.

44. The memory of claim 42, further comprising:
a third select transistor disposed to selectively permit conduction between said drain of said first pFET read transistor and said differential sense amplifier; and
a fourth select transistor disposed to selectively permit conduction between said drain of said second pFET read transistor and said differential sense amplifier.

45. The memory of claim 44, further comprising:
a first tunneling junction coupled to remove electrons from said first floating gate; and
a second tunneling junction coupled to remove electrons from said second floating gate.

46. A differential nonvolatile floating gate memory, comprising:
a first pFET floating gate transistor having a source, drain and floating gate;
a second pFET floating gate transistor having a source, drain and floating gate;
a first select transistor having a source, drain and gate, said first select transistor coupled in series with said first pFET floating gate transistor to selectively interrupt source-drain current in said first pFET floating gate transistor;
a second select transistor having a source, drain and gate, said second select transistor coupled in series with said second pFET floating gate transistor to selectively interrupt source-drain current in said second pFET floating gate transistor; and
a source of a row select signal coupled to a first node, said first node coupled to said gates of said first and second select transistors.

47. The memory of claim 46, further comprising:
a first tunneling junction coupled to remove electrons from said floating gate of said first pFET floating gate transistor; and
a second tunneling junction coupled to remove electrons from said floating gate of said second pFET floating gate transistor.

48. The memory of claim 47, further comprising:
a first write circuit coupled to write information onto said floating gate of said first pFET floating gate transistor.

49. The memory of claim 48, further comprising:
a second write circuit coupled to write information onto said floating gate of said second pFET floating gate transistor.

50. The memory of claim 48, further comprising:
a differential sense circuit coupled to read the value of information stored on said floating gates of said first and second pFET floating gate transistors.

51. The memory of claim 49, further comprising:
a differential sense circuit coupled to read the value of information stored on said floating gates of said first and second pFET floating gate transistors.

52. The memory of claim 49, further comprising:
a current source coupled to said sources of said first and second select transistors.

53. The memory of claim 49, further comprising:
a current source coupled to said sources of said first and second select transistors through a switch.

54. The memory of claim 53, wherein said switch is controlled by said row select signal.

55. The memory of claim 46, further comprising:
a first current source coupled to provide current to said first pFET floating gate transistor; and
a second current source coupled to provide current to said second pFET floating gate transistor.

56. The memory of claim 55, further comprising:
a select switch coupled to selectively couple outputs of said first and said second current source to one another.

57. A differential nonvolatile floating gate memory, comprising:
a first pFET floating gate transistor having a source, drain and floating gate;
a second pFET floating gate transistor having a source, drain and floating gate;
a first select transistor having a source, drain and gate, said first select transistor coupled in series with said first pFET floating gate transistor to selectively interrupt source-drain current in said first pFET floating gate transistor;
a second select transistor having a source, drain and gate, said second select transistor coupled in series with said second pFET floating gate transistor to selectively interrupt source-drain current in said second pFET floating gate transistor;
a source of a row select signal coupled to said gates of said first and second select transistors;
a first current source node coupled to provide current to said first pFET floating gate transistor; and
a second current source node coupled to provide current to said second pFET floating gate transistor.

58. The memory of claim 57, further comprising:
a first capacitively coupled control node associated with said first pFET floating gate transistor;
a second capacitively coupled control node associated with said second pFET floating gate transistor;
said first control node coupled to said first current source node; and
said second control node coupled to said second current source node.

59. A method for checking the margin of a value stored in a differential nonvolatile floating gate memory having a first and a second pFET floating gate transistor each having a source, drain, floating gate and a control node capacitively coupled to the floating gate, said method comprising:
storing a value in the differential memory by storing a first amount of charge on the floating gate of the first pFET floating gate transistor and a second amount of charge on the floating gate of the second pFET floating gate transistor;
applying a predetermined voltage to the control node of at least one of the two pFET floating gate transistors;
reading the memory; and
comparing the result of said reading with the known stored value.

60. The method of claim 59, further comprising:
determining that the memory is good if the results of the reading and the known stored value are the same.

61. The method of claim 59, further comprising:
determining that the memory is bad if the results of the reading and the known stored value are the different.

62. A method for checking the margin of a value stored in a differential nonvolatile floating gate memory having a first and a second pFET floating gate transistor each having a source, drain, floating gate and a control node capacitively coupled to the floating gate, said method comprising:
storing a value in the memory by storing a first amount of charge on the floating gate of the first pFET floating gate transistor and a second amount of charge on the floating gate of the second pFET floating gate transistor;
reading the memory a first time;
applying a predetermined voltage to the control node of at least one of the two pFET floating gate transistors;
reading the memory a second time; and
comparing the result of said first reading with said second reading.

63. The method of claim 62, further comprising:
determining that the memory is good if the results of the first reading and second reading are the same.

64. The method of claim 62, further comprising:
determining that the memory is bad if the results of the first reading and second reading are different.

65. A method for checking the margin of a value stored in a differential nonvolatile floating gate memory having a first and a second pFET floating gate transistor each having a source, drain and a floating gate, said method comprising:
storing a value in the memory by storing a first amount of charge on the floating gate of the first pFET floating gate transistor and a second amount of charge on the floating gate of the second pFET floating gate transistor;
reading the memory a first time with a differential current sense circuit having a pair of inputs;
adding a predetermined current which may be positive or negative to at least one of the inputs of the pair of inputs;
reading the memory a second time; and
comparing the result of said first reading with said second reading.

66. The method of claim 65, further comprising:
determining that the memory is good if the results of the first reading and second reading are the same.

67. The method of claim 65, further comprising:
determining that the memory is bad if the results of the first reading and second reading are different.

68. A method for checking the margin of a value stored in a differential nonvolatile floating gate memory having a first and a second pFET floating gate transistor each having a source, drain and a floating gate, said method comprising:
storing a value in the memory by storing a first amount of charge on the floating gate of the first pFET floating gate transistor and a second amount of charge on the floating gate of the second pFET floating gate transistor;
adding a predetermined current which may be positive or negative to at least one of the inputs of the pair of inputs;
reading the memory; and
comparing the result of said reading with the known stored value.

69. The method of claim 68, further comprising:
determining that the memory is good if the results of the reading and the known stored value are the same.

70. The method of claim 68, further comprising:
determining that the memory is bad if the results of the reading and the known stored value are different.

71. A method for reducing write disturb in a differential nonvolatile floating gate memory disposed in an array of like memory elements divided into a plurality of rows, each memory having a first and a second pFET floating gate transistor each having a source, drain, floating gate and control gate capacitively coupled to its floating gate, said method comprising:
- selecting a row in which to write a memory;
- applying a relatively low voltage signal to the control gates of the elements in rows other than the selected row;
- applying a relatively high voltage signal to the control gates of the memory elements in the selected row; and
- writing a value into the memory element in the selected row.

72. A method for selectively inducing electron transfer onto the floating gates of a differential nonvolatile floating gate memory, said memory having a first and a second pFET floating gate transistor each with a source, drain and floating gate, said method comprising:
- applying a first voltage to the source of each of said first and second pFET floating gate transistors;
- applying a second voltage having a relative large magnitude less than said first voltage to an external injection conductor; and
- selectively switching the drain of each of said first and second pFET floating gate transistors into electrical contact with said conductor while said second voltage is applied thereto to produce a relatively large drain-to-gate voltage across each of said first and second pFET floating gate transistors.

73. The method of claim 72, wherein said selectively switching is performed with a pFET transistor.

74. A circuit for selectively inducing electron transfer onto the floating gates of a differential floating gate memory, said circuit comprising:
- a first pFET having a first floating gate, a first drain and a first source to be held at a first voltage;
- a second pFET having a second floating gate, a second drain and a second source;
- a first node carrying an external injection signal, said external injection signal being relatively negative to said first voltage;
- a first switch coupled to selectively conduct between said first node and said first drain; and
- a second switch coupled to selectively conduct between said first node and said second drain.

75. The circuit of claim 74, wherein:
said first switch is a pFET having a third gate, third drain, third source and a first well connection;
said second switch is a pFET having a fourth gate, fourth drain, fourth source and a second well connection; and further comprising:
- a second node carrying an external injection select signal, said second node coupled to said third gate and said fourth gate.

76. The circuit of claim 75, further comprising:
- a third node carrying a signal of the same phase as said external injection signal, said third node coupled to said first well connection and to said second well connection.

77. A circuit for selectively inducing electron transfer onto the floating gates of a differential nonvolatile floating gate memory, said circuit comprising:
- a first pFET having a first floating gate, a first drain and a first source;
- a second pFET having a second floating gate, a second drain and a second source;
- means for selectively creating a relatively large drain-to-gate voltage on said first and second pFETs to thereby induce electron transfer onto said first and second floating gates.

78. A differential nonvolatile floating gate memory, comprising:
- a first pFET floating gate transistor having a source, drain and first floating gate;
- a second pFET floating gate transistor having a source, drain and second floating gate;
- a first current source coupled to provide current to said first pFET floating gate transistor;
- a second current source coupled to provide current to said second pFET floating gate transistor; and
- a select switch coupled to selectively couple outputs of said first and said second current source to one another.

79. The memory of claim 78, wherein said first current source and said second current source are pFETs.

80. The memory of claim 79, further comprising:
- a first capacitively coupled control node associated with said first pFET floating gate transistor; and
- a second capacitively coupled control node associated with said second pFET floating gate transistor.

81. The memory of claim 80, wherein said first control node is coupled to the source of said first current source and said second control node is coupled to the source of said second current source.

82. The memory of claim 80, wherein said first control node is coupled to the drain of said first current source and said second control node is coupled to the drain of said second current source.

83. The memory of claim 81, further comprising:
- a first tunneling junction coupled to remove electrons from said first floating gate; and
- a second tunneling junction coupled to remove electrons from said second floating gate.

* * * * *